US008679888B2

(12) United States Patent
Rogers et al.

(10) Patent No.: US 8,679,888 B2
(45) Date of Patent: Mar. 25, 2014

(54) ARRAYS OF ULTRATHIN SILICON SOLAR MICROCELLS

(75) Inventors: John A. Rogers, Champaign, IL (US);
Angus A. Rockett, Urbana, IL (US);
Ralph Nuzzo, Champaign, IL (US);
Jongseung Yoon, Los Angeles, CA (US); Alfred Baca, Urbana, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 53 days.

(21) Appl. No.: 13/120,486

(22) PCT Filed: Sep. 24, 2009

(86) PCT No.: PCT/US2009/058231
§ 371 (c)(1),
(2), (4) Date: Aug. 4, 2011

(87) PCT Pub. No.: WO2010/036807
PCT Pub. Date: Apr. 1, 2010

(65) Prior Publication Data
US 2011/0277813 A1    Nov. 17, 2011

Related U.S. Application Data

(60) Provisional application No. 61/099,801, filed on Sep. 24, 2008.

(51) Int. Cl.
*H01L 31/18*    (2006.01)
(52) U.S. Cl.
USPC ............................. 438/57; 438/97; 136/261
(58) Field of Classification Search
USPC ............................................. 438/73, 80, 97
See application file for complete search history.

(56) References Cited

U.S. PATENT DOCUMENTS

| 4,058,418 A | * | 11/1977 | Lindmayer | 117/18 |
| 5,439,575 A | | 8/1995 | Thornton et al. | |
| 5,455,430 A | * | 10/1995 | Noguchi et al. | 257/53 |

(Continued)

FOREIGN PATENT DOCUMENTS

| WO | WO 02/45143 | 6/2002 |
| WO | WO 2005/054119 | 6/2005 |

(Continued)

OTHER PUBLICATIONS

J.-H. Ahn, H.-S. Kim, E. Menard, K.J. Lee, Z. Zhu, D.-H. Kim, R.G. Nuzzo J.A. Rogers, I. Amlani, V. Kushner, S.G. Thomas and T. Duenas, .Bendable Integrated Circuits on Plastic Substrates by Use of Printed Ribbons of Single-Crystalline Silicon,. *Applied Physics Letters* 90, 213501 (2007).

(Continued)

*Primary Examiner* — David Vu
*Assistant Examiner* — Earl Taylor
(74) *Attorney, Agent, or Firm* — Lathrop & Gage LLP

(57) ABSTRACT

Provided are solar cells, photovoltaics and related methods for making solar cells, wherein the solar cell is made of ultrathin solar grade or low quality silicon. In an aspect, the invention is a method of making a solar cell by providing a solar cell substrate having a receiving surface and assembling a printable semiconductor element on the receiving surface of the substrate via contact printing. The semiconductor element has a thickness that is less than or equal to 100 μm and, for example, is made from low grade Si.

36 Claims, 39 Drawing Sheets

(56) References Cited

U.S. PATENT DOCUMENTS

| | | | |
|---|---|---|---|
| 5,477,088 | A | 12/1995 | Rockett et al. |
| 6,148,127 | A | 11/2000 | Adams et al. |
| 6,518,168 | B1 | 2/2003 | Clem et al. |
| 6,805,809 | B2 | 10/2004 | Nuzzo et al. |
| 7,195,733 | B2 | 3/2007 | Rogers et al. |
| 7,521,292 | B2 | 4/2009 | Rogers et al. |
| 7,557,367 | B2 | 7/2009 | Rogers et al. |
| 7,622,367 | B1 | 11/2009 | Rogers et al. |
| 7,662,545 | B2 | 2/2010 | Nuzzo et al. |
| 7,704,684 | B2 | 4/2010 | Rogers et al. |
| 7,705,280 | B2 | 4/2010 | Rogers et al. |
| 7,732,012 | B2 * | 6/2010 | Hongu et al. ............ 427/255.27 |
| 7,799,699 | B2 | 9/2010 | Rogers et al. |
| 7,909,971 | B2 | 3/2011 | Nuzzo et al. |
| 7,932,123 | B2 | 4/2011 | Rogers et al. |
| 7,943,491 | B2 | 5/2011 | Rogers et al. |
| 7,972,875 | B2 | 7/2011 | Rogers et al. |
| 7,982,296 | B2 | 7/2011 | Rogers et al. |
| 8,008,575 | B2 * | 8/2011 | De Ceuster et al. .......... 136/256 |
| 8,039,847 | B2 | 10/2011 | Rogers et al. |
| 8,198,621 | B2 | 6/2012 | Rogers et al. |
| 8,217,381 | B2 | 7/2012 | Rogers et al. |
| 8,252,191 | B2 | 8/2012 | Heejoon et al. |
| 8,367,035 | B2 | 2/2013 | Rogers et al. |
| 2004/0211458 | A1 | 10/2004 | Gui et al. |
| 2004/0211459 | A1 | 10/2004 | Suenaga et al. |
| 2007/0227586 | A1 | 10/2007 | Zapalac |
| 2008/0055581 | A1 | 3/2008 | Rogers et al. |
| 2008/0108171 | A1 | 5/2008 | Rogers et al. |
| 2009/0308455 | A1 * | 12/2009 | Kirscht et al. ................ 136/261 |
| 2010/0002402 | A1 | 1/2010 | Rogers et al. |
| 2010/0052112 | A1 | 3/2010 | Rogers et al. |
| 2010/0317132 | A1 | 12/2010 | Rogers et al. |
| 2011/0147715 | A1 | 6/2011 | Rogers et al. |
| 2011/0170225 | A1 | 7/2011 | Rogers et al. |
| 2011/0171813 | A1 | 7/2011 | Rogers et al. |
| 2011/0187798 | A1 | 8/2011 | Rogers et al. |
| 2011/0220890 | A1 | 9/2011 | Rogers et al. |
| 2011/0230747 | A1 | 9/2011 | Rogers et al. |
| 2011/0266561 | A1 | 11/2011 | Rogers et al. |
| 2011/0277813 | A1 * | 11/2011 | Rogers et al. ................. 136/244 |
| 2011/0316120 | A1 | 12/2011 | Rogers et al. |
| 2012/0083099 | A1 | 4/2012 | Rogers et al. |
| 2012/0105528 | A1 | 5/2012 | Rogers et al. |
| 2012/0157804 | A1 | 6/2012 | Rogers et al. |
| 2012/0165759 | A1 | 6/2012 | Rogers et al. |
| 2012/0261551 | A1 | 10/2012 | Rogers |
| 2012/0320581 | A1 | 12/2012 | Rogers et al. |
| 2012/0327608 | A1 | 12/2012 | Rogers et al. |
| 2013/0036928 | A1 | 2/2013 | Rogers et al. |
| 2013/0041235 | A1 | 2/2013 | Rogers et al. |

FOREIGN PATENT DOCUMENTS

| | | |
|---|---|---|
| WO | WO 2005/104756 | 11/2005 |
| WO | WO 2005/122285 | 12/2005 |
| WO | WO 2006/130721 | 12/2006 |
| WO | WO 2007/126412 | 11/2007 |
| WO | WO 2008/030666 | 3/2008 |
| WO | WO 2008/030960 | 3/2008 |
| WO | WO 2008/036837 | 3/2008 |
| WO | WO 2008/055054 | 5/2008 |
| WO | WO 2008/143635 | 11/2008 |
| WO | WO 2009/011709 | 1/2009 |
| WO | WO 2009/111641 | 9/2009 |
| WO | WO 2010/005707 | 1/2010 |
| WO | WO 2010/036807 | 4/2010 |
| WO | WO 2010/132552 | 11/2010 |
| WO | WO 2011/084450 | 7/2011 |
| WO | WO 2011/112931 | 9/2011 |
| WO | WO 2011/115643 | 9/2011 |
| WO | WO 2012/097163 | 7/2012 |
| WO | WO 2012/158709 | 11/2012 |
| WO | WO 2012/167096 | 12/2012 |
| WO | WO 2013/010113 | 1/2013 |

OTHER PUBLICATIONS

J.-H. Ahn, H.-S. Kim, K.J. Lee, S. Jeon, S.J. Kang, Y. Sun, R.G. Nuzzo and J.A. Rogers, .Heterogeneous Three Dimensional Electronics Using Printed Semiconductor Nanomaterials,. Science 314, 1754-1757 (2006).

J.-H. Ahn, H.-S. Kim, K.J. Lee, Z. Zhu, E. Menard, R.G. Nuzzo and J.A. Rogers, .High Speed, Mechanically Flexible Single-Crystal Silicon Thin-Film Transistors on Plastic Substrates,. IEEE Electron Device Letters, 27(6) 460-462 (2006).

H. Ahn, K.J. Lee, A. Shim, J.A. Rogers, and R.G. Nuzzo, "Additive Soft Lithographic Patterning of Submicron and Nanometer-Scale Large Area Resists on Electronic Materials," Nano Letters, 5, 2533-2537 (2005).

Baca, A.J. et al., "Compact monocrystalline silicon solar modules with high voltage outputs and mechanically flexible designs," Energy Environ. Sci., 2010, 3, 208-211.

A.J. Baca, J.H. Ahn, Y. Sun, M.A. Meitl, E. Menard, H.S. Kim, W.M. Choi, D.H. Kim, Y. Huang and J.A. Rogers, "Semiconductor Wires and Ribbons for High-Performance Flexible Electronics," Angew. Chem., Int. Ed., 2008, 47, 5524.

Baca, A.J. et al., "Printable single-crystal silicon micro/nanoscale ribbons, platelets and bars generated from bulk wafers," Adv. Func. Mater. 17, 3051-3062 (2007).

D.M. Bagnall and M. Boreland, Energy Policy, 2008, 36, 4390.

Bergmann, R. B. Crystalline Si thin-film solar cells: a review. Appl. Phys. A 69, 187-194 (1999).

Biancardo, M. et al. Characterization of microspherical semi-transparent solar cells and modules. Sol. Energy 81, 711-716 (2007).

R.H. Bossert, C.J.J. Tool, J.A.M. van Roosmalen, C.H.M. Wentink and M.J.M. De Vaan, Thin Film Solar Cells: Technology Evaluation and Perspectives,. ECN, May 2000.

Brendel, R. Review of layer transfer processes for crystalline thin-film silicon solar cells. Jpn. J. Appl. Phys. 40, 4431-4439 (2001).

Brendel, R., Bergmann, R. B., Lolgen, P., Wolf, M. & Werner, J. H. Ultrathin crystalline silicon solar cells on glass substrates. Appl. Phys. Lett. 70, 390-392 (1997).

M. Burgelman, J. Verschraegen, S. Degrave and P. Nollet, .Modeling Thin-Film PV Devices,. Progress in Photovoltaics 12, 143-153 (2004).

D.G. Cahill, F. Watanabe, A. Rockett, and C.B. Vining, "Thermal conductivity of epitaxial layers of dilute SiGe alloys," Phys. Rev. B, 71:23, 235202-1-4 (2005).

Campbell, P. & Green, M. A. Light Trapping Properties of Pyramidally Textured Surfaces. J. Appl. Phys. 62, 243-249 (1987).

W.R. Childs and R.G. Nuzzo, "Patterning of Thin-Film Microstructures on Non-Planar Substrate Surfaces Using Decal Transfer Lithography," Adv. Mater., 16, 1323-1327 (2004).

Clugston, D. A. & Basore, P. A. PC1D version 5: 32-bit solar cell modeling on personal computers. Photovoltaic Specialists Conference, 1997., Conference Record of the Twenty-Sixth IEEE, 207-210.

D.A. Clugston and P.A. Basore, .Modelling Free-Carrier Absorption in Solar Cells,. Progress in Photovoltaics 5, 229-236 (1997).

A. Ebong, V. Upadhyaya, B. Rounsaville, D.S. Kim, V. Meemongkolkiat, A. Rohatgi, M.M. Al-Jassim, K.M. Jones, and B. To. Rapid Thermal Processing of High Efficiency N-Type Silicon Solar Cells With Al back Junction,. 14th World Conference on Photovoltaic Energy Conversion,. Hawaii, USA; May 7-12, 2006.

Feng, N.-N. et al. Design of Highly Efficient Light-Trapping Structures for Thin-Film Crystalline Silicon Solar Cells. IEEE Trans. Elect. Dev. 54, 1926-1933 (2007).

Green, M. A. Crystalline and thin-film silicon solar cells: state of the art and future potential. Sol. Energy 74, 181-192 (2003).

Heine, C. & Morf, R. H. Submicrometer Gratings for Solar-Energy Applications. Appl. Opt. 34, 2476-2482 (1995).

K. J. Hsia, Y. Huang, E. Menard, J.-U. Park, W. Zhou, J.A. Rogers and J.M. Fulton, Collapse of Stamps for Soft Lithography due to Interfacial Adhesion,. Applied Physics Letters 86(15), 154106 (2005).

(56) References Cited

OTHER PUBLICATIONS

Y.G.Y. Huang, W.X. Zhou, K.J. Hsia, E. Menard, J.U. Park, J.A. Rogers and A.G. Alleyne, Stamp Collapse in Soft Lithography, *Langmuir* 21(17), 8058-8068 (2005).

S.-H. Hur, D.-Y. Khang, C. Kocabas, and J.A. Rogers, .Nanotransfer Printing by Use of Noncovalent Surface Forces: Applications to Thin-film Transistors That Use Single-walled Carbon Nanotube Networks and Semiconducting Polymers,. *Applied Physics Letters* 85(23), 5730-5732 (2004).

International Search Report and Written Opinion corresponding to PCT/US2009/058231, mailed Nov. 17, 2009.

S. Jeon, V. Malyarchuk, J.A. Rogers, and G. Wiederrecht, "Fabricating three dimensional nanostructures using two photon lithography in a single exposure step," *Optics Express*, 14:6, 2300-2308 (2006).

S. Jeon, V. Malyarchuk, J.O. White, and J.A. Rogers, "Optically fabricated three dimensional nanofluidic mixers for microfluidic systems," *Nano Letters*, 5:7,1351-1356 (2005).

S. Jeon, E. Menard, J. Park, J. Maria, M. Meitl, J. Zaumseil, and J.A. Rogers, "Three dimensional nanofabrication with rubber stamps and conformable photomasks," *Advanced Materials*, 16:15, 1369-1373 (2004).

S. Jeon, J.-U. Park, R. Cirelli, S. Yang, C.E. Heitzman, P.V. Braun, P.J.A. Kenis, and J.A. Rogers, "Fabricating complex three dimensional nanostructures with high resolution conformable phase masks," *Proceedings of the National Academy of Science USA*, 101:34, 12428-12433 (2004).

Kazmerski, L. L. Solar photovoltaics R&D at the tipping point: A 2005 technology overview. *J. Elect. Spec. Rel. Phenom*. 150, 105-135 (2006).

Kerschaver, E. V. & Beaucarne, G. Back-contact Solar Cells: A Review. *Prog. Photovolt*. 14, 107-123 (2006).

D.Y. Khang, H. Jiang, Y. Huang and J.A. Rogers, .A Stretchable Form of Single Crystal Silicon for High Performance Electronics on Rubber Substrates, *Science* 311, 208-212 (2006).

Ko, H. C., Baca, A. J. & Rogers, J. A. Bulk quantities of single-crystal silicon micro-/nanoribbons generated from bulk wafers, *Nano Lett*. 6, 2318-2324 (2006).

Kunnavakkam, M. V. et al. Low-cost, low-loss microlens arrays fabricated by soft-lithography replication process, *Appl. Phys. Lett*. 82, 1152-1154 (2003).

H.H. Lee, E. Menard, N.G. Tassi, J.A. Rogers and G.B. Blanchet, .Fabrication of Large Area Stamps, Moulds, and Conformable Photomasks for Soft Lithography, *Journal of Nanoengineering and Nanosystems* 218, 1-5 (2005).

K.J. Lee, M.A. Meitl, J.-H. Ahn, J.A. Rogers, R.G. Nuzzo, V. Kumar and I. Adesida, Bendable GaN High Electron Mobility Transistors on Plastic Substrates, *Journal of Applied Physics* 100, 124507 (2006).

Lee, K. J. et al. Large-area, selective transfer of microstructured silicon: A printing-based approach to high-performance thin-film transistors supported on flexible substrates. *Adv. Mater*. 17, 2332-2336 (2005).

K. Lee, J. Lee, H. Hwang, Z. Reitmeier, R.F. Davis, J.A. Rogers and R.G. Nuzzo, A Printable Form of Single Crystal Gallium Nitride for Flexible Optoelectronic Systems, *Small* 1(12), 1164-1168 (2005).

C. Lei, C.M. Li, A. Rockett, and I.M. Roberton, "Grain Boundary Compositions in Cu(InGa)Se$_2$," *J. Appl. Phys*., 101:2, 24909-1-7 (2007).

C.H. Lei, A.A. Rockett, I.M. Robertson, N. Papathanasiou, and S. Siebentritt, "Interface reactions and Kirkendall voids in metal organic vapor-phase epitaxy grown Cu(In,Ga)Se$_2$ thin films on GaAs," *J. Appl. Phys*., 100:11, 114915-1-8 (2006).

C. Lei, A. Rockett, I.M. Robertson, W.N. Shafarman, and M. Beck, "Void formation and surface energies in Cu(InGa)Se$_2$," *J. Appl. Phys*. 100:7, 073518 (2006).

Dongxiang Liao and Angus Rockett, "Cu depletion at the CuInSe$_2$ Surface," *Appl. Phys. Lett*., 82:17, 2829-2831 (2003).

Liu, Z. X. et al. A concentrator module of spherical Si solar cell. *Sol. Energy Mater. Sol. Cells* 91, 1805-1810 (2007).

J.C. Love, L.A. Estroff, J.K. Kriebel, R.G. Nuzzo, and G.M. Whitesides, "Self-Assembled Monolayers of Thiolates on metals as a Form of Nanotechnology," *Chem. Rev*., 105, 1103-1169 (2005).

Mack, S., Meitl, M. A., Baca, A. J., Zhu, Z. T. & Rogers, J. A. Mechanically flexible thin-film transistors that use ultrathin ribbons of silicon derived from bulk wafers. *Appl. Phys. Lett*. 88, 213101 (2006).

V. Malyarchuk, F. Hua, N.H. Mack, V.T. Velasquez, J.O. White, R.G. Nuzzo, and J.A. Rogers, "High performance plasmonic crystal sensor formed by soft nanoimprint lithography," *Optics Express*, 13:15, 5669-5675 (2005).

Meitl, M. A. et al. Stress focusing for controlled fracture in microelectromechanical systems. *Appl. Phys. Lett*. 90, 083110 (2007).

Meitl, M. A. et al. Transfer printing by kinetic control of adhesion to an elastomeric stamp. *Nat. Mater*. 5, 33-38 (2006).

E. Menard, J. Park, S. Jeon, D. Shir, Y. Nam, M. Meitl and J.A. Rogers, .Micro and Nanopatterning Techniques for Organic Electronic and Optoelectronic Systems,. *Chemical Reviews* 107, 1117-1160 (2007).

E. Menard, R.G. Nuzzo and J.A. Rogers, .Bendable Single Crystal Silicon Thin Film Transistors Formed by Printing on Plastic Substrates,. *Applied Physics Letters* 86(9), 093507 (2005).

E. Menard, L. Bilhaut, J. Zaumseil, and J.A. Rogers, .Improved Surface Chemistries, Thin Film Deposition Techniques, and Stamp Designs for Nanotransfer Printing, *Langmuir* 20(16), 6871-6878 (2004).

E. Menard, K.J. Lee, D.Y. Khang, R.G. Nuzzo and J.A. Rogers, .A Printable Form of Silicon for High Performance Thin Film Transistors on Plastic,. *Applied Physics Letters* 84(26), 5398-5400 (2004).

L.V. Mercaldo, M.L. Addonizio, M. Della Noce, P.D. Veneri, A. Scognamiglio and C. Privato, *Appl. Energy*, 2009, 86, 1836.

Minemoto, T. & Takakura, H. Fabrication of spherical silicon crystals by dropping method and their application to solar cells. *Jpn. J. Appl. Phys*. 46, 4016-4020 (2007).

B. Nelson, H. Atwater, B. Roedern, J. Yang, P. Simis, X. Deng, V. Dalal, D. Carlson and T. Wang, Amorphous and Thin-Film Silicon, *NCPV and Solar Program Review*, NREL/CD-520-33586, pp. 583-585, 2003.

B. Nelson, H. Branz, R. Crandall, E. Iwaniczko, A. Mahan, P. Stradins, Q. Wang, and Y. Xu, Project Summary of the NREL Amorphous Silicon Team, *NCPV and Solar Program Review*, NREL/CD-520-33586, pp. 825-828, 2003.

M. Niggemann, W. Graf and A. Gombert, *Adv. Mater*., 2008, 20, 4055.

P. Ortega, S. Bermejo and L. Castaner, *Progr. Photovolt.: Res. Appl*., 2008, 16, 369.

S. Pizzini, *Appl. Phys. A: Mater. Sci. Process*., 2009, 96, 171.

B. Roedern, Status of Amorphous and Crystalline Thin-Film Silicon Solar Cell Activities, *NCPV and Solar Program Review*, NREL/CD-520-33586, pp. 552-555, 2003.

A. Rockett, "The effect of Na in polycrystalline and single crystal CuIn$_{1-x}$Ga$_x$Se$_2$," *Thin Solid Films*, 480-1, 2-7 (2005).

A. Rockett, D.D. Johnson, S.V. Khare, and B.R. Tuttle, "Prediction of dopant ionization energies in silicon: The importance of strain," *Physical Review B*, 6823:23, 3208 (2003).

A. Rockett, D. Liao, J.T. Heath, J.D. Cohen, Y.M. Strzhemechny, L.J. Brillson, K. Ramanathan, and W.N. Shafarman, "Near-surface Defect Distributions in Cu(In,Ga)Se$_2$," *Thin Solid Films*, 431-2, 301-306 (2003).

A. Rockett, "Dimers, Domains, and Vapor-Phase Growth on Si(001) 2x1," *Surf. Sci*., 312, 201 (1994).

D.S. Ruby, S.H. Zaidi, S. Narayanan, B.M. Damiani and A. Rohatgi, Rie-Texturing of Multicrystalline Silicon Solar Cells, *Solar Energy Materials & Solar Cells* 74, 133.137 (2002).

Shah, A. et al. Recent progress on microcrystalline solar cells. *Photovoltaic Specialists Conference, Conference Record of the Twenty-Sixth IEEE*, 569-574 (1997).

Sinton, R. A., Kwark, Y., Gan, J. Y. & Swanson, R. M. 27.5-Percent Silicon Concentrator Solar-Cells. *IEEE Elect. Dev. Lett*. 7, 567-569 (1986).

Y. Sobajima, S. Nakano, M. Nishino, Y. Tanaka, T. Toyama and H. Okamoto, *J. Non-Cryst. Solids*, 2008, 354, 2407.

(56) References Cited

OTHER PUBLICATIONS

M.E. Stewart, N.H. Mack, V. Malyarchuk, J.A.N.T. Soares, T.W. Lee, S.K. Gray, R.G. Nuzzo, and J.A. Rogers, "Quantitative Multispectral Miosensing and 1-D Imaging Using Quasi-3D Plasmonic Crystals," *Proc. Nat. Acad. Sci.*, 103, 17143-17148 (2006).

Y. Sun and J.A. Rogers, Structural Forms of Single Crystal Semiconductor Nanoribbons for High-Performance Stretchable Electronics, *Journal of Materials Chemistry* 17, 832-840 (2007).

Y. Sun, E. Menard J.A. Rogers, H.-S. Kim, S. Kim, G. Chen, I. Adesida, R. Dettmer, R. Cortez, and A. Tewksbury, Gigahertz Operation in Mechanically Flexible Transistors on Plastic Substrates, *Applied Physics Letters* 88, 183509 (2006).

Y. Sun, H.-S. Kim, E. Menard, S. Kim, I. Adesida and J.A. Rogers, Printed Arrays of Aligned GaAs Wires for Flexible Transistors, Diodes and Circuits on Plastic Substrates, *Small* 2(11), 1330-1334 (2006).

Y. Sun, V. Kumar, I. Adesida and J.A. Rogers, Buckled and Wavy Ribbons of GaAs for High-Performance Electronics on Elastomeric Substrates, *Advanced Materials* 18, 2857-2862 (2006).

Y. Sun, W.M. Choi, H. Jiang, Y.Y. Huang and J.A. Rogers, Controlled buckling of Semiconductor Nanoribbons for Stretchable Electronics, *Nature Nanotechnology* 1, 201-207 (2006).

Y. Sun, R.A. Graff, M.S. Strano and J.A. Rogers, Top Down Fabrication of Semiconductor Nanowires With Alternating Structures Along Their Transverse and Longitudinal Axes, *Small* 1(11), 1052-1057 (2005).

Y. Sun, D.-Y. Khang, K. Hurley, R.G. Nuzzo and J.A. Rogers, Photolithographic Route to the Fabrication of Micro/Nanowires of III-V Semiconductors, *Advanced Functional Materials* 15(1), 30-40 (2005).

Y. Sun, S. Kim, I. Adesida and J.A. Rogers, Bendable GaAs Metal-Semiconductor Field Effect Transistors Formed With Printed GaAs Wire Arrays on Plastic Substrates, *Applied Physics Letters* 87, 083501 (2005).

Y. Sun and J.A. Rogers, Fabricating Semiconductor Nano/microwires and Transfer Printing Ordered Arrays of Them onto Plastic Substrates, *Nano Letters* 4(10), 1953-1959 (2004).

Materials Research Society (MRS) Symposium P: Photovoltaic Materials and Manufacturing Issues, Fall Meeting, Dec. 3, 2008, J. Yoon, A.J. Baca, S.I. Park, P. Elvikis, J.B. Gedds, L. Li, R.H. Kim, J. Xiao, S. Wang, T.H. Kim, M.J. Motala, R.G. Nuzzo, P.M. Ferreira, Y.Y. Huang, A. Rockett, J. A. Rogers, "Arrays of Monocrystalline Silicon Solar Micro-cells for Modules with Ultra-thin, Mechanically Flexible, Semi-transparent and Micro-optic Concentrator Designs".

Taguchi, M. et al. HIT (TM) cells—High-efficiency crystalline Si cells with novel structure. *Prog. Photovolt.* 8, 503-513 (2000).

Verlinden, P. J. et al. Sliver (R) solar cells: A new thin-crystalline silicon photovoltaic technology. *Sol. Energy Mater. Sol. Cells* 90, 3422-3430 (2006).

J. Wang, D.A. Drabold, and A. Rockett, "Binding and Diffusion of a Si Adatom Around the Type-A Step on Si(01) c4x2," *Appl. Phys. Lett.*, 66:15, 1954 (1995).

K. J. Weber and A. W. Blakers, .A Novel Silicon Texturization Method Based on Etching Through a Silicon Nitride Mask,. *Progress in Photovoltaics: Research and Applications* 13, 691-695 (2005).

Weber, K. J. et al. A novel low-cost, high-efficiency micromachined silicon solar cell. *IEEE Elect. Dev. Lett.* 25, 37-39 (2004).

Wenham, S. R., Honsberg, C. B. & Green, M. A. Buried contact silicon solar cells. *Solar energy materials and solar cells* 34, 101-110 (1994).

Y. Xia, J.A. Rogers, K.E. Paul and G.M. Whitesides, .Unconventional Methods for Fabricating and Patterning Nanostructures,. *Chemical Reviews* 99(7), 1823-1848 (1999).

Yamamoto, K. et al. Thin-film poly-Si solar cells on glass substrate fabricated at low temperature. *Applied Physics A: Materials Science & Processing* 69, 179-185 (1999).

J. Yoon, A.J. Baca, S.I. Park, P. Elvikis, J.B. Geddes, L.F. Li, R.H. Kim, J.L. Xiao, S.D. Wang, T.H. Kim, M.J. Motala, B.Y. Ahn, E.B. Duoss, J.A. Lewis, R.G. Nuzzo, P.M. Ferreira, Y.G. Huang, A. Rockett and J.A. Rogers, "Ultrathin silicon solar microcells for semi-transparent, mechanically flexible and microconcentrator module designs," *Nat Mater.*, 2008, 7,907.

Zhao, J. H., Wang, A. H. & Green, M. A. 24.5% efficiency silicon PERT cells on MCZ substrates and 24.7% efficiency PERL cells on FZ substrates. *Prog Photovolt.* 7, 471-474 (1999).

W. Zhou, Y. Huang, E. Menard, N.R. Aluru, J.A. Rogers and A.G. Alleyne, Mechanism for Stamp Collapse in Soft Lithography,. *Applied Physics Letters* 87, 251925 (2005).

Z.T. Zhu, E. Menard, K. Hurley, D.Y. Khang, R.G. Nuzzo and J.A. Rogers, .Spin on Dopants for High-Performance Single-crystal Silicon Transistors on Flexible Plastic Substrates,. *Applied Physics Letters* 86(13), 133507 (2005).

\* cited by examiner

ARRAYS OF ULTRATHIN SILICON SOLAR MICROCELLS

CROSS-REFERENCE TO RELATED APPLICATIONS

This application is a national stage application under 35 U.S.C. §371 of PCT/US2009/058231, filed Sep. 24, 2009, which claims the benefit of priority of U.S. Provisional Patent Application No. 61/099,801 filed Sep. 24, 2008, which are hereby incorporated by reference in their entirety to the extent not inconsistent herewith.

STATEMENT REGARDING FEDERALLY SPONSORED RESEARCH OR DEVELOPMENT

This invention was made at least in part with government support under DE-FG02-07ER46453 and DE-FG02-07ER46471 awarded by the U.S. Department of Energy and DMI-0328162 awarded by the National Science Foundation. The government has certain rights in the invention.

BACKGROUND OF THE INVENTION

Photovoltaic solar cells convert sunlight directly into electrical energy. Silicon is the dominant material for photovoltaic (PV) solar cells, with over 90% of all solar cells being made from crystalline and polycrystalline Si. In fact, the share of cells made from Si has increased over the last five years, contrary to predictions that bulk Si solar cells would soon be displaced by thin film solar cells. However, periodic shortages of electronic-grade Si represent a serious limitation to the industry. Furthermore the extreme high purity required of Si used in these devices presents major cost, rate, and energy input driver in production of the material. Shortage of Si feedstock contributes to high cost related to solar power generation and, accordingly, much effort has been devoted to research and development into thin film solar cells. Recent progress in manufacturing of CdTe-based devices currently shows prospects for major cost reductions and production scale-up. However, Cd toxicity and ultimately Te mineral resource limitations may prevent this technology from growing beyond a moderate level. Si does not suffer from either toxicity or resource limitations. There is a need for efficient and low cost photovoltaics (PV) made from lower-grade Si feedstock. In addition, processes that reduce Si feedstock waste can also lead to lower-cost photovoltaics and, therefore, lower cost solar energy conversion to electricity.

The most common technology in the PV industry is based on single crystalline and polycrystalline silicon technology. Presently, silicon PV technology has high materials costs, due to the relatively inefficient use of the bulk silicon material. In conventional methods, bulk crystalline silicon is sawn into wafers, which are then processed into solar cells and soldered together to form the final module. Typical multicrystalline efficiencies are on the order of 15%; high-performance, single-crystal silicon has been produced with 20% efficiency. For this type of solar cell, 57% of the cost is in materials, and of that total material cost 42% comes from the crystalline Si. In addition, these modules are rigid and heavy, both of which are negatives from the consumer standpoint.

Reviews of amorphous and crystalline thin-film Si solar cell activities suggest that near term prospects for significant improvements in thin film amorphous Si cell efficiencies and stability are unlikely without an unexpected breakthrough, thus limiting producers to low margin, highly competitive market applications. It was recognized also that crystalline-Si (c-Si) technologies are achieving economies of scale that allow them to be cost competitive with thin film Si in spite of the energy intensive processes to form c-Si and the large device thicknesses (>100 µm). As the market continues to grow from megawatt to gigawatt scale, however, such thick devices are expected to lose this cost advantage and thin film devices will become the logical choice. An example of this change was provided recently when a thin film CdTe manufacturer announced a production cost under $1.25 per rated Watt of generating capacity with prospects for reduction to below $1/W. This product is undergoing rapid scale-up and may ultimately exceed the production volume of c-Si. Therefore it is important that c-Si make further improvements in cost to remain competitive with the thin film products.

It has been suggested that the greatest opportunity for significant improvements in thin film Si solar cell efficiency, affordability, and stability are likely to occur through crystalline thin-film Si technologies. Both low temperature processable nano/microcrystalline-Si (n/µc-Si) and higher temperature processable small grain polycrystalline-Si (pc-Si) are receiving much attention worldwide as a potential replacement for amorphous-Si (a-Si) alloys used in single junction devices and as the bottom cell in multi-junction devices. While early successes demonstrated near state-of-the-art thin film Si cell efficiencies, which were stable for long periods of time, the ultimate potential of crystalline thin film Si technologies remains less clear due to their higher processing cost and slower throughput when compared to amorphous Si. Unlike crystalline thin film Si, analysis has shown that the cost structure of CdTe and CIGS can be favorable but that issues related to material availability, low efficiency, and Environmental, Health, and Safety present considerable market risk.

Although cells that incorporate "slivers" of monocrystalline Si (i.e. the SLIVER technology) have some apparent connection to the processes provided herein, there are many key differences. First, SLIVER uses Si thicknesses that are relatively thick, typically in the range of ~50 µm. Not only does this require more input Si material, but it also requires better material because the collection field of the solar cell junction is more distributed and carriers must move farther. The proposed technology can provide equivalent cell performances in lower purity Si material due to the reduced device thickness. Second, various approaches presented herein exploit a unique printing based assembly process that is important for achieving cost effective manufacturing with thin Si. Third, current embodiments of SLIVER modules are not mechanically flexible, and they cannot readily incorporate other key technologies, such as molded low concentration micro-optics, and printed interconnects. Micro-optics can increase device performance in otherwise equivalent devices and materials due to the performance enhancement that the concentrator design provides. These multiple differences yield qualitatively different types of modules, with different performance and cost characteristics.

It will be appreciated from the foregoing that a need exists for methods of making high performance solar cells from cheaper forms of Si, such as low-grade Si and Si wafers. To further reduce production costs, solar cell production methods are needed that are capable of high-throughput, low cost implementation with minimal waste of Si feedstock. Further, there is a need for photovoltaics having good operating characteristics and enhanced mechanical functionality such as flexibility, bendability and that are lightweight to promote shipping, handling and installation ease.

SUMMARY OF THE INVENTION

Provided herein are photovoltaics (PV) and related methods for making high efficiency PV that exploit ultrathin solar grade or low grade semiconductors created from bulk semiconductor material, such as Si. In specific embodiments, provided are low-cost PV without unduly sacrificing efficiency or performance. PV of the present invention are optionally lightweight and bendable that provide convenient transportation and installation characteristics. In addition, the PV can be made at least partially optically transparent for use in varied architectural situations such as windows, doors, or skylights. PV systems comprise printable semiconductor-containing structures (e.g., printable semiconductor elements) assembled, organized and/or integrated with other device components, at least in part, via printing-based techniques. Provided herein are systems having performance characteristics and functionality comparable to single crystalline semiconductor based devices fabricated using conventional high temperature processing methods. PV provided herein have device geometries and configurations, such as form factors, component densities, and component positions, accessed by printing that provide a range of useful device functionalities. PV include devices and device arrays exhibiting a range of useful physical and mechanical properties including flexibility, shapeability, conformability and/or stretchablity. PV systems of the present invention include, however, devices and device arrays provided on conventional rigid or semi-rigid substrates, in addition to devices and device arrays provided on flexible, shapeable and/or stretchable substrates.

This invention also provides PV fabrication and processing steps, methods and materials strategies for making PV systems at least in part via printing techniques, including contact printing, for example using a conformable transfer device, such as an elastomeric transfer device (e.g., elastomer layer or stamp). In specific embodiments, methods of the present invention provide a high-throughput, low cost fabrication platform for making a range of high performance PV systems. Processing provided by the present methods is compatible with large area substrates, such as device substrates for microelectronic devices, arrays and systems, and is useful for fabrication applications requiring patterning of layered materials, such as patterning printable structures and/or thin film layers for electronic and electro-optic devices. Methods of the present invention are complementary to conventional microfabrication and nanofabrication platforms, and can be effectively integrated into existing photolithographic, etching and thin film deposition device patterning strategies, systems and infrastructure. The present PV fabrication methods provide a number of advantages over conventional fabrication platforms including the ability to integrate semiconductor materials having a range of quality, such as ranging from relatively low-quality semiconductor material (e.g., solar grade Si) to high quality semiconductor materials, such as single crystalline semiconductors and semiconductor-based electronic devices/device components, into PV systems provided on large area substrates, polymer device substrates, and substrates having contoured a conformation.

In an aspect, the present invention provides processing methods using low quality bulk semiconductor wafer starting materials that are processed to provide large yields of printable semiconductor elements with preselected physical dimensions and shapes that may be subsequently transferred, assembled and integrated into solar cells and PV systems via printing. An advantage provided by the present printing-based device fabrication methods is that the printable semiconductor elements retain desirable electronic properties, optical properties and efficiencies compared to conventional PVs even for compositions that use lower quality bulk wafer starting material (e.g., mobility, purity and doping etc.). This can achieve a significant cost reduction in feedstock material, thereby providing low-cost PV. In addition, use of printing-based assembly and integration, for example via contact printing or solution printing, is compatible with device fabrication over large areas, including areas greatly exceeding the dimensions of the bulk wafer starting material and provides control of different mechanical properties (e.g., flexibility, stretchability etc.) that are useful for target applications such as flexible electronics. Further, the present semiconductor processing and device assembly methods provide for very efficient use of the starting semiconductor material for making printable semiconductor elements that can be assembled and integrated into a large number of devices or device components. This aspect of the present invention is advantageous because very little of the semiconductor wafer starting material is wasted or discarded during processing, thereby providing a processing platform capable of low cost fabrication of PV systems. In an aspect, the invention is described in terms of the percentage by weight of the Si wafer feedstock that is used in making the PV, such as greater than 50%, greater than 60% or greater than 90% of the Si wafer starting material is transferred to the solar cell substrate.

In specific embodiments the semiconductor wafer is Si that is patterned and at least a portion of the patterned Si is transferred onto flexible substrates for further processing into modules. Key elements are the use of commercially demonstrated high efficiency and reliable Si with significant cost savings associated the efficient use of solar-grade Si by incorporation and use of ultrathin Si. Ultrathin SI provides a number of benefits over conventional Si solar cells having a thickness on the order of 100 µm or more, including reducing required Si compared to conventional processing and manufacturing techniques by about 10-fold or more and relaxing the Si purity requirements, thereby minimizing cost. Specialized etching techniques allow ultrathin monocrystalline cells to be produced from commodity Si wafers. Microtransfer printing techniques provide high yield manufacturing with ultrathin Si. Flexible substrates and packaging materials further provide long term, reliable operation of thin, mechanically flexible photovoltaics. The processes provided herein are well-suited for applications related to PV installation on buildings and other structures. As used herein, "high grade" Si refers to electronic grade Si having a composition, purity and geometry that is defined in terms of the resultant functional characteristics. In other words, high grade Si is any type of Si that provides acceptable solar cell performance, such as by an operating characteristic of the solar cell including, but not limited to efficiency or other parameter used to assess solar cell quality. In an aspect, "low grade" Si refers to a Si composition and purity that results in greater than a 10%, 20% or 50% reduction in solar cell performance compared to an equivalent solar cell made from high grade Si. The methods and devices provided herein achieve solar cell or PV performance with low grade Si that experiences a performance degradation that is not greater than 10% of the corresponding performance parameter for the equivalent solar cell made with high grade or electronic grade Si. Such a functional characterization reflects that there is not necessarily a single quantitative definition of "electronic grade" Si. Instead, whether Si is of high grade or low grade depends on a number of factors such as, for example, the type of impurity (such as Si being tolerant to C or O impurity, but not to transition metal impurities).

Processes disclosed herein are compatible with other types of PV systems. For example, ultrathin, monocrystalline Si for cells that achieve both high efficiency and low cost through efficient utilization of moderate or low grade Si has wide ranging applications that are not necessarily confined to the module designs disclosed herein. Microtransfer printing-based manufacturing provides a path to commercialization of cells with dense or sparse coverage, embodied in systems with many possible layouts, including conventional (i.e. rigid substrate, nonconcentrator) designs and other active materials (e.g. GaAs).

Provided are high efficiency PV that exploits ultrathin solar grade Si created from bulk Si and patterned onto flexible substrates for further processing into modules. The use of commercially demonstrated high efficiency and reliable Si along with the efficient use of solar grade Si via the small thicknesses of the printed Si ribbons, their sparse spatial distribution, the potential for integration with non-focusing concentrator optics for higher efficiency and lower cost, and the repeated reuse of Si wafers, translate into reductions in module manufacturing cost. The approach is compatible with a broad range of substrates (e.g. rigid and flexible; metal, glass, or polymer), further providing opportunities for cost savings and design flexibility. The technology is scalable and many of the material and processes are compatible with established film-Si or wafer-Si in rigid or flexible formats. The conversion of market-accepted solar grade Si into a module form using a new manufacturing process should accelerate customer confidence and thus market deployment.

Other advantages of the processes include the ability to simultaneously optimize carrier separation/collection efficiency and photon absorption. High efficiency photovoltaic cell that exploits ultrathin, solar grade, monocrystalline Si, allow implementation of such cells in low cost, lightweight and mechanically flexible modules that is well suited for installation on buildings and other structures. In addition to the cost advantages, these modules have other attractive features, including: Microscale cells, which enable: (1) thin concentrators; (2) efficient heat sinking; (3) low current levels for minimized Joule heating; (4) large output voltages; (5) lightweight, flexible construction, which simplifies transportation and installation; (6) ability for use with a range of substrates, with or without concentrators; and (7) stable cell materials compatible with state of the art packaging materials. Ultrathin, monocrystalline Si for cells that achieve both high efficiency and low cost through efficient utilization of moderate/low grade Si have wide ranging applications. Microtransfer printing based manufacturing provides a path to commercialization of cells with dense or sparse coverage, embodied in systems with many possible layouts, including conventional (i.e. rigid substrate, nonconcentrator) designs and other active materials (e.g. GaAs).

Any of the processes, methods and systems provided herein relate to semiconductor structures (e.g., Si) having a thickness selected from the range of ~5 µm to 25 µm. Reducing the thickness improves Si utilization and simultaneously enables the use of solar grade material. In an embodiment, systems provided herein use ribbons of monocrystalline Si, created from bulk wafers by anisotropic etching processes. An automated, precision transfer printing tool delivers organized arrays of ribbons created in this way to device substrates, such as flexible sheets of plastic, for system integration.

In an aspect, the invention is a method of making a solar cell or a photovoltaic by providing a solar cell substrate having a receiving surface and assembling a printable semiconductor element on the receiving surface of the substrate via contact printing. In an embodiment of this aspect, the printable semiconductor element comprises a semiconductor structure having a thickness that is less than or equal to 100 µm, such as a semiconductor structure that is low grade Si. In an embodiment, low grade Si refers to Si containing more impurities than high grade Si, wherein at least one or more performance characteristics of the solar cell is not substantially degraded (e.g., having an absolute value that is not more than 10%, or not more than 5%, worse than an equivalent solar cell having high grade Si. Although this definition of low-grade Si is relative, in general the thinner cells described herein function well with more defects than a corresponding device having thicker cells.

In an embodiment the thickness is selected from a range that is less than 100 µm, such as from between 10 µm and 75 µm; between 15 µm and 40 µm; less than 50 µm; or less than 25 µm. Alternatively the thickness of the printed semiconductor is selected to optimize solar cell performance where a thinner cell improves performance but reduces absorption of light. In combination with a light-trapping mechanism, a dramatic decrease in thickness is possible without loss of light absorption but with strong decrease in sensitivity to impurities. As used herein, "high efficiency" refers to a solar cell that has an efficiency that is greater than or equal to 15%.

In an aspect, the printable semiconductor element comprises an array of structures having a geometric shape or form factor. In one embodiment the geometric shape corresponds to a microbar, such as microbars having a thickness selected from the range of 0.1 µm and 30 µm, a length selected from the range of 0.5 mm to 5 cm, and a width selected from the range of 5 µm and 1 mm.

Also provided are solar cells having one or more parameters of interest. For example a solar cell having an optical transparency, such as an optical transparency that is greater than or equal to 40% in at least a portion of the visible light spectrum. Other physical parameters of interest include mechanical parameters such as bendability, flexibility, elasticity, stretchability, or rigidity. In an embodiment, provided are solar cells that are bendable or flexible.

In an embodiment, the printable semiconductor element is assembled on a receiving surface via dry transfer contact printing. In an embodiment, the assembly on the receiving surface is by a conformable transfer device.

In an embodiment, the assembly step of the semiconductor element on the receiving surface is by providing a conformable transfer device having a contact surface and establishing conformal contact between an external surface of the printable semiconductor element and the contact surface of the conformable transfer device. In this embodiment, the conformal contact bonds the printable semiconductor element to the contact surface. The printable semiconductor element bonded to the contact surface is brought into contact with the receiving surface of the solar cell substrate. The printable semiconductor element and the contact surface of the conformable transfer device are separated, thereby assembling the printable semiconductor element on the receiving surface of the solar cell substrate. This embodiment is useful for step-and-repeat printing, wherein an array of printable semiconductor elements are provided on a single Si wafer and only a portion of the array is assembled on the receiving surface in a given printing step, and subsequent printing steps assemble additional portions from the wafer to the receiving surface. For example, a single Si wafer may be etched to provide multiple layers of printable semiconductor elements, and each printing step transfers at least a portion of a top layer of elements, to provide a top-down transfer approach from the wafer to the receiving substrate. Alternatively, or in addition, printable semiconductor elements may be provided at a high surface density on the wafer or donating substrate compared to the surface density of the assembled semiconductor elements on the receiving surface. Accordingly, only a selected portion of the printable semiconductor elements on the donor or wafer substrate is assembled on the receiving surface for a single assembling step. The step-and-repeat printing provides a mechanism then to transfer at least substantially all the semiconductor elements from the donor substrate to the receiving surface, but at a different coverage density. For example, from a donating surface density of printable semiconductor elements on a single Si wafer that is at least ten times greater than the printed surface density of assembled semiconductor elements on the receiving surface. In an embodiment, the receiving surface coverage density of semiconductor elements is selected from sparse to dense, such as a value that is between the range of 5 semiconductor elements/mm$^1$ to 100 elements/mm$^2$ or greater.

In an embodiment, the printable semiconductor elements are provided on an area of the receiving substrate selected over the range of 0.05 m$^2$ to 10 meters$^2$, and preferably for some applications selected over the range of 0.05 m$^2$ to 1 meters$^2$, and in other applications a receiving surface having a surface area that is greater than 500 cm$^2$.

In aspects of the invention, the methods are further described in terms of the functional parameters of the semiconductor quality. For example, in embodiments where the semiconductor is low-grade Si, the low-grade Si can be defined in terms of one or more physical parameters such as relative to a corresponding parameter of high-grade Si. Alternatively, low-grade Si refers to the electrically-active defect density that would produce a significant degradation in performance for a conventional thick solar cell, such as a performance degradation that is greater than 10%, or greater than 25%, or greater than 50%, for example.

In another embodiment, the semiconductor structure is patterned in a bulk Si wafer. In this embodiment, the donor substrate and the semiconductor structure are unitary.

In an aspect, the processes and systems are defined in terms of one or more PV operating characteristics, as desired, such as efficiency, short circuit density, current density or voltage as a function of voltage, open circuit voltage. In an embodiment, the solar cell has an efficiency that is greater than or equal to 15%.

In an embodiment, provided are methods of making an ultra-thin microscale solar cell by providing a solar cell substrate having a receiving surface and a plurality of semiconductor elements on a donor substrate. At least a portion of the semiconductor elements are transferred from the donor substrate to the receiving surface. The transferred semiconductor elements have a thickness that is less than 100 µm and a reduced requirement for Si purity.

The semiconductor elements are optionally transferred as described herein, such as via a conformable transfer device. In particular, the conformable transfer device has a contact surface, and conformal contact is established between an external surface of the semiconductor element and the contact surface. This conformal contact bonds the printable semiconductor element to the contact surface. The bonded semiconductor element is contacted with the receiving surface of the device substrate and then separated, thereby assembling the semiconductor element on the receiving surface of the solar cell substrate.

In an aspect, the plurality of semiconductor elements on a donor substrate comprises a Si wafer having a patterned surface, such as a plurality of Si microbar cells that are at least partially undercut. Such processing and undercutting facilitates high-fidelity transfer of structures from the donor substrate to the stamp. For further efficiency, cost savings and maximum feedstock utilization, the Si wafer is optionally reused after the semiconductor elements are transferred to the receiving surface. The reuse may correspond to further patterning and processing to obtain additional printable semiconductor elements for subsequent assembly.

In another aspect the semiconductor elements are contacted in small areas on the rear surface only. Such a contact arrangement minimizes loss of current by recombination of minority carriers at the contacts. It also simplifies integration of the devices to produce a monolithically integrated structure. In this aspect the series connection of the microbars produces a high voltage low current device, reducing efficiency losses due to series resistance.

In another aspect the semiconductor elements contacted on the rear and interconnected monolithically are treated to reduce current loss by recombination of minority carriers at the surface of the microbars. This surface treatment provides functional improvement in the operation of small devices.

In another aspect, any of the processes and PV disclosed herein has semiconductor elements that are bonded to the receiving substrate by an adhesive. For aspects where the invention is further defined by geometrical or form factor constraints, any of the devices and processes have a semiconductor element with a thickness that is less than 20 µm. In addition, any of the receiving surface to which the printable semiconductor elements are assembled, has a surface area footprint over which semiconductor elements are assembled that is greater than or equal to 1 m$^2$.

One important aspect of the invention relates to the ability to utilize a large proportion of feedstock material, including Si wafer from which semiconductor elements are obtained, thereby decreasing costs and avoiding waste. In an embodiment where the feedstock is a Si wafer, an aspect of the invention relates to greater than 60% by weight of the silicon wafer is transferred to a solar cell substrate. Any of the systems and processes provided herein relate to a solar cell that is flexible or bendable.

In an embodiment, the invention is a solar cell or a photovoltaic made by any of the methods disclosed herein.

In an embodiment, the invention is a solar cell or a photovoltaic that is an ultrathin silicon solar microcell comprising a solar cell substrate and a plurality of semiconductor elements supported by the substrate, wherein the semiconductor elements are made from low grade Si and have a thickness that is less than or equal to 100 µm.

In another aspect, any of the methods or devices provided herein relate to a silicon solar module comprising a plurality of microcells, wherein the microcells are electrically connected in series to provide a high voltage output. For example, any of the methods further comprise electrically interconnecting a plurality of solar cells to obtain a module of solar cells having a high voltage output. "High voltage output" refers to solar microcell modules having a voltage output under an operating condition that is substantially higher than previously reported systems (e.g., on the order of about 0.5 V). Accordingly, in an embodiment high voltage output is an output voltage that is greater than or equal to 1 V. In other embodiments high voltage output is an output voltage that is greater than or equal to 10V, or that is greater than or equal to 100V.

In another aspect, the modules provided herein relate to the number of solar microcells that are electrically connected to each other, such as electrically connected in series with respect to each other so as to achieve high voltage output. In an embodiment, the number of microcells is greater than or equal to 30, or are greater than or equal to 300.

In an embodiment, any of the modules are compact modules. "Compact" refers to the base area footprint of the module that is less than or equal to 100 cm$^2$, or less than or equal to 25 cm$^2$, or less than or equal to 0.25 cm$^2$. "Base area footprint" refers to, for example, the working surface area of the module and specifically of the PV in the module, such as shown by the surface of module of FIG. 37D.

The processes and systems provided herein are compatible with a number of aspects to facilitate further improvements in functional characteristics and/or operating parameters. Examples include, but are not limited to, neutral mechanical designs and encapsulation schemes, anchoring schemes, form factors, substrate selection and packaging (such as those provided in any one or more of Ser. Nos. 11/981,380, 11/851,182, 61/084,045, 11/115,954, 11/145,574, 11/145,542, 11/675,659, 11/465,317, 11/423,287, 11/423,192, and 11/421,654, each of which are hereby incorporated by reference to the extent not inconsistent with the present description.

DETAILED DESCRIPTION OF THE INVENTION

Figure 1:
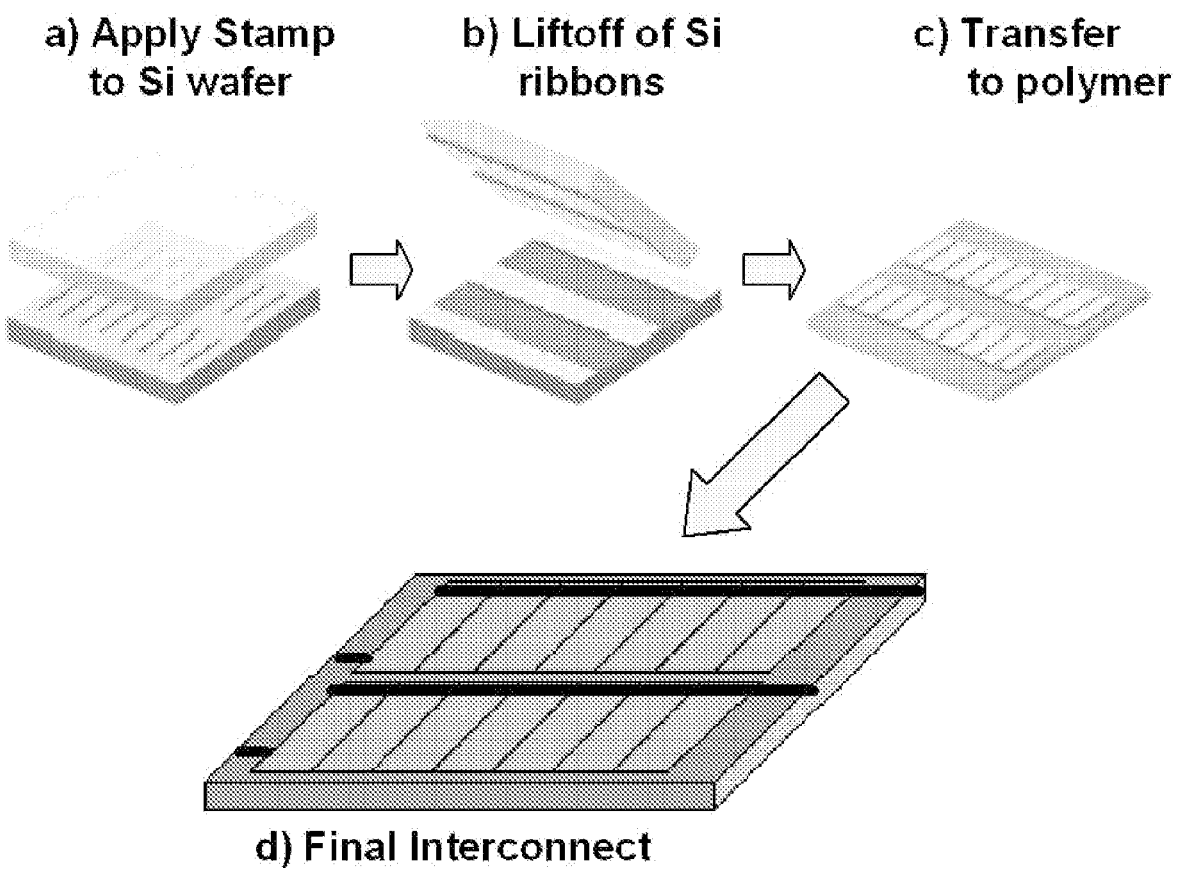
FIG. 1 provides a schematic processes flow diagram showing a method for making a microsolar cell array of the present invention.

Referring to the drawings, like numerals indicate like elements and the same number appearing in more than one drawing refers to the same element. In addition, hereinafter, the following definitions apply:

"Printable" relates to materials, structures, device components and/or integrated functional devices that are capable of transfer, assembly, patterning, organizing and/or integrating onto or into substrates without exposure of the substrate to high temperatures (i.e. at temperatures less than or equal to about 400 degrees Celsius). In one embodiment of the present invention, printable materials, elements, device components and devices are capable of transfer, assembly, patterning, organizing and/or integrating onto or into substrates via solution printing or contact printing.

"Printable semiconductor elements" of the present invention comprise semiconductor structures that are able to be assembled and/or integrated onto substrate surfaces, for example using by dry transfer contact printing and/or solution printing methods. In one embodiment, printable semiconductor elements of the present invention are unitary single crystalline, polycrystalline or microcrystalline inorganic semiconductor structures. In one embodiment, printable semiconductor elements are connected to a substrate, such as a mother wafer, via one or more bridge elements. In this context of this description, a unitary structure is a monolithic element having features that are mechanically connected. Semiconductor elements of the present invention may be undoped or doped, may have a selected spatial distribution of dopants and may be doped with a plurality of different dopant materials, including p and n type dopants. Printable semiconductor elements and structures of the present invention may include holes or perforations through one dimension of the elements to facilitate their release from a wafer by the introduction of a chemical release agent. The present invention includes microstructured printable semiconductor elements having at least one cross sectional dimension (e.g., thickness) selected over the range of 1 micron to 1000 microns. The present invention includes nanostructured printable semiconductor elements having at least one cross sectional dimension (e.g., thickness) selected over the range of 1 to 1000 nanometers. In an embodiment, a printable semiconductor element of the present invention has a thickness dimensions less than or equal to 1000 microns, preferably for some applications a thickness dimension less than or equal to 100 microns, preferably for some applications a thickness dimension less than or equal to 10 microns, preferably for some applications a thickness dimension less than or equal to 1 microns, and preferably for some applications a thickness dimension ranging from between about 5 µm and 25 µm.

Printable semiconductor elements useful in many applications comprises elements derived from "top down" processing of high purity bulk materials, such as high purity crystalline semiconductor wafers generated using conventional high temperature processing techniques. In other embodiments, a printable semiconductor elements is a medium or lower-quality bulk material, such as low-grade or solar-grade Si. "Low-grade" silicon refers to a silicon material whose use in a conventional solar cell (e.g., having a thickness on the order of more than 100 µm) substantially decreases one or more operating parameters, such as a decrease of at least 10%, for example. As an example, a solar cell made from high quality Si may have an efficiency of 15%, whereas if low-grade Si replaced the high-grade Si the efficiency is substantially degraded, such as by about 10% (e.g., to about 13.5%) or more. In contrast, the use of low-grade Si as disclosed herein maintains the efficiency, or provides for degradation that is not substantial, e.g., that is less than 10%. Examples of other operating parameters relevant to solar cells include open-circuit voltage, short circuit current density, current density at max power, or any other parameter as known in the art for describing the performance of solar cells. In aspects where the silicon semiconductor element is assembled to make a solar cell, the low-grade silicon is ultra-thin, such as thinner than 100 µm, thinner than 50 µm, thinner than 25 µm or having a thickness that is between about 5 µm and 30 µm.

"Solar grade" Si is optionally defined in terms of a purity level or an impurity level. In an aspect, "low grade" Si refers to Si having a purity level that is less than or equal to 99.9999% (see, e.g., http://www1.eere.energy.gov/solar/silicon.html). One disadvantage of such a definition is that an acceptable purity level depends on the type of impurity. For example, the end device is more tolerant of impurities that are C or O atoms compared to metals, particularly transition metals, for example. For example C levels are typically on the order of 200 ppb. Typically, oxygen and carbon impurity levels are ignored. Accordingly, when referring to non-oxygen and non-carbon impurities such as metallic impurities, low grade silicon is optionally defined as having a purity level that is less than 99.999999% or that is less than 99.9999%. Similarly, "high grade" or "electronic grade" is optionally defined as having purity levels that are greater than 99.9999999% or greater than 99.999999999% with respect to metallic atoms, such as transition metals.

In some methods and systems of the present invention, printable semiconductor elements of the present invention comprise composite heterogeneous structures having a semiconductor operational connected to or otherwise integrated with at least one additional device component or structure, such as a conducting layer, dielectric layer, electrode, additional semiconductor structure or any combination of these. In some methods and systems of the present invention, the printable semiconductor element(s) comprises a semiconductor structure integrated with at least one additional structure selected from the group consisting of: another semiconductor structure; a dielectric structure; conductive structure, and an optical structure (e.g., optical coatings, reflectors, windows, optical filter, collecting, diffusing or concentration optic etc.). In some methods and systems of the present invention the printable semiconductor element(s) comprises a semiconductor structure integrated with at least one electronic device component selected from the group consisting of: an electrode, a dielectric layer, an optical coating, a metal contact pad a semiconductor channel. In some methods and systems of the present invention, printable semiconductor elements of the present invention comprise stretchable semiconductor elements, bendable semiconductor elements and/or heterogeneous semiconductor elements (e.g., semiconductor structures integrated with one or more additional materials such as dielectrics, other semiconductors, conductors, ceramics etc.). Printable semiconductor elements include, printable semiconductor devices and components thereof, including but not limited to printable LEDs, lasers, solar cells, p-n junctions, photovoltaics, photodiodes, diodes, transistors, integrated circuits, and sensors.

"Cross sectional dimension" refers to the dimensions of a cross section of device, device component or material. Cross sectional dimensions include the thickness, radius, or diameter of a printable semiconductor element. For example, printable semiconductor elements having a ribbon shape are characterized by a thickness cross sectional dimension. For example, printable semiconductor elements having a cylindrical shape are characterized by a diameter (alternatively radius) cross sectional dimension.

"Longitudinally oriented in a substantially parallel configuration" refers to an orientation such that the longitudinal axes of a population of elements, such as printable semiconductor elements, are oriented substantially parallel to a selected alignment axis. In the context of this definition, substantially parallel to a selected axis refers to an orientation within 10 degrees of an absolutely parallel orientation, more preferably within 5 degrees of an absolutely parallel orientation. In an aspect, the solar cell comprises a plurality of semiconductor elements that are longitudinally oriented in a substantially parallel configuration, such as an array of silicon microbars.

The terms "flexible" and "bendable" are used synonymously in the present description and refer to the ability of a material, structure, device or device component to be deformed into a curved shape without undergoing a transformation that introduces significant strain, such as strain characterizing the failure point of a material, structure, device or device component. In an exemplary embodiment, a flexible material, structure, device or device component may be deformed into a curved shape without introducing strain larger than or equal to 5%, preferably for some applications larger than or equal to 1%, and more preferably for some applications larger than or equal to 0.5%. In an exemplary embodiment, a flexible material, structure, device or device component may be deformed into a curved shape without introducing strain less than or equal to 5%, preferably for some applications less than or equal to 1%, and more preferably for some applications less than or equal to 0.5%.

"Semiconductor" refers to any material that is a material that is an insulator at a very low temperature, but which has an appreciable electrical conductivity at a temperatures of about 300 Kelvin. In the present description, use of the term semiconductor is intended to be consistent with use of this term in the art of microelectronics and electrical devices. Semiconductors useful in the present invention may comprise element semiconductors, such as silicon, germanium and diamond, and compound semiconductors, such as group IV compound semiconductors such as SiC and SiGe, group III-V semiconductors such as AlSb, AlAs, Aln, AlP, BN, GaSb, GaAs, GaN, GaP, InSb, InAs, InN, and InP, group III-V ternary semiconductors alloys such as $Al_xGa_{1-x}$, As, group II-VI semiconductors such as CdSe, CdS, CdTe, ZnO, ZnSe, ZnS, and ZnTe, group I-VII semiconductors CuCl, group IV-VI semiconductors such as PbS, PbTe and SnS, layer semiconductors such as $PbI_2$, $MoS_2$ and GaSe, oxide semiconductors such as CuO and $Cu_2O$. The term semiconductor includes intrinsic semiconductors and extrinsic semiconductors that are doped with one or more selected materials, including semiconductor having p-type doping materials and n-type doping materials, to provide beneficial electrical properties useful for a given application or device. The term semiconductor includes composite materials comprising a mixture of semiconductors and/or dopants. Specific semiconductor materials useful for in some applications of the present invention include, but are not limited to, Si, Ge, SiC, AlP, AlAs, AlSb, GaN, GaP, GaAs, GaSb, InP, InAs, GaSb, InP, InAs, InSb, ZnO, ZnSe, ZnTe, CdS, CdSe, ZnSe, ZnTe, CdS, CdSe, CdTe, HgS, PbS, PbSe, PbTe, AlGaAs, AlinAs, AlInP, GaAsP, GaInAs, GaInP, AlGaAsSb, AlGaInP, and GaInAsP. Porous silicon semiconductor materials are useful for applications of the present invention in the field of sensors and light emitting materials, such as light emitting diodes (LEDs) and solid state lasers. Impurities of semiconductor materials are atoms, elements, ions and/or molecules other than the semiconductor material(s) themselves or any dopants provided to the semiconductor material. Impurities are undesirable materials present in semiconductor materials which may negatively impact the electrical properties of semiconductor materials, and include but are not limited to oxygen, carbon, and metals including heavy metals. Heavy metal impurities include the transition metals from chemical groups IB through VIIIB and the rare earths. Other metal impurities include the chemical group 1A, IIA, and IIIA and heavier metallic species such as Sn, Sb, Pb, Bi, and Po, as well as all ions, compounds, and/or complexes thereof.

"Elastomer" refers to a polymeric material which can be stretched or deformed and return to its original shape without substantial permanent deformation. Elastomers commonly undergo substantially elastic deformations. Exemplary elastomers useful in the present invention may comprise, polymers, copolymers, composite materials or mixtures of polymers and copolymers. Elastomeric layer refers to a layer comprising at least one elastomer. Elastomeric layers may also include dopants and other non-elastomeric materials. Elastomers useful in the present invention may include, but are not limited to, thermoplastic elastomers, styrenic materials, olefenic materials, polyolefin, polyurethane thermoplastic elastomers, polyamides, synthetic rubbers, PDMS, polybutadiene, polyisobutylene, poly(styrene-butadiene-styrene), polyurethanes, polychloroprene and silicones. Elastomers provide elastomeric stamps useful in the present methods.

"Transfer device" refers to a device or device component capable of receiving, relocating, assembling and/or integrating an element or array of elements, such as one or more printable semiconductor elements. Transfer devices useful in the present invention include conformable transfer devices, having one or more contact surfaces capable of establishing conformal contact with elements undergoing transfer. The present methods and compositions are particularly well suited for implementation in connection with a transfer device comprising an elastomeric transfer device. Useful elastomeric transfer devices including an, elastomeric stamp, composite elastomeric stamp, an elastomeric layer, plurality of elastomeric layers and an elastomeric layer coupled to a substrate such as a glass, ceramic, metal or polymer substrate.

"Conformal contact" refers to contact established between surfaces, coated surfaces, and/or surfaces having materials deposited thereon which may be useful for transferring, assembling, organizing and integrating structures (such as printable semiconductor elements) on a substrate surface. In one aspect, conformal contact involves a macroscopic adaptation of one or more contact surfaces of a conformable transfer device to the overall shape of a substrate surface or the surface of an object such as a printable semiconductor element. In another aspect, conformal contact involves a microscopic adaptation of one or more contact surfaces of a conformable transfer device to a substrate surface leading to an intimate contact with out voids. The term conformal contact is intended to be consistent with use of this term in the art of soft lithography. Conformal contact may be established between one or more bare contact surfaces of a conformable transfer device and a substrate surface. Alternatively, conformal contact may be established between one or more coated contact surfaces, for example contact surfaces having a transfer material, printable semiconductor element, device component, and/or device deposited thereon, of a conformable transfer device and a substrate surface. Alternatively, conformal contact may be established between one or more bare or coated contact surfaces of a conformable transfer device and a substrate surface coated with a material such as a transfer material, solid photoresist layer, prepolymer layer, liquid, thin film or fluid.

"Placement accuracy" refers to the ability of a transfer method or device to transfer a printable element, such as a printable semiconductor element, to a selected position, either relative to the position of other device components, such as electrodes, or relative to a selected region of a receiving surface. "Good placement" accuracy refers to methods and devices capable of transferring a printable element to a selected position relative to another device or device component or relative to a selected region of a receiving surface with spatial deviations from the absolutely correct position less than or equal to 50 microns, more preferably less than or equal to 20 microns for some applications and even more preferably less than or equal to 5 microns for some applications. The present invention provides devices comprising at least one printable element transferred with good placement accuracy.

"Step-and-repeat fashion" refers to repeated printed transfer in a sequential manner of semiconductor elements from a donor substrate (e.g., a silicon wafer) to a receiving substrate.

In this manner, a single Si wafer can be used for large area coating of a solar cell receiving surface, thereby minimizing Si waste while facilitating high-throughput manufacture of solar cells, solar cell modules and photovoltaics. In this aspect, an array of printable semiconductor elements are provided in the wafer and only a portion at a single printing step are transferred. Alternatively, the wafer is sequentially processed by conventional patterning techniques after each transfer step, thereby obtaining an array of semiconductor structures over time. In an aspect, the sequential printing is top-down from a bulk material, or the sequential printing accesses different surface regions of the bulk material, or both.

"Surface density" refers to the number of elements per unit surface area. In an aspect, the printable semiconductor elements have a higher density on the donor substrate and a lower surface density on the receiving surface. Such a situation is particularly suited to processes wherein the semiconductor elements are relatively easily prepared at a high density (e.g., reliably and at a low cost) on a donor substrate, but are functionally not required to have such a high density on the device (e.g., solar cell) substrate. Transfer printing techniques provided herein, and also in U.S. patent application Ser. Nos. 11/981,380, 11/851,182, 61/084,045, 11/115,954, 11/145,574, 11/145,542, 11/675,659, 11/465,317, 11/423,287, 11/423,192, and 11/421,654, are used to selectively lift-off and transfer a subset of the structures on the donor substrate, thereby providing a lower density of structures on the solar cell substrate. Lower density Si structures can be useful in situations where higher optical transparency is desired, for example.

The invention may be built on a range of substrates, including rigid materials (e.g. glass), flexible materials (e.g. thin plastic), and even stretchable materials (e.g. elastomers), imparting a number of benefits to these display and illumination products, including a high-degree of transparency, flexibility, and/or stretchability, as well as mechanical toughness and low weight. The invention is therefore useful for a number of applications, including architectural elements and devices that can dynamically conform to complex contours of objects, for example in the aerospace, transportation, medical, and fashion industries.

The invention may be further understood by the following non-limiting examples. All references cited herein are hereby incorporated by reference to the extent not inconsistent with the disclosure herewith. Although the description herein contains many specificities, these should not be construed as limiting the scope of the invention but as merely providing illustrations of some of the presently preferred embodiments of the invention. For example, thus the scope of the invention should be determined by the appended claims and their equivalents, rather than by the examples given.

EXAMPLE 1

Ultra Thin Flexible Solar (UTFS) Devices and Methods

There is currently interest in thin-film PV technologies, since these systems have the potential for lower cost (due to less active material usage), and also have the ability to be deposited onto polymer substrates for low weight and flexibility. Presently, investigation is ongoing in thin film materials such as amorphous silicon, cadmium telluride (CdTe) and copper indium gallium diselenide (CIGS). CIGS-based PV cells have demonstrated cell efficiencies of 19.2%, the highest of any polycrystalline thin film material. These cells are small, laboratory-scale devices; to date, the highest large-area flexible module efficiencies are on the order of 10%. Cheaper thin film semiconductors enable material cost savings, but induce higher processing costs as the cells need to be fabricated/processed on large area substrates. Also, only low/moderate temperature processes can be used on the final assembly substrate Ideally, one would like to combine the single crystalline technologies, which have a high efficiency and large industrial knowledge base, with the low-cost, lightweight and flexible nature of the thin-film technologies. The present Ultra Thin Flexible Solar (UTFS) technology provides the means of achieving a lightweight, flexible solar module with both high efficiency and lower materials costs. Since we start with a pure silicon substrate, it enables the use of high precision and high-temperature wafer processing to fabricate state-of-the-art performance solar cells.

In an aspect, Ultra Thin Flexible Solar (UTFS) Devices are generated via a novel fabrication platform combining:
1. An ultra-thin (less than 20 microns thickness) crystalline silicon solar cell, grown and etched on a single-crystal silicon wafer. The size of this cell is much less (e.g., two orders of magnitude) than those used in previous silicon-transfer processes, for example the solar cells have lengths and width that are on the order of 100 microns in some embodiments;
2. An innovative microstamping process which removes the silicon solar cell from the mother wafer and transfers it to a flexible polymer substrate; and
3. Automated interconnect of the transferred cells to form the final module, if required.

Methods and systems utilize a microstamping contact printing process that avoids certain problems associated with past silicon transfer technologies; namely, the cracking and defects formed by attempting to transfer relatively large pieces of silicon. The present microstamping contact printing process also reduces the overall module assembly cost (compared to conventional die pick-and-place techniques) as thousands of micro-cells can be transfer-printed in parallel.

The solar cell devices and fabrication methods have several advantages including applicability to a wide variety of high quality crystalline semiconductors including but not limited to single crystalline silicon and other higher-efficiency materials, such as Gallium Arsenide (GaAs). In addition, combination of an ultra-thin solar cell and a polymer substrate provides devices and systems having low weight and good mechanical flexibility. Polypropylene is a polymer useful for this aspect of the present systems and methods.

FIG. 1 provides a schematic of a process flow diagram showing a method for making a microsolar cell array. As shown in FIG. 1, a Si wafer is processed so as to generate a plurality of silicon-based microsolar cell ribbons. The silicon-based microsolar cell ribbons are released from the substrate. The released ribbons are lifted off and transferred to a polymer device substrate via contact printing using an elastomeric transfer device. Ribbons of silicon are assembled into a photovoltaic device array via subsequent processing including the step of providing device interconnects to the microsolar cells, and optionally light collection and concentrating optics such as a lens array.

Figure 2:
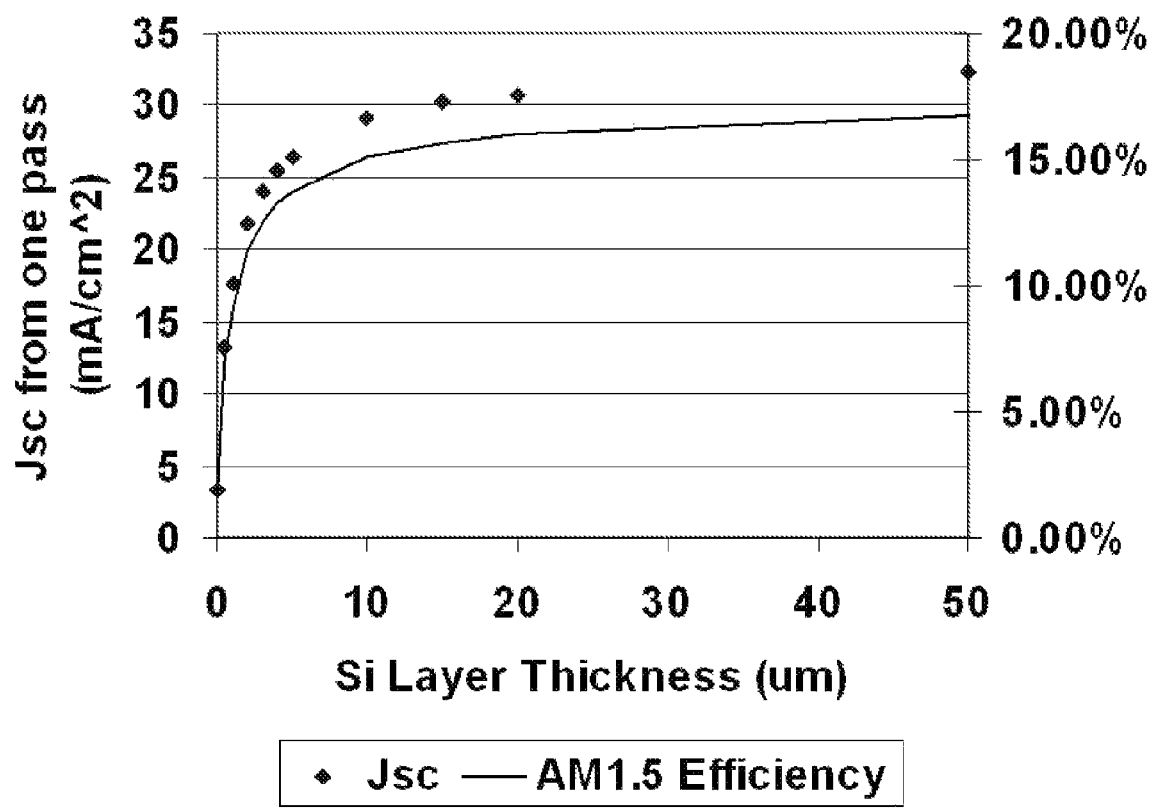
FIG. 2. Estimated Short Circuit Current ($J_{sc}$) and AM1.5 Efficiency as a function of Silicon Thickness.

As shown in FIG. 1, thin (~10 µm) silicon solar cells are transferred to polymer substrates and interconnected to form a module in a manner that retains flexibility. Selection of the thickness of the silicon component of the silicon solar cell is an important parameter in the present invention. In an embodiment, for example, the thin silicon component is thick enough to achieve a desired efficiency of ~15%. The primary impact of thickness on the cell performance is on the collected current; with a thinner cell, less photons are absorbed and hence less current is generated. FIG. 2, provides a plot of Si Layer thickness verses short circuit current ($J_{sc}$) as calculated for a simulated Si cell exposed to the AM1.5 standard spectrum used for terrestrial-based solar cells. For these calculations, we assume that the light is refracted at the front surface of the device, reflected efficiently and scattered from the back surface of the device, leading to a total path length of the light in the semiconductor of three times the semiconductor thickness, and that the quantum efficiency of the cell is relatively high (90%).

From the results of the calculation, a silicon thickness on the order of 10-15 microns would be required in some embodiments of the present invention to achieve the desired AM1.5 efficiency of 15%. It should be noted that this relatively thick absorber layer is due to the fact that silicon is an indirect-bandgap material. A similar solar cell using a direct-bandgap material, such as gallium arsenide, can be thinner.

Figure 3:
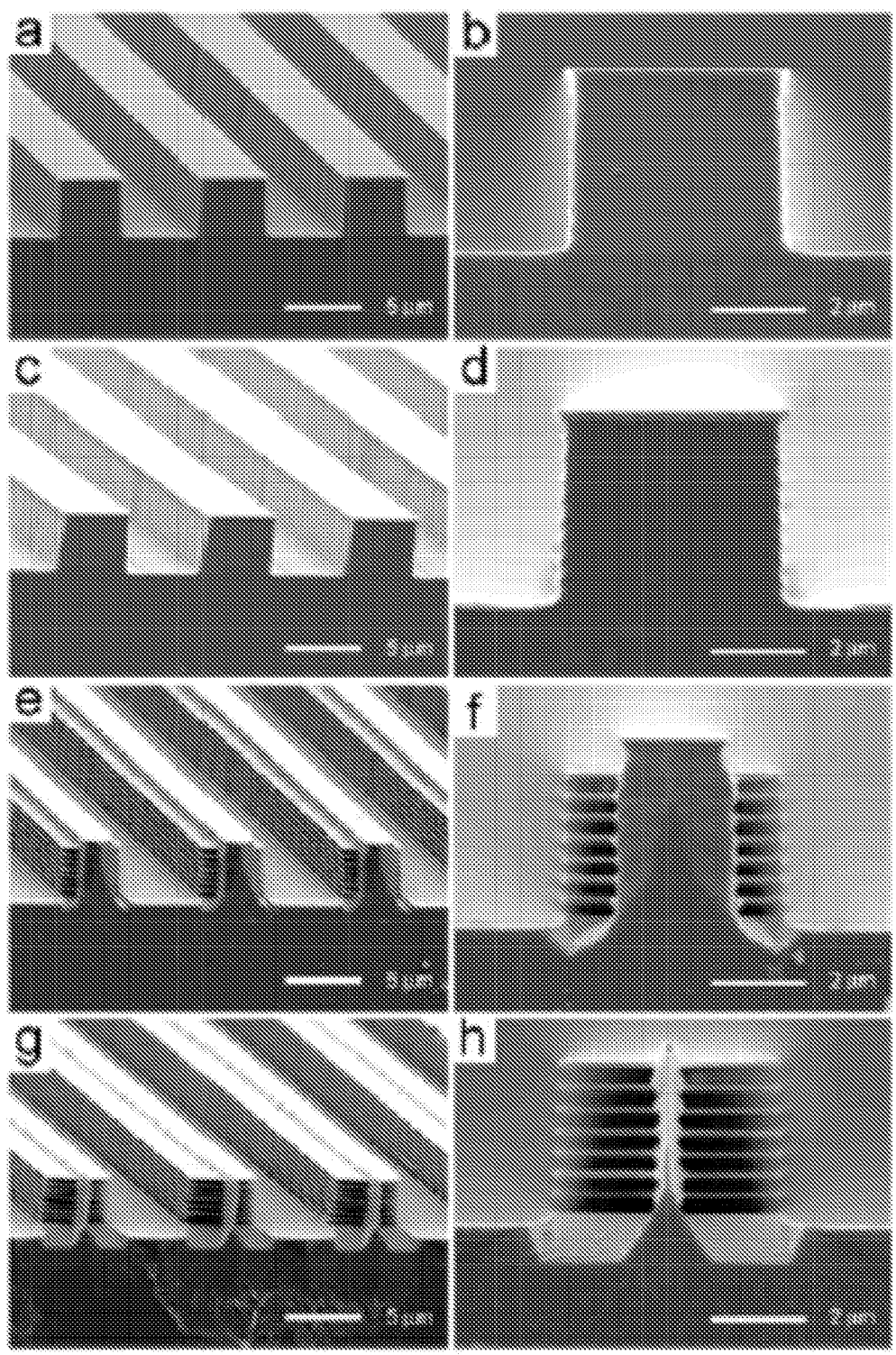
FIG. 3. Scanning Electron Micrographs Showing Sequential Formation of Si Multilayer Ribbon Stacks.

Multilayer stacks of printable silicon ribbons can be formed by using a combination of reactive ion etching and wet etching. Further, device performance may be affected by different wafer orientation (i.e. (111)) rather than the normal (100) orientation. FIG. 3 provides scanning electron micrographs showing sequential formation of Si multilayer ribbon stacks useful in some embodiments of the present invention. These are high-quality, dimensionally-uniform ribbons. By appropriate processing into p-n diodes, these can be converted into silicon solar cells.

Previous silicon transfer techniques typically glue the liftoff layer to a glass carrier, and also transfer relatively large areas of silicon (~5 cm$^2$). One of the major issues with these transfer techniques are cracks and defects formed in the Si layer.

By transferring smaller pieces of Si, we avoid cracking the transferred Si layer. We also use an innovative 'stamping' process using a poly-dimethylsiloxane (PDMS) material to grip and transfer the silicon to a polymer substrate.

A polymer such PET or PEN is useful for the substrate in terrestrial applications. For space-based applications, a space-rated polyamide such as Kapton can be used as a substrate material. Kapton is mechanically suitable for space applications, although it is known to degrade in low earth orbit due to the presence of atomic oxygen (AO).

Figure 4:
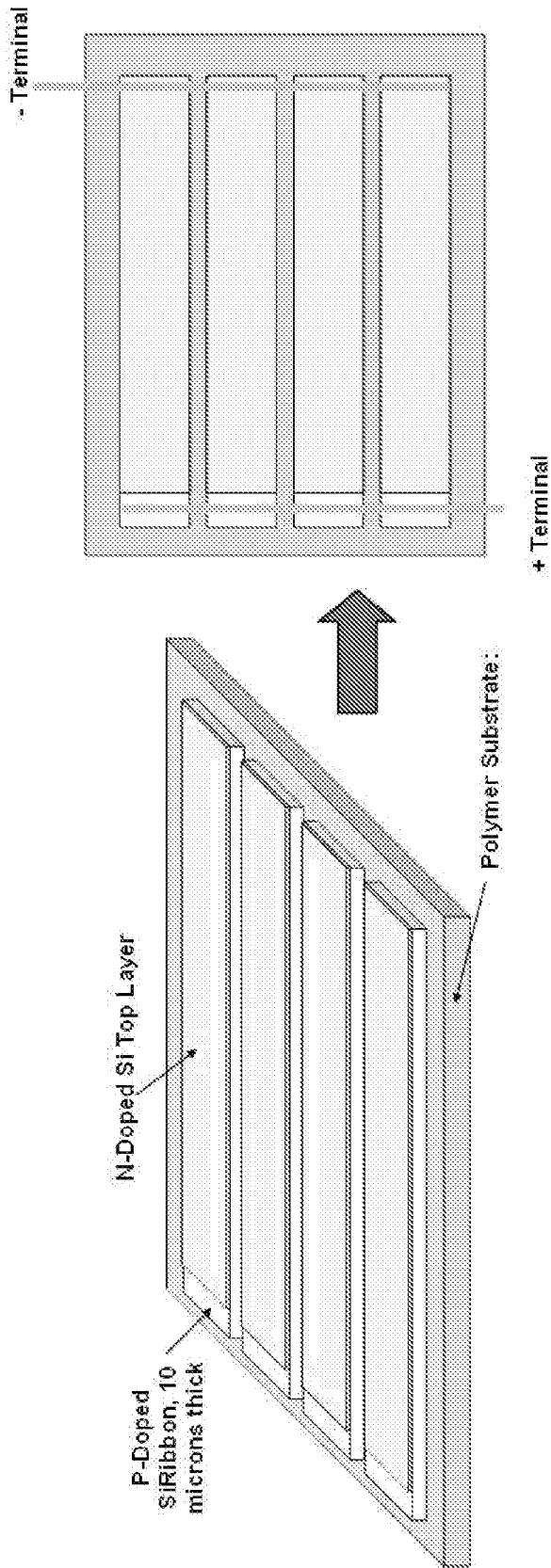
FIG. 4 provides a schematic diagram of a connection scheme where the Si ribbons comprising p-type silicon with a thin n-type layer on top to form the emitter. Left side shows the as-transferred Si Ribbons, right shows the connection (direct-write or screen-printing). Only four Si Ribbons are shown for clarity.

After transfer of the Si ribbons to the polymer substrate, they are electrically interconnected to form the final solar cell. In some embodiments, individual Si ribbons are connected in a series connection. FIG. 4 provides a schematic diagram of a connection scheme where the Si ribbons comprise p-type silicon with a thin n-type layer on top to form the emitter. After transfer, connection lines comprising conducting ink are printed onto the ribbons, either via a direct-write process or via screen-printing. The bottom panel shows the as-transferred Si Ribbons and the top panel shows the connection (direct-write or screen-printing). Only four Si Ribbons are shown for clarity.

One of the attractions of the present technology is that it is applicable to other absorber materials; for example, the same microstamping process has been used to transfer gallium arsenide. The use of these materials has been demonstrated in concentrator solar modules.

Bulk crystalline silicon is selling for over $50 per kilogram. Presently, silicon plants are coming online to meet the needs of both the PV and microelectronic industries. It is anticipated that even if bulk Si costs fall back to pre-2001 values of $20/kg, as capacity catches up with demand, overall costs will remain high. As mentioned previously, present-day Si PV is formed by sawing a crystalline ingot into wafers, then processing the wafers into cells, and then soldering the cells together to form the final module. The present industry trend is towards thinner cells, since Si thicknesses beyond ~50 microns (see FIG. 2) do not absorb any more light. Currently, the thinnest Si PV cells are on the order of 250 microns thick (about ¼ mm). Handling such thin wafers in the 'normal' PV cell processing and integration is a challenge.

Conventional wire-sawing techniques result in approximately 60% waste; that is, 60% of the original silicon ingot winds up as dust. For a 20% efficient module formed out of 250-micron-thick wafers, the silicon materials costs are estimated at $0.40/Watt. Considering that the ultimate goal of the PV industry is to achieve $1/Watt, the materials costs for such a module are significant. Although dendritic web, string ribbon (evergreen solar) and edge fed growth provides almost no waste of material and 15%-efficient devices, those process generally make ribbons that are 100-300 μm thick. The transfer process provided herein generate much thinner devices which also provides a cost benefit.

For the present UTFS technology, the semiconductor materials costs is much lower. Even assuming a waste of 50%, with a 15% module with 15-micron thick silicon the materials costs are estimated at ~$0.02/Watt. This cost savings is primarily due to the better utilization of the silicon; in effect, we are 'spreading' the silicon over a greater area than in conventional methods and devices.

The printing process involves the liftoff of the device element from the mother substrate onto the stamp, followed by the delivery of these elements from the surface of the stamp to the target substrate. By appropriate design of the undercut etch and liftoff of these elements from their mother substrate, it is possible to perform the liftoff step with high yields. The transfer is accomplished either by stronger van der Waals bonding between the element and the target substrate than between the element and the stamp or by the use of strong adhesive layers on the target substrate. In both cases, the area of contact between the element and the coated or uncoated surface of the target substrate must be sufficiently high to enable efficient transfer. In most case, the dominant requirement is for the bottom surfaces of the elements and the top surfaces of the target substrate to be sufficiently smooth to enable large contact areas. This requirement can be satisfied for a wide range of systems of interest. The systems considered in this example are extremely well situated to meet these flatness requirements, since they involve elements with polished back surface and target substrates that will consist of polished semiconductor wafers.

Single crystal silicon is printed onto various substrates, for example, onto plastic, glass, Si wafers, InP wafers and thin film a-Si. The microstamping process described herein is compatible with a wide range of substrates.

In an embodiment, the stamps used to pick-up and transfer the 'chiplets' are typically made by casting and curing a ~1 cm thick piece of rubber against a "master" substrate. The patterns present on the surface of the "master" can be replicated with extremely high fidelity (down to the nanometer scale) when low modulus silicone such as poly-dimethylsiloxane (PDMS) are used to fabricate the stamps. However, single layer stamps made out of this soft material can easily be deformed during the printing process. As a result, coarse placement accuracy is sometimes realized with these soft stamps. The present invention includes, however, use of composite stamps that provide excellent placement accuracy and pattern fidelity. U.S. Pat. No. 7,195,733, describes composite stamps designs and methods useful in the present invention and is hereby incorporated by reference in its entirety.

A low modulus material, such as PDMS, is used for the first layer to allow conformal (i.e. with no air void) contact with the top surface of the semiconductor device components. Additional thin layers (such as plastic films or glass fibers) having a high in-plane modulus is used to prevent in-plane mechanical deformations during the transfer. By using such composite stamp designs, in-plane distortions (as observed under a high magnification microscope) lower than 5 microns over a ~16×16 cm² area are achievable in soft lithography printing techniques.

In an embodiment, the printing systems comprise: (1) stamps with designs optimized for efficient transfer and for minimal distortions in the placement of the printed elements, (2) physical mounting jigs for these stamps and translation stages for moving the substrate and the stamp with submicron precision, (3) load cells interfaced to the stamps for force feedback control of contact during the 'inking' and 'printing' steps, and (4) vision systems that allow multilevel registration. In some embodiments, printing systems useful in the present invention can handle target device substrates with sizes up to 300×400 mm and donor wafers with diameters up to 4 inches. The registration is accomplished with a long working distance microscope and CCD camera that allows alignment marks on the surfaces of transparent stamps to be registered to alignment marks on the donor wafers and the target substrates. The accuracy with which the stamps can be positioned and aligned is ~0.5 µm. The registration accuracy, when implemented with new types of distortion-free composite stamps, is also in this range.

In other embodiments, processes described herein use a lower grade Si, thereby further increasing the availability of Si feedstock and further lowering manufacturing costs, such as using wafers made of solar grade Si.

EXAMPLE 2

Arrays of Monocrystalline Silicon Solar Microcells for Modules With Ultra-thin, Mechanically Flexible, Semi-transparent and Micro-optic Concentrator Designs Silicon, in amorphous or various crystalline forms, is used in >90% of all installed photovoltaic (PV) capacity. The high natural abundance of silicon, together with the excellent reliability and good efficiency of solar cells made with it suggest its continued use, on massive scales, for the foreseeable future. As a result, although there is significant promise for organics, nanocrystals, nanowires and other new materials for photovoltaics, many opportunities continue to exist for research into unconventional means for exploiting silicon in advanced PV systems. This example describes modules that use large scale arrays of silicon solar micro-cells (µ-cells) created from bulk wafers and integrated in diverse spatial layouts on foreign substrates by transfer printing. The resulting devices can offer useful features, including high degrees of mechanical flexibility, user-definable levels of transparency and ultra-thin form factor micro-optic concentrator designs. Detailed studies of the processes for creating and manipulating such µ-cells, together with theoretical and experimental investigations of the electrical, mechanical and optical characteristics of several types of modules that incorporate them illuminate the key aspects. The results represent strategies for expanding applications for monocrystalline silicon PV.

Research in silicon photovoltaics represents a robust and diverse effort with foci that seek to improve performance, cost and capabilities of these systems, ranging from structures for light trapping[1-3] to advanced doping techniques[4-7], to innovative spherical[8-10], rectangular[11-13] and ultra-thin[14-16] cell designs, to advanced manufacturing techniques[17,18]. The results presented here contribute to this progress by introducing practical means to create and manipulate monocrystalline Si solar cells that are much thinner (down to ~100 nm) and smaller (down to a few microns) than those possible with other process technologies[19-21]. The small sizes of the cells and the room temperature schemes for integrating them into modules enable the use of thin, lightweight flexible substrates for ease of transport and installation. The ability to define the spacings between cells in sparse provides a route to modules with engineered levels of transparency, thereby creating opportunities for use in windows and other locations that benefit from this feature. Alternatively, such layouts of cells can be combined with molded micro-optic concentrators to increase the power output and provide an unusual appearance with some aesthetic appeal. Such design attributes, together with the thin geometries of the µ-cells, are also advantageous because they can balance, in an optimal way, optical absorption and carrier separation/collection efficiency with materials usage and purity requirements to reduce system cost. The following describes these aspects, beginning with the materials and integration strategies, and following with characteristics of the µ-cells and various different modules that incorporate them.

Figure 5:
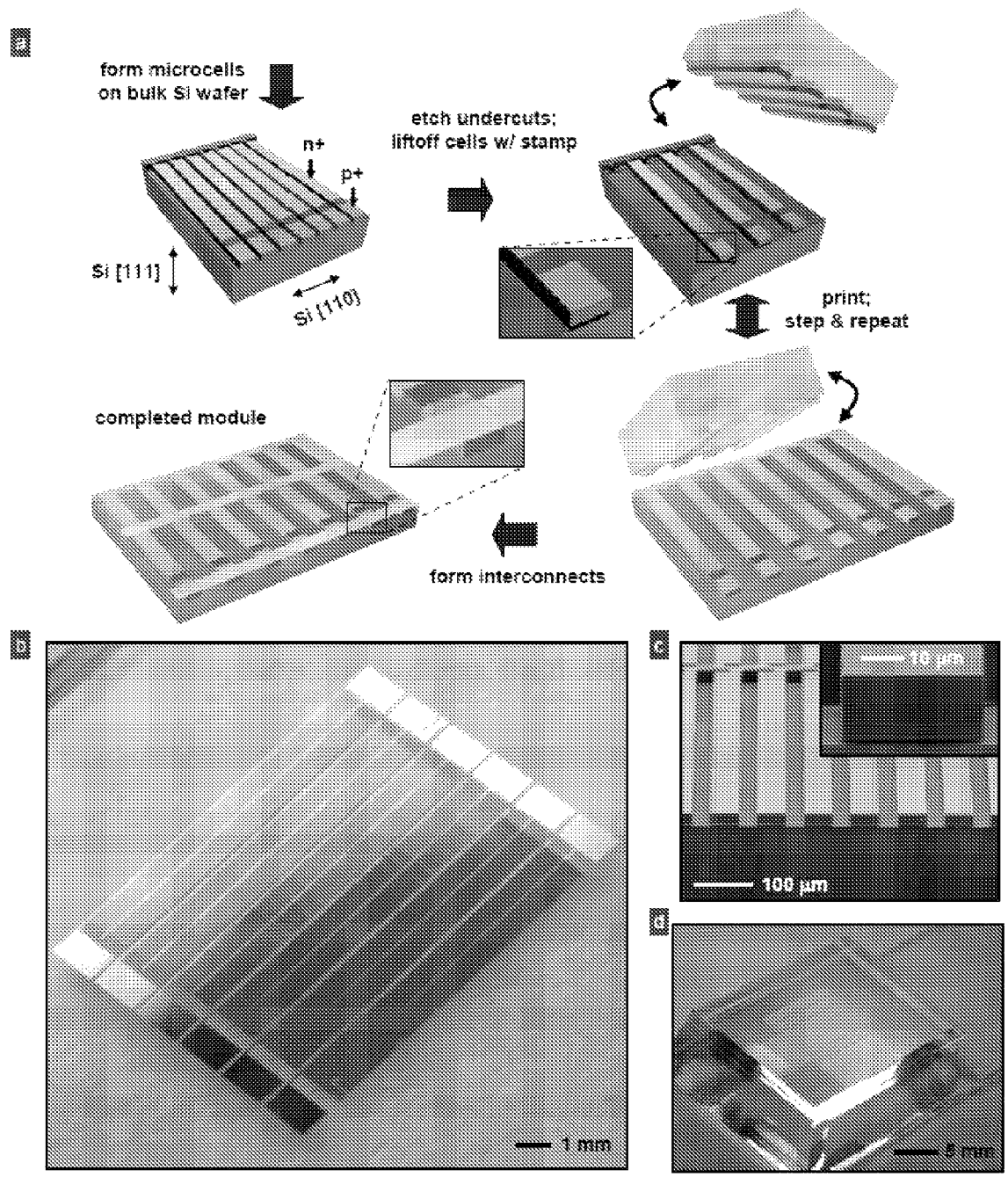
FIG. 5. Schematic illustrations, scanning electron microscopy (SEM) image, and optical images of steps in the fabrication of monocrystalline silicon photovoltaic modules that incorporate arrays of microscale solar cells (μ-cells). a, Schematic illustration of steps for fabricating ultra-thin μ-cells from a bulk wafer, printing them onto a target substrate and forming electrical interconnections to complete a module. b, Optical image of a completed module consisting of printed μ-cell arrays, interconnected by metal grid lines (width: ~80 μm, thicknesses: ~0.6 μm) that each connects 130μ-cells. c, SEM image of an array of μ-cells on a source wafer, ready for printing, after doping and KOH undercut. The inset shows a magnified cross-sectional SEM image of a typical μ-cell, with thickness of ~20 μm. d, Optical image of an array of μ-cells on a flat elastomeric PDMS stamp, immediately after retrieval from a source wafer.

FIG. 5a schematically illustrates the steps for fabricating ultra-thin, monocrystalline silicon solar µ-cells along with methods for integrating them into interconnected modules (FIG. 5b). The process, which builds on work in single crystalline silicon for flexible electronics[22-24], begins with delineation of the lateral dimensions of micro-bar (p-bar) structures on a Si (111) p-type, boron doped, single crystal CZ wafer with a resistivity of 10-20 Ω·cm, which we refer to as the source wafer, by etching through a patterned mask. Aligning the lengths of these structures perpendicular to the Si <1 1 0> direction of the wafer places their long axes along the preferential {110} etching plane for anisotropic, undercut etching with KOH. Regions of narrowed widths at the ends of the µ-bars serve as anchors to retain their lithographically defined positions throughout the processing. Maintaining sharp angled corners at the positions of these anchors leads to stress focusing for controlled fracture[25] in the printing step, as described below. After etching, selective area diffusion of boron (p+) and phosphorous (n+) from solid doping sources through patterned diffusion barriers of $SiO_2$ creates rectifying pn-junctions and top contacts. Deposition of etch masks ($SiO_2/Si_3N_4$, Cr/Au) on the top surfaces and sidewalls of the µ-bars followed by KOH etching releases them from the source wafer everywhere except at the positions of the anchors. Boron doping at the exposed bottom surfaces of the µ-bars, again using a solid doping source, creates a back surface field (BSF) to yield fully functional Si solar µ-cells. FIG. 5c provides a scanning electron micrograph of a representative array of µ-cells on a source wafer where the bars have lengths (L), widths (W) and thicknesses (t) of 1.55 mm, 50 µm, and 15 µm, respectively.

Figure 10:
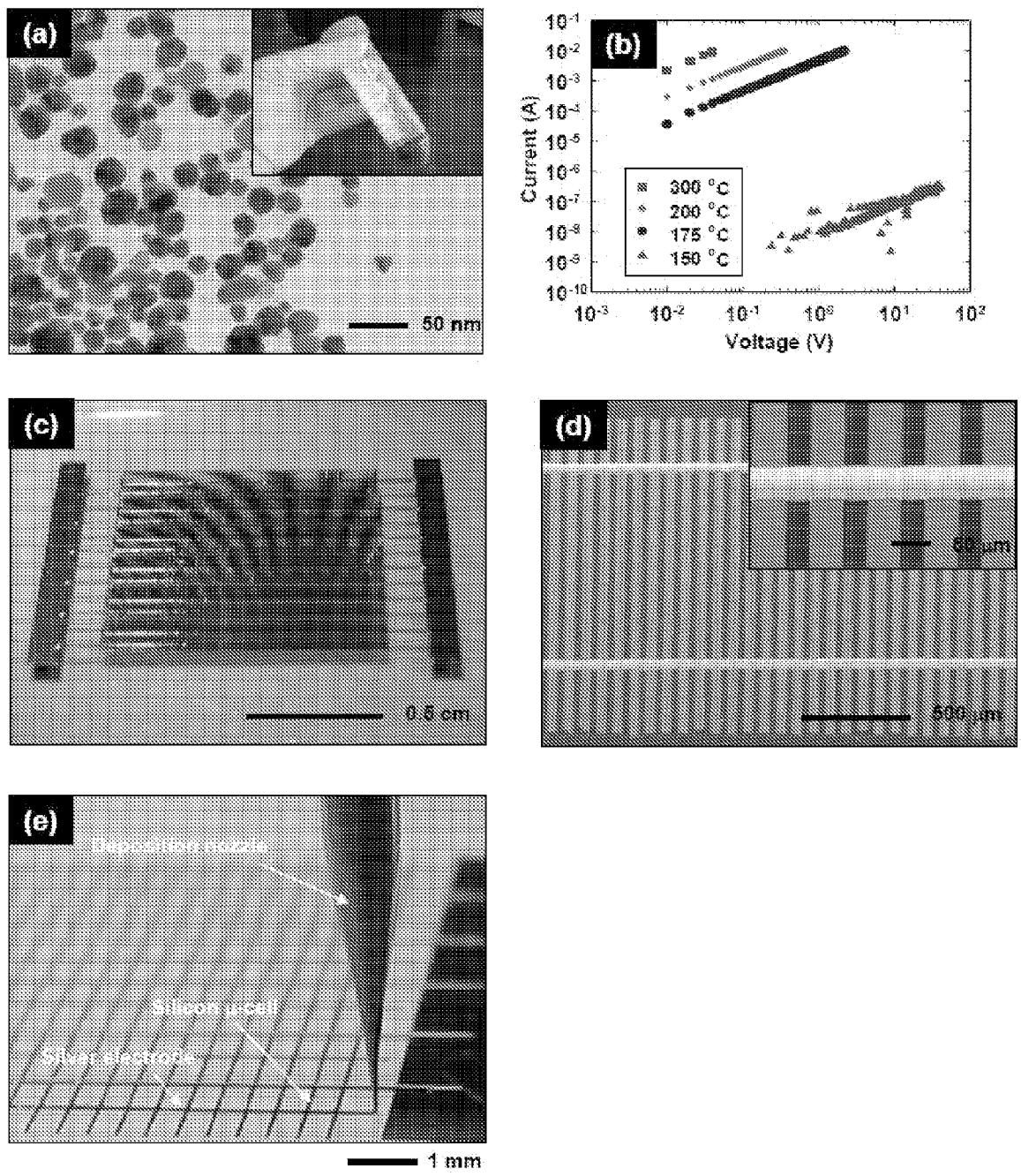
FIG. 10: (a) TEM micrograph of silver nanoparticles, withdrawn from an ink designed for direct writing of silver electrodes on silicon μ-cells. Inset: Optical image of the concentrated silver ink (silver content=65 wt %). (b) IV characteristics of silver electrodes (L=1100 μm, width=15 μm, height=7 μm) printed by direct ink writing and cured for 3 h at constant temperature in air. The measured resistivities of the electrodes are: 1100 Ω·cm at 150° C., 1.76×10$^{-3}$ Ω·cm at 175° C., 2.2×10$^{-4}$ Ω·cm at 200° C., and 2.1×10$^{-5}$ Ω·cm at 250° C. (c) Optical image of silicon μ-cell arrays interconnected with silver electrodes printed by direct writing of the silver nanoparticle ink. (d) SEM micrograph of silicon μ-cells interconnected with silver electrodes. Inset: High magnification SEM image of the electrode (width: ~50 μm, height: ~20 μm). (e) Optical image captured during direct ink writing of silver electrodes on a sparse array of silicon μ-cells.
Figure 11:
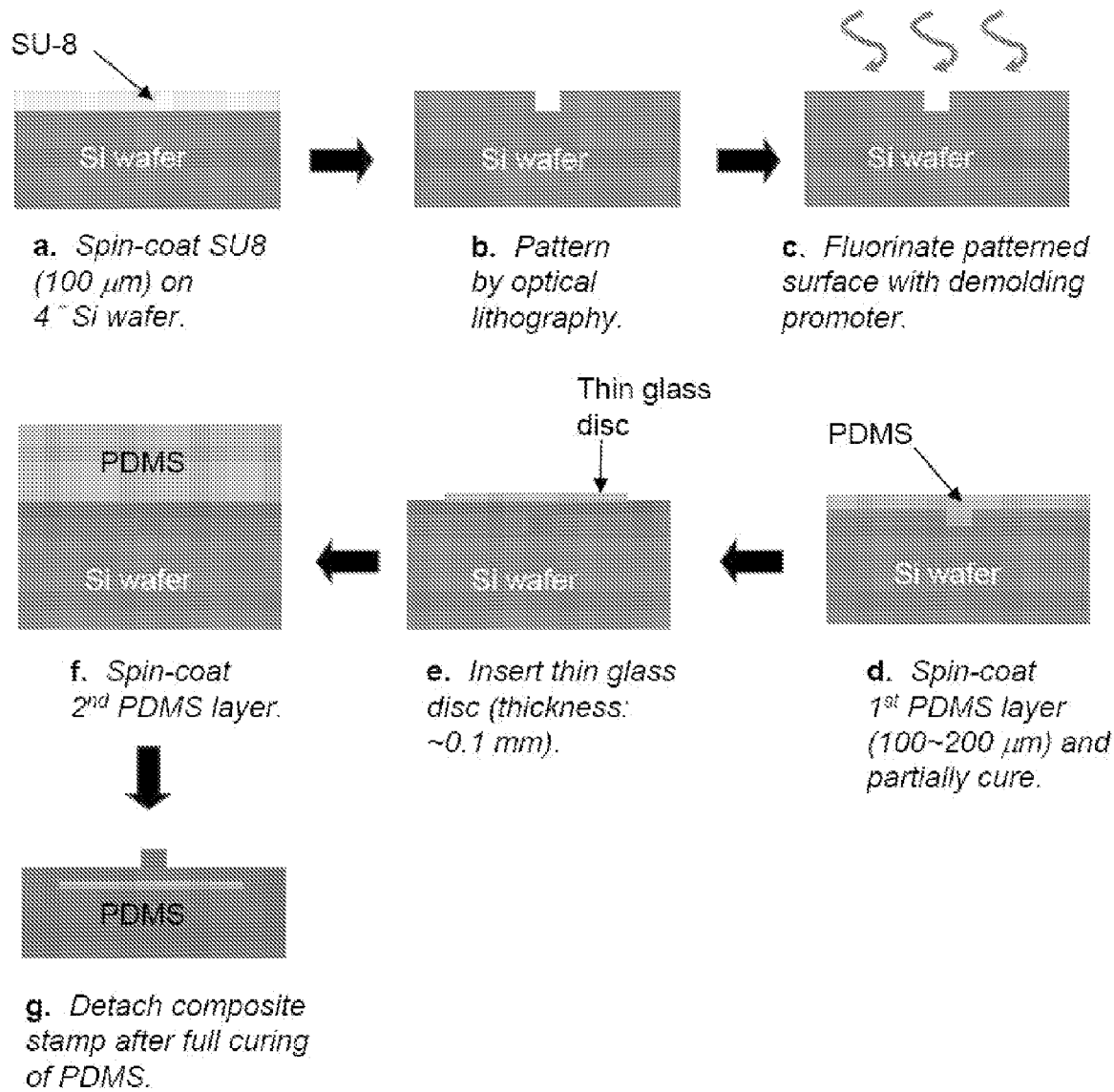
FIG. 11: Schematic illustration of fabrication steps for a composite stamp having relief features, which is implemented for retrieving and printing selected sets of μ-cells in automated printing process.
Figure 12:
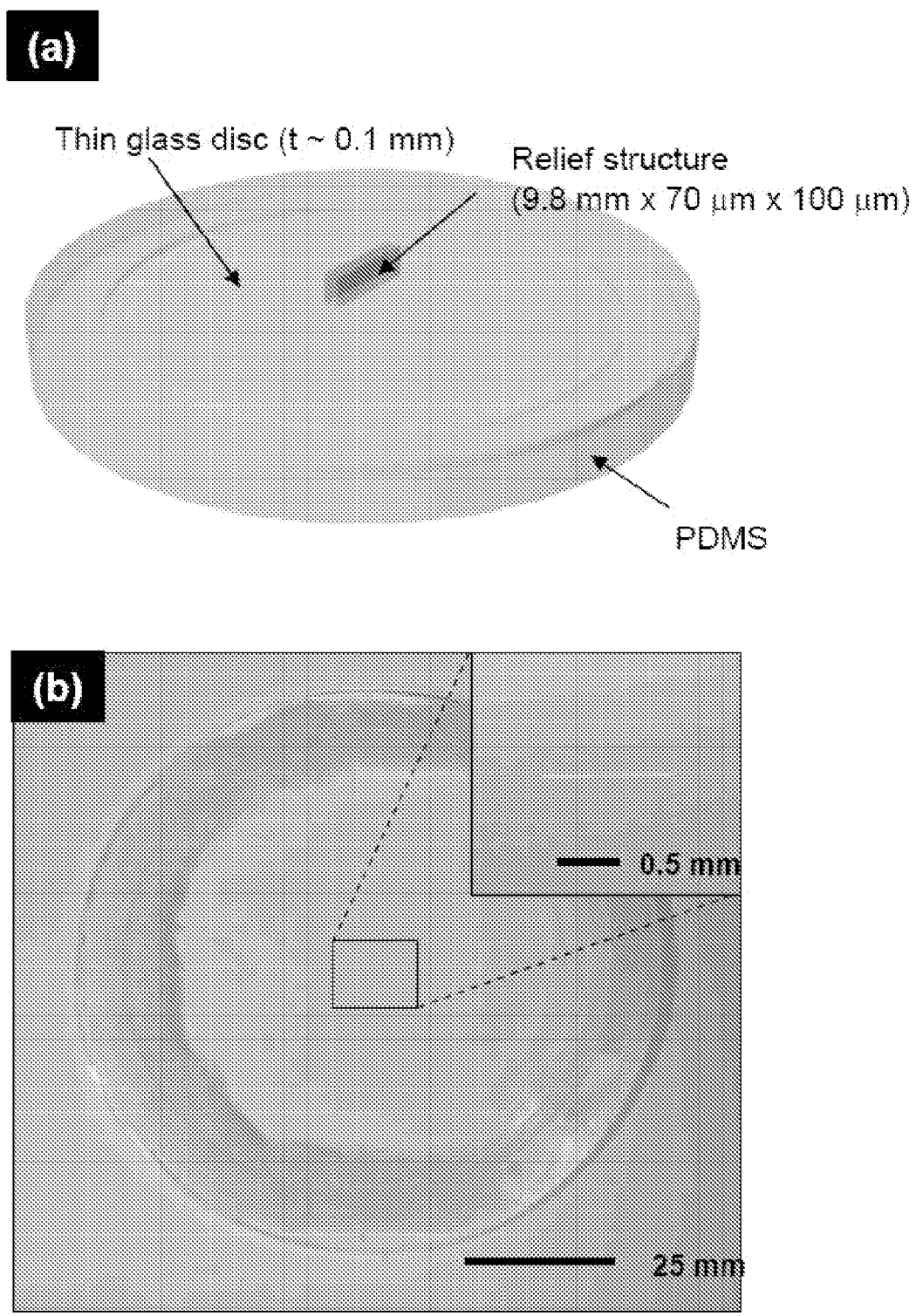
FIG. 12: (a) Schematic illustration and (b) optical image of a completed composite stamp, which is designed to pick up and print 6 μ-cells simultaneously using an automated printing machine.

These µ-cells can be selectively retrieved, by controlled fracture at the anchors, with a soft, elastomeric stamp (FIG. 5d) and then printed onto a substrate, in a room temperature process with overall yields of ~99.9%[26]. Defining electrodes by an etchback process after metal evaporation (FIG. 5b), evaporation of metal through shadow mask or by direct ink writing (see FIG. 10), interconnects the µ-cells and completes the fabrication process. FIG. 5b shows a module that incorporates 130µ-cells on a glass substrate, where a photo-cured polymer (NOA61, Norland Products Inc.) serves as a planarizing layer and as an adhesive for the printing process. This device was fabricated with a flat stamp to create a system having μ-cells in arrangements that match those on the source wafer. Stamps with appropriately designed relief features (see FIGS. 11-12) can, however, retrieve selected sets of μ-cells and print them in layouts (e.g. spacings between adjacent μ-cells) that are different than those on the source wafer[27]. For example, the μ-cells can be printed in sparse arrays, using a step-and-repeat process that enables overall module sizes that are much larger than that of the source wafer. These layouts enable semi-transparent and micro-optic concentrator module designs, as described below. The source wafer can be reprocessed (following a surface re-polishing step using KOH etching, as described herein) after all of the μ-cells are retrieved, to yield new generations of cells for additional rounds of printing. This process can be repeated until the entire wafer is consumed.

FIG. 6a schematically illustrates the layout of a representative μ-cell design, highlighting the details of the doping profiles. An individual cell (L=1.55 mm) consists of phosphorous-doped (Ln+=1.4 mm), boron-doped (Lp+=0.1 mm) and un-doped (Lp=0.05 mm) regions, respectively. The thicknesses, t, can be selected by suitable processing to lie between tens of microns and hundreds of nanometers. The boron-doped region on the top of the cell connects to the BSF on the bottom through doping on the sidewalls, in manner that allows access to both emitter (n+) and base (p+) contacts on the top surface. This configuration greatly simplifies the process of electrical interconnection to form modules, by providing both contacts on the same side of the device. Surface doping concentrations of n+ (phosphorous), p+ (boron), and BSF (boron) regions are $\sim 1.2 \times 10^{20}$ cm$^{-3}$, $\sim 1.8 \times 10^{20}$ cm$^{-3}$ and $\sim 5.8 \times 10^{19}$ cm$^{-3}$, respectively, as measured by secondary ion mass spectrometry (SIMS)[28]. To fabricate interconnects with high yields, we identify two convenient means for planarizing the relief associated with the μ-cells and for ensuring electrical isolation of the emitter and the base. The first uses a photocurable polymer as both an adhesive and planarization medium, as described in the context of FIG. 5 (see also FIG. 13), such that a single step accomplishes both printing and planarization. Here, arrays of μ-cells on the stamp press down into a liquid, photocurable polymer (NOA) coated on the receiving substrate. The polymer fills the empty space between the μ-cells by capillary action. Curing by ultraviolet (UV) exposure through the transparent stamp and then removing the stamp completes the process. The flat surface of the stamp coincides precisely with the top surfaces of the μ-cells, to define the planarized surface of the module. Another approach (see FIG. 14), which is better suited to a step-and-repeat process, involves printing μ-cells to a substrate that is coated with a layer (~10 μm thick) of cured poly(dimethylsiloxane) (PDMS; Dow Corning) as a soft, elastomeric adhesive. Covering the printed μ-cells with thin layers of SiO$_2$ (~150 nm thick) and NOA (~30 μm thick), pressing a flat piece of PDMS on top of the structure and then UV curing through the stamp accomplishes planarization with a tolerance (less than 1 μm) similar to that achieved in the first approach. In this second method, a short oxygen RIE step is often needed to remove the thin, residual layer of NOA that tends to coat partially the top surfaces of the μ-cells. In both approaches, the shallow junction depth (~0.3 μm) creates challenging demands on the extent of planarization. Extending the phosphorous doping down the sidewalls, to a distance of ~⅓ of the μ-cell thickness, as illustrated in FIG. 6a, relaxes the requirements on planarization. Direct ink writing and other approaches that form conformal electrodes provide further benefits in this sense.

Current (I)-voltage (V) measurements of individual μ-cells and completed modules were performed in the dark and in a simulated Air Mass 1.5 (AM 1.5) illumination condition of 1000 W/m$^2$ at room temperature. FIG. 6b shows a representative dark IV curve recorded from an individual μ-cell under forward bias, indicating a diode ideality factor (m) of ~1.85 at room temperature. FIG. 6c shows IV curves from typical μ-cells with and without a backside reflector (BSR) under AM 1.5 illumination, evaluated without metal contacts or anti-reflection coatings (ARCs). Without a BSR, this μ-cell, which has t ~15 μm, exhibits a short circuit current density, $J_{sc}$, of 23.6 mA/cm$^2$, an open circuit voltage, $V_{oc}$, of 503 mV, a fill factor, FF, of 0.61, and an overall solar energy conversion efficiency (η) of 7.2%, where the calculations relied on the spatial dimensions of the μ-cells rather than the surface area of the p-n junction. We also do not explicitly account for contributions from light incident on the edges of the cells. The device-to-device variations in properties of the μ-cells of 15-20 μm thickness without BSR is typically in the range of 6-8% (10-13% with BSR) for the efficiency and 450~510 mV for $V_{oc}$. Another relevant parameter is the current density at max power ($I_{mp}$) rather than voltage or efficiency for cells wired in series because all cells must pass the same current under operation. Accordingly, we can specify to specify the variation in $J_{sc}$ (as a measure of $J_{mp}$) instead of specifying the variation in $V_{oc}$. In this ultra-thin regime, the absorption length of monocrystalline Si for near-IR and visible wavelengths is greater than or comparable to t[29,30]. As a result, the efficiency can be improved significantly by adding structures for light-trapping and/or a BSR. The top curve in FIG. 6c shows the effects of a diffuse white BSR, where $J_{sc}$ and q increase to 33.6 mA/cm$^2$ (~42% increase) and 11.6% (~61% increase), respectively. The $J_{sc}$ value without BSR in FIG. 6c is close to the theoretical maximum of ~26 mA/cm$^2$ that would be expected based on the solar spectrum and absorption coefficient of Si, suggesting that the surface and contact recombination in the device was modest under short circuit conditions. With the BSR the gain in $J_{sc}$ to 33.6 mA/cm$^2$ is consistent with a 56 μm equivalent thickness (based on the required thickness for sufficient absorption of light)[29]. The much higher optical path length shows that the BSR is working well.

Figure 6:
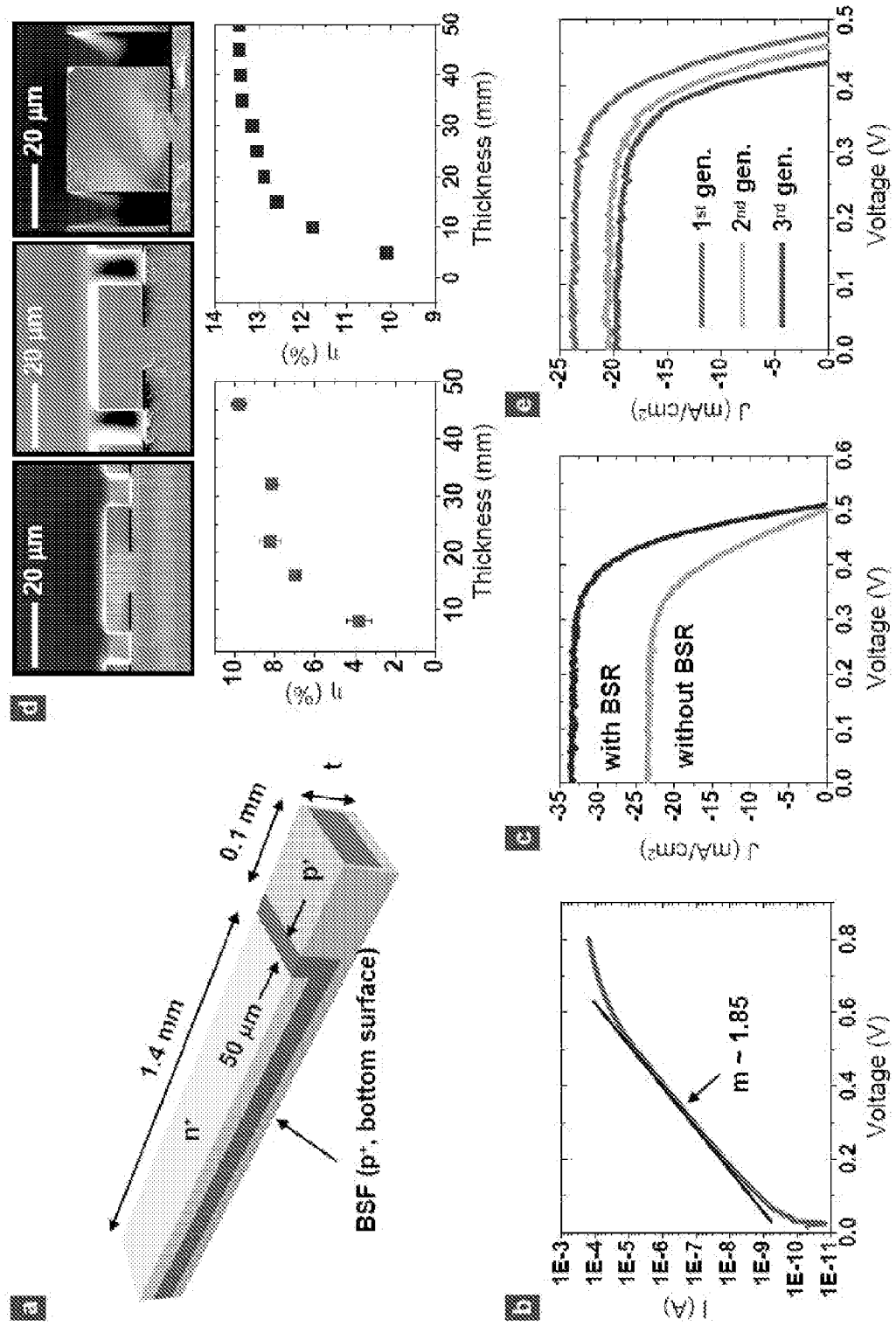
FIG. 6. Doping layout and performance characteristics of individual μ-cells. a, Schematic illustration of a μ-cell, showing the dimensions and the doping profiles. b, Semi-log plot of the forward bias dark current (I)-voltage (V) characteristics of an individual μ-cell. The linear fit corresponds to a diode ideality factor (m) of ~1.85. c, Representative current density (J) and voltage (V) data from an individual μ-cell under AM 1.5 illumination of 1000 W/m$^2$, with and without a white diffuse back-side reflector (BSR). d, SEM images, experimental data (with a metallic BSR) and modeling results corresponding to studies of the scaling properties with thicknesses between ~8 and ~45×μm. e, Light JV curves of individual μ-cells corresponding to the 1st, 2nd and 3$^{rd}$ generation from a single source wafer.
Figure 15:
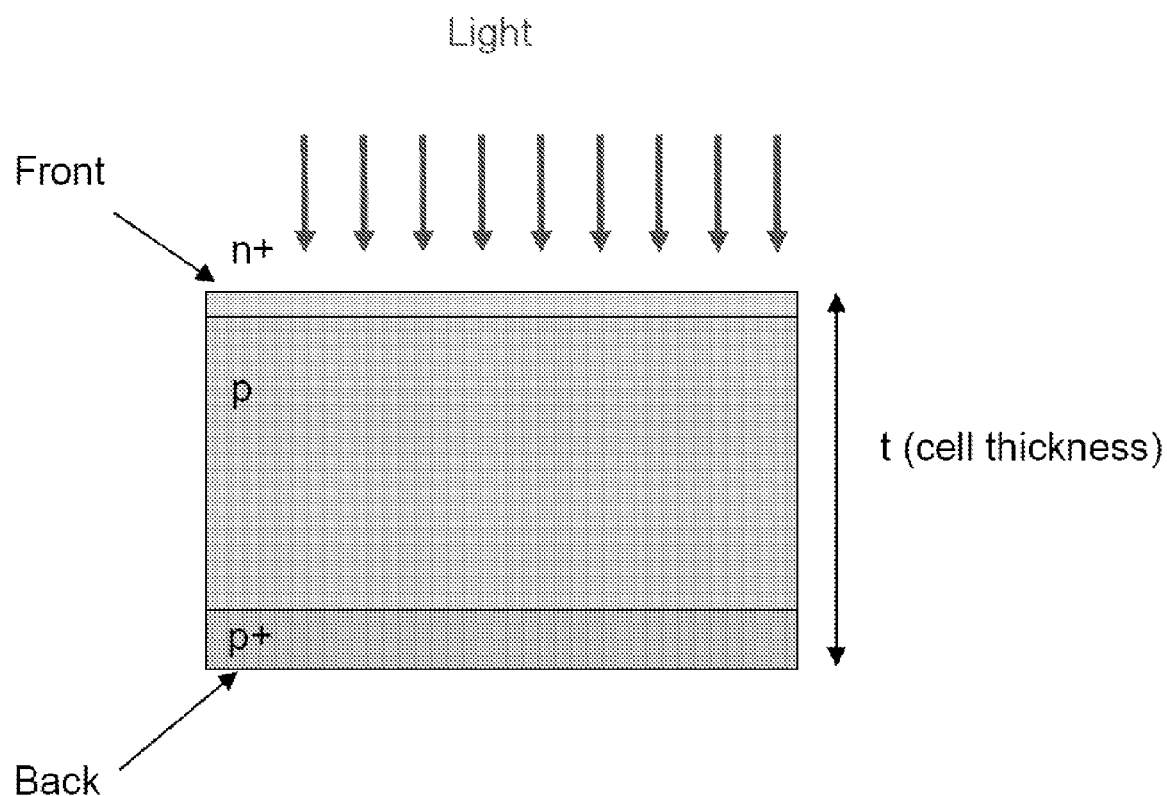
FIG. 15: Schematic illustration of silicon solar cell layout having n+–p–p+ configuration, which is employed for calculating thickness dependence of cell efficiency using PC-1 D®.

To further examine the dependence of performance on thickness, we tested μ-cells with t between ~8 and ~45 μm and compared the measurements to numerical simulation of conventional cells using PC-1 D® software[31], in vertical type (n+-p-p+) configurations (see FIG. 15 and Table 1). FIG. 6d shows the results, which indicate sharp increases in efficiency with thickness up to ~15 μm, followed by a gradual saturation from 20-30 μm to a plateau above ~40 μm. Increases in efficiency with t are due mainly to increased absorption associated with the longer optical path lengths. For t above ~40 μm, however, the total absorption does not increase significantly, though the bulk recombination of minority carriers does. Although there are some quantitative differences between measurement and theory due to non-ideal features of the μ-cells (e.g. edge surface recombination due to un-passivated surfaces), the qualitative trends are consistent. These observations highlight the value of ultra-thin (i.e. less than 40 μm) cell designs, both in optimizing materials usage and in minimizing sensitivity to impurities that can lead to trapping of carriers. As described previously, multiple generations of such ultra-thin cells can be created from a single wafer. FIG. 6e shows results from first, second and third generation devices produced from a single source wafer in conventional vertical type (n$^+$–p–p$^+$) cell configurations. Only moderate changes, comparable to typical cell-to-cell variations in properties, are observed. Improved doping profiles, ohmic contacts, ARCs, surface texturization, light trapping structures, surface passivation layers and other advanced designs for monocrystalline Si cells can all be implemented within the schemes described here; each has the potential to provide improvements over the performance indicated in FIG. 6.

Figure 7:
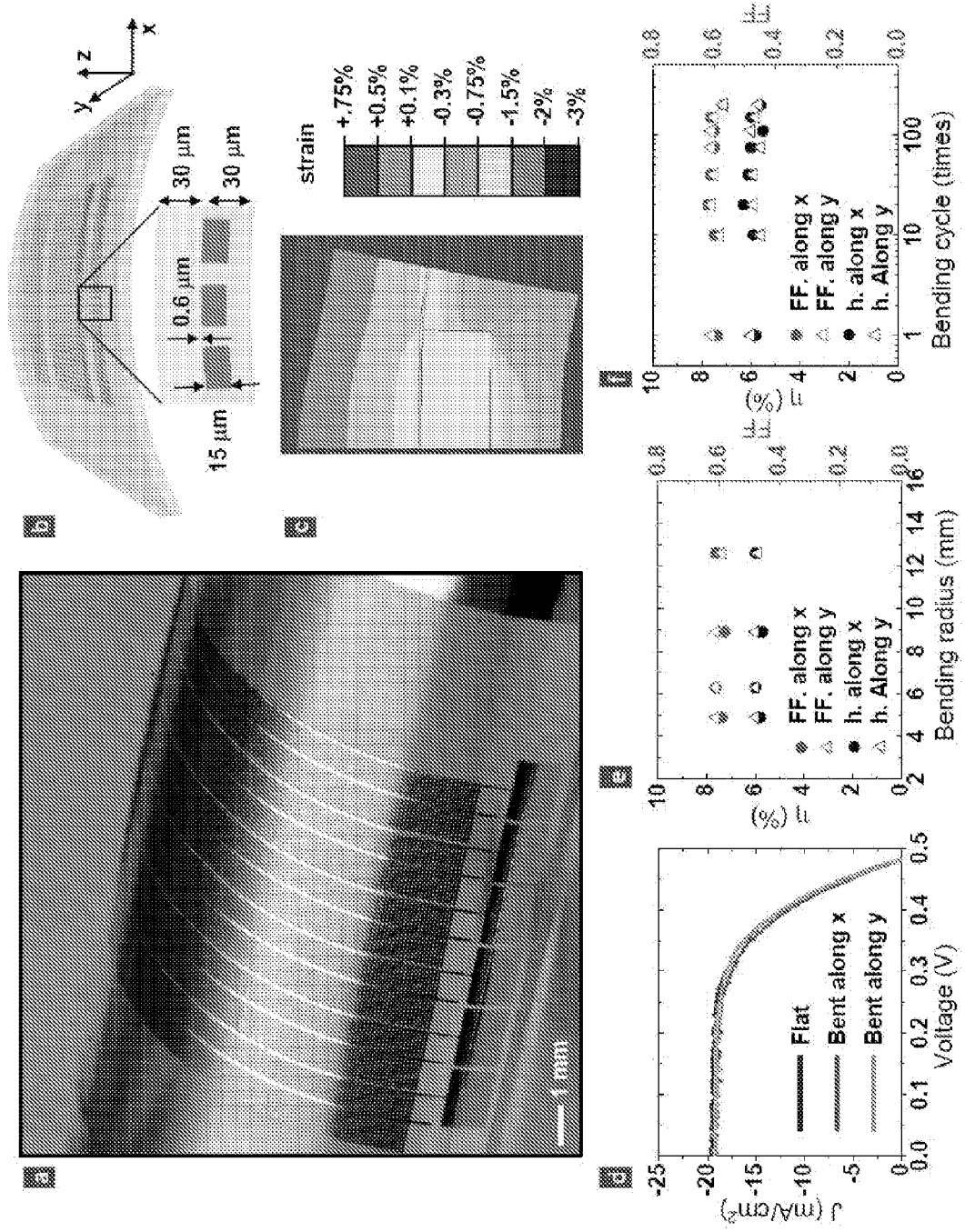
FIG. 7. Optical image, schematic illustration, mechanics modeling and photovoltaic performance of mechanically flexible modules that incorporate arrays of interconnected μ-cells. a, Optical image of a module bent along a direction parallel to the widths of the μ-cells, to a bending radius (R) of 4.9 mm. b, Schematic illustration of an optimized design in which the neutral mechanical plane is positioned near the centers of the μ-cells (grey) through judicious choices of thickness for the polymer (blue) substrate and overcoat. c, Color contour plot of calculated bending strains ($\in_{xx}$) through the cross-section of a mechanically flexible μ-cell module, bent along the cell width direction at R=4.9 mm. The calculations use symmetry boundary conditions, for evaluation of a single unit cell of the system. The black lines delineate the boundaries of the μ-cell and metal interconnect line (top). d, JV data from a module under AM 1.5 illumination in a flat configuration and bent along the cell width (x) and length (y) directions, both for R=4.9 mm. e, Plot of the efficiency (η) and fill factor (FF) under AM 1.5 illumination for R=12.6 mm, 8.9 mm, 6.3 mm, and 4.9 mm. f, Plot of efficiency and fill factor as a function of bending cycles up to 200 times at R=4.9 mm.
Figure 19:
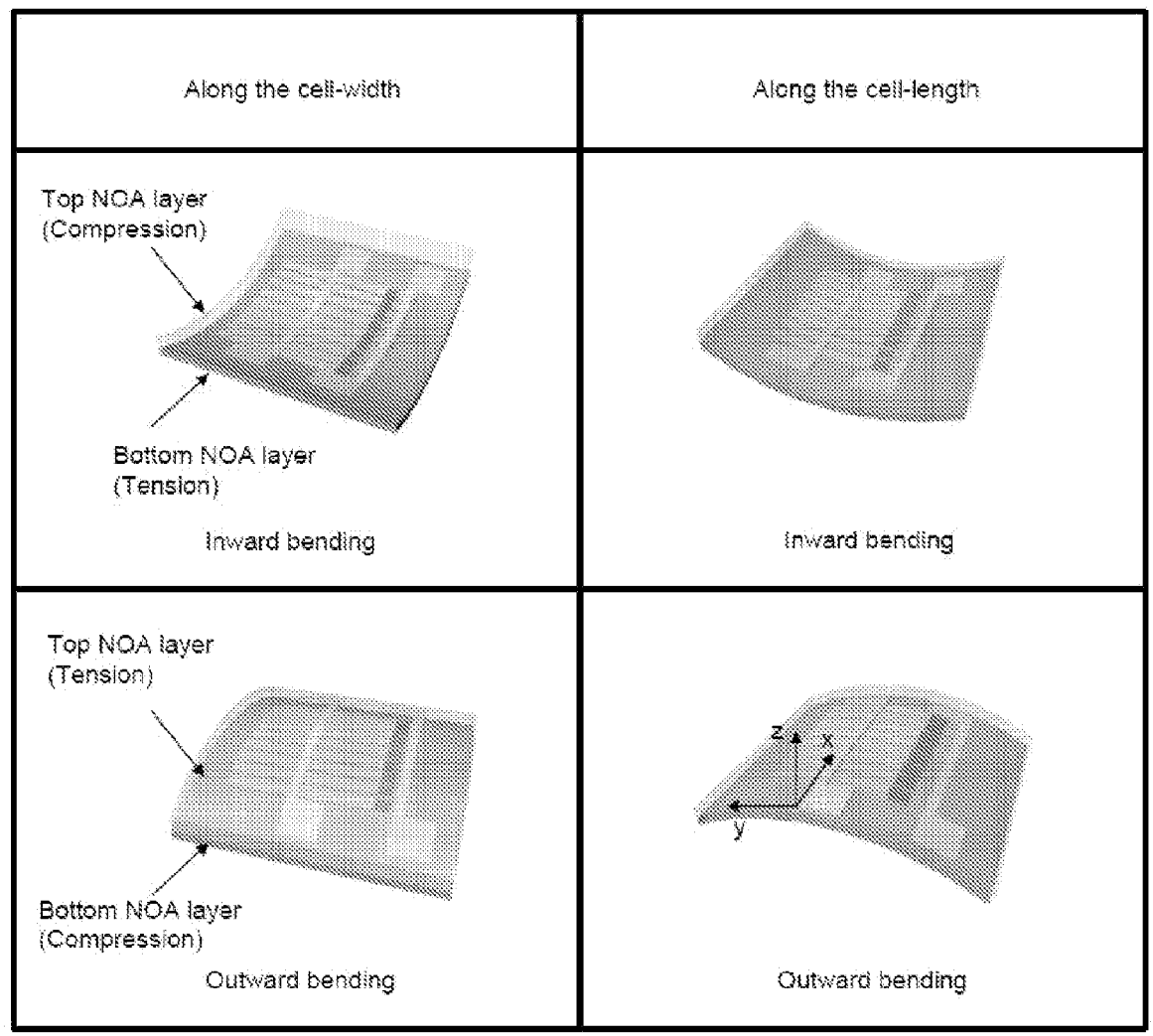
FIG. 19: Schematic illustration of bending geometries used for electrical characterization of mechanically flexible μ-cell module.
Figure 20:
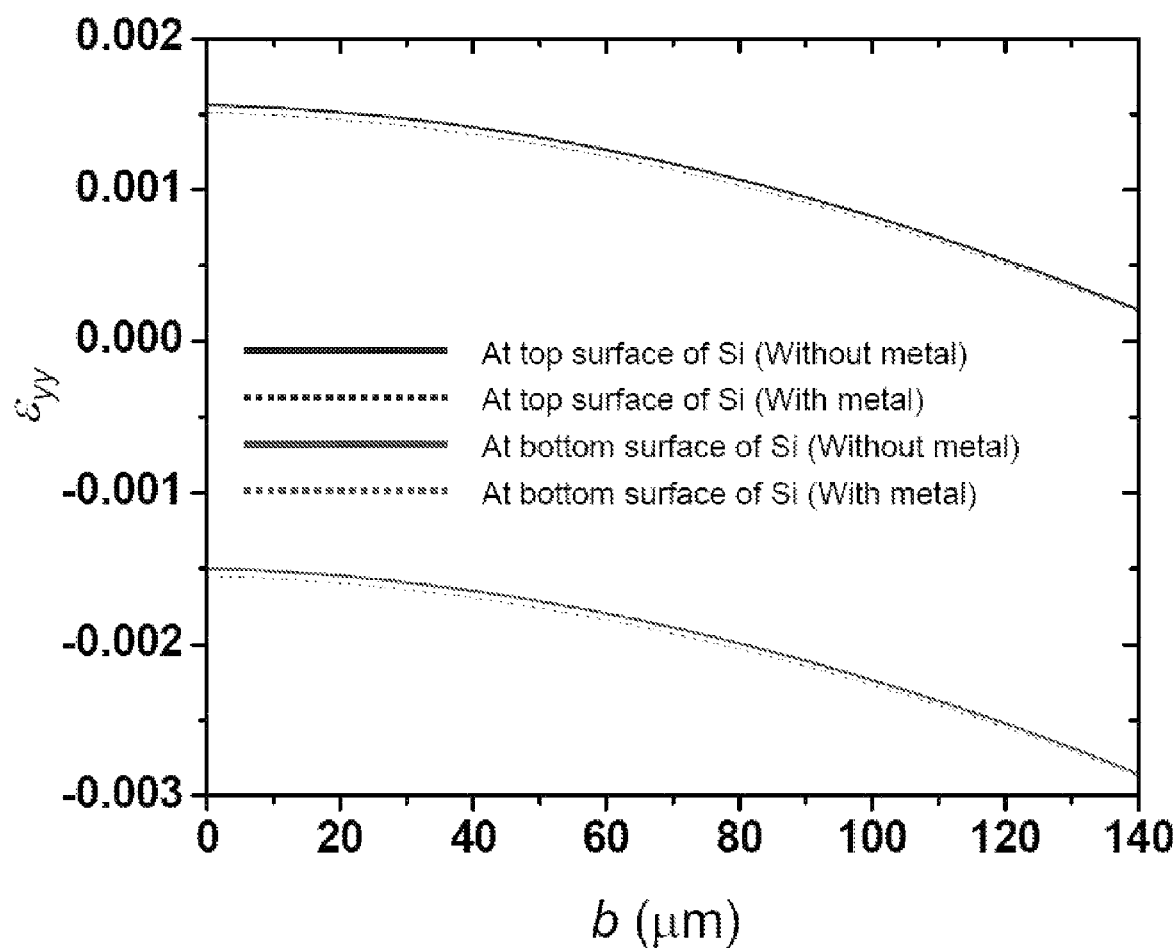
FIG. 20: Analytically calculated bending strain ($\in_{yy}$) at the top (blue line) and bottom (red line) surface of silicon μ-cell bent along the cell length direction as a function of the top polymer layer thickness (b) in two different cases of with (dashed line) and without (continuous line) metal layer, where $E_{si}$=150 GPa, $E_{NOA}$=1 GPa, $E_{au}$=78 GPa, a=30 μm, t=15 μm, $t_m$=0.6 μm, $W_{Si}$=50 μm, $W_{NOA}$=26 μm, R=4.9 mm.

The μ-cell designs and printing techniques enable new opportunities at the module level, with performance consistent with that of the individual cells. For example, the sequence in FIG. 5 separates high temperature processing steps from the module substrate. As a result, integration of μ-cells on rollable, plastic sheets, for ease of transport and installation, is possible. High levels of bendability can be achieved by exploiting optimized mechanical designs. The example shown in FIGS. 7a and 7b involves a composite structure comprised of a planarizing/adhesive layer (NOA 61; thickness ~30 μm) which also serves as the substrate, arrays of μ-cells and metal interconnects, and a polymer encapsulation layer (NOA 61; thickness ~30 μm). Spin-coating and then curing this encapsulation layer represents the final step in the fabrication sequence (see FIG. 16). Analytical modeling indicates that this module design places the neutral mechanical plane near the center of the Si μ-cells, such that the maximum strains in the silicon and metal interconnects (see FIGS. 17-18), by far the most brittle materials in the system, are less than 0.3% even for bend radii less than 5 mm, for bending in any direction (i.e. inward or outward, along the lengths of the μ-cells or perpendicular to them) (see FIGS. 19-20). Finite element modeling, with representative results shown in FIG. 7c, confirms these predictions (see FIGS. 21-22). Module performance, evaluated in outward bending along and perpendicular to the cell length under AM 1.5 illumination, shows behavior consistent with expectation based on mechanics analysis. For example, at bending radii of 12.6 mm, 8.9 mm, 6.3 mm, and 4.9 mm, the module efficiency (~6.0%) and fill factor (~0.60), remain unchanged as summarized in FIGS. 7d and 7e. Fatigue tests, with bending up to 200 cycles, also show little change in performance, as summarized in FIG. 7f. The slightly reduced module efficiency and fill factor compared to the individual cell performance can be partially attributed to the shadowing effect and resistive losses arising from metal interconnects.

Figure 8:
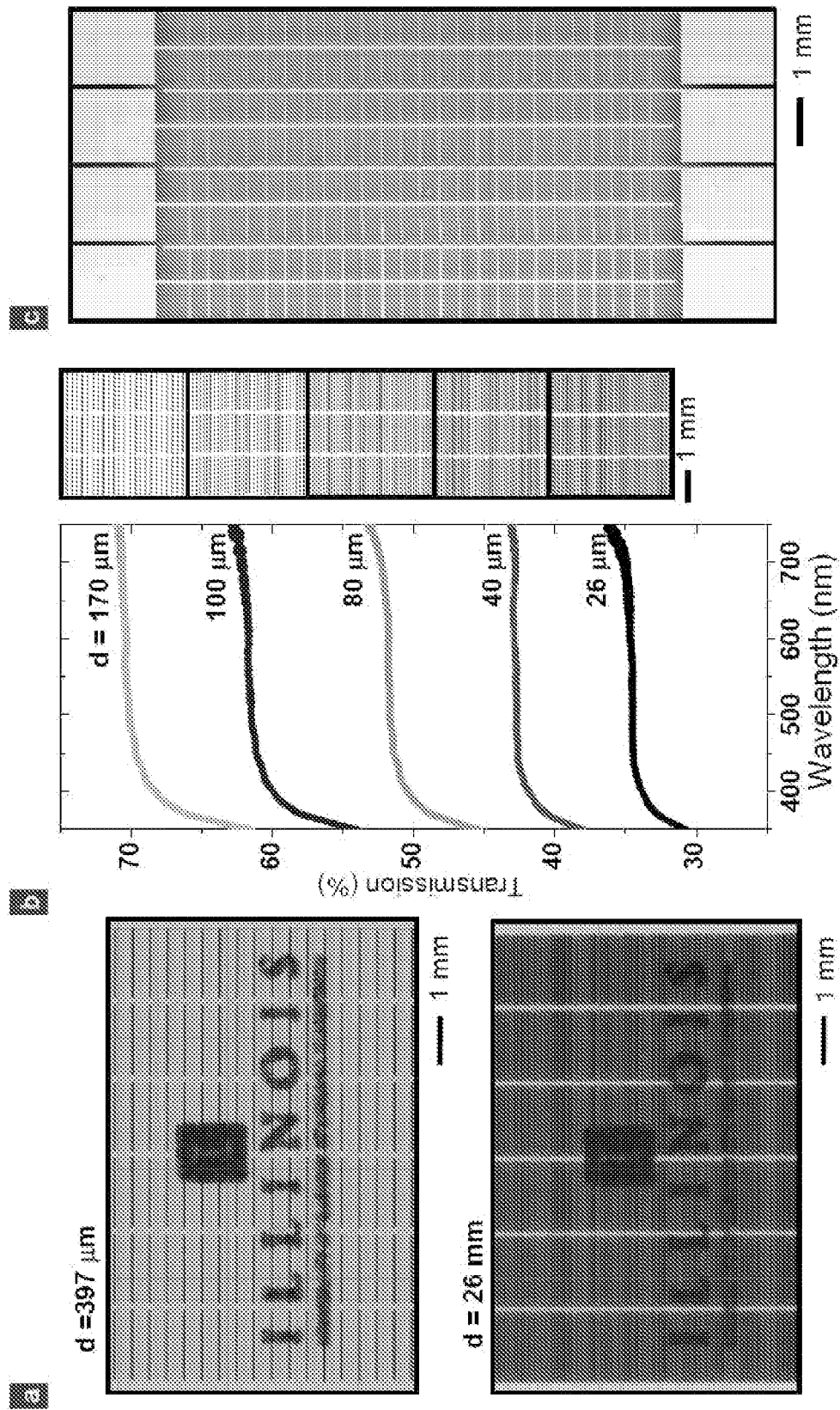
FIG. 8. Optical images and transmission spectra of printed, semi-transparent μ-cell arrays and interconnected modules. a, Optical images of printed μ-cell arrays on PDMS (~10 μm thickness) coated PET substrates (~50 μm thickness) at intercell spacings (d) of 26 μm and 397 μm, respectively, resting on a piece of paper with text and logos to illustrate the differences in transparency. b, Transmission spectra recorded at normal incidence through printed semitransparent μ-cell arrays with d=26 μm, 40 μm, 80 μm, 100 μm and 170 μm, respectively. Corresponding optical images of μ-cell arrays are also shown. c, Optical image of an interconnected semi-transparent module with d=397 μm.

Another feature of the module designs and fabrication processes introduced here is their ability to achieve definable levels of optical transparency, which can be valuable for applications in architectural or automotive glass and others. This outcome can be achieved either through the use of extremely thin μ-cells (e.g. FIG. 6d) or sparse arrays, defined by etching procedures or step-and-repeat printing, respectively. This latter approach is particularly easy to implement, and offers a significant degree of control over visually uniform levels of grayscale (i.e. individual μ-cells with dimensions reported here are not readily visible to the unaided eye). FIG. 8a shows printed text and logos viewed through arrays of μ-cells with high and low areal coverages, to demonstrate the effect. Automated printers (see FIG. 23) allow programmable selection of coverages and, therefore, levels of transparency, for any given arrangement of μ-cells on the source wafer. FIG. 8b shows normal incidence transmission spectra and optical micrographs for cases of cell spacings ranging from 170 μm to 26 μm (areal coverages from 20% to 60%), corresponding to levels of transparency from ~70% to ~35%, all generated from arrays of μ-cells on a single source substrate. The transmittance in each case is constant throughout the visible range, and increases approximately linearly with areal coverage, as expected. FIG. 8c provides an image of a completed module, with interconnects, consisting of μ-cells at a spacing of 397 μm.

Figure 9:
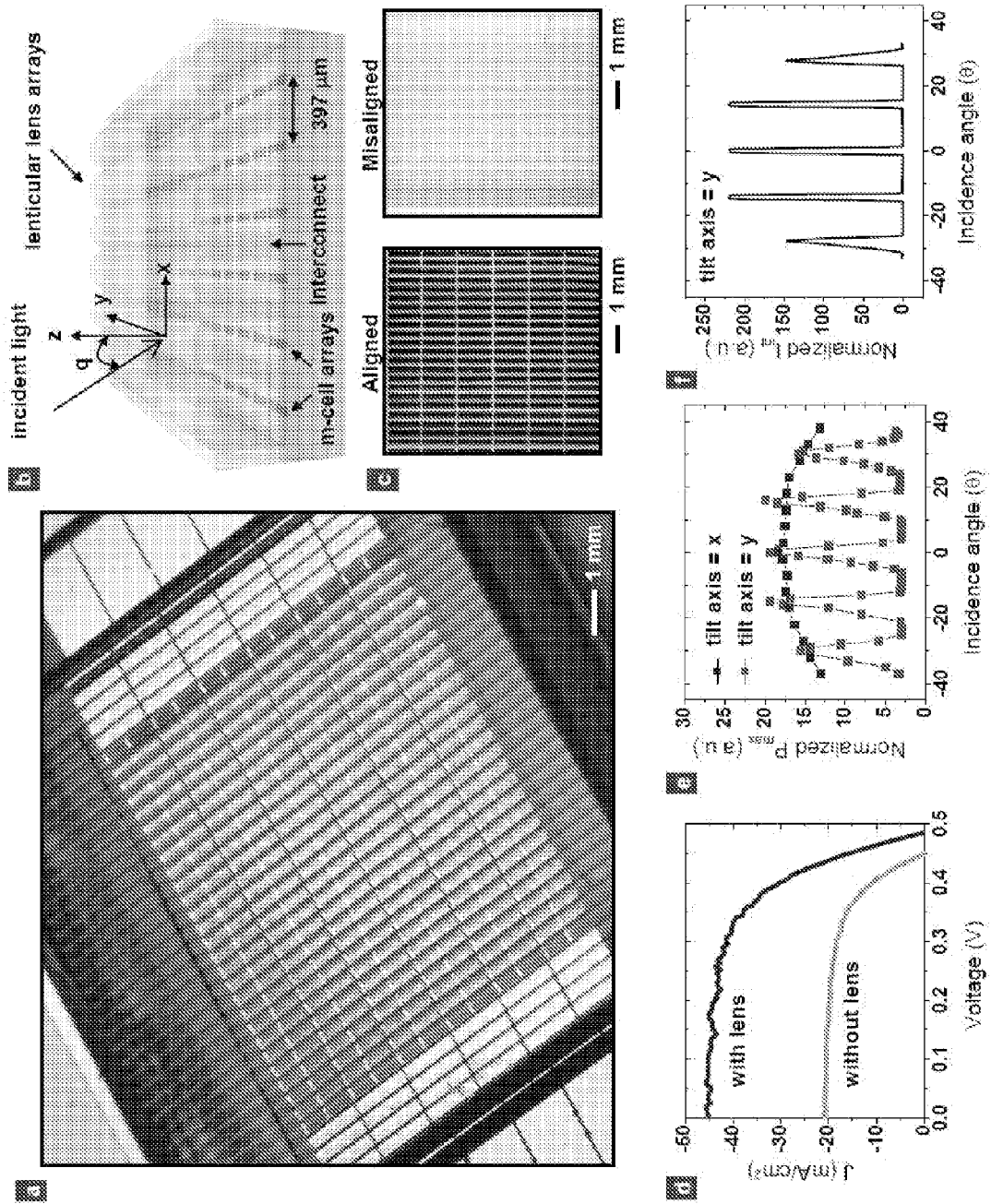
FIG. 9. Optical images, schematic illustration, and performance characteristics of micro-concentrator photovoltaic modules (μ-CPV). a, Optical image of a μ-CPV module that combines molded lenticular lens arrays and printed μ-cells, viewed at an angle that corresponds to alignment of the focal positions of the lenses with the locations of the μ-cells. b, Schematic illustration of this type of device. c, Optical images of lenticular lens arrays aligned (left) and misaligned (right) to arrays of printed μ-cells, in the layout of the schematic illustration above. d, JV curves of this μ-CPV module with and without the lenticular concentrator optics under AM 1.5 illumination. The lenses in these relatively low concentration ratio systems increase the current density and the maximum output power by ~2.5 times. e, Normalized output power ($P_{out}$) from a μ-CPV module as a function of tilt along the x and y axes. Zero degree corresponds to normal incidence. f, Normalized computed intensity ($I_{int}$) integrated over the top surface of the μ-cells as a function of incidence angle for tilting parallel to the cell length (with respect to the y axis).

For cells in such layouts, concentrator photovoltaic (CPV) designs that use integrated micro-optic focusing elements for ultra-thin form factor micro-CPV (μ-CPV) systems can improve the module's output power. Here, we demonstrate that possibility with molded arrays of cylindrical lenses, for possible implementation with a single axis tracker. These devices use arrays of μ-cells with spacings (~397 μm) that match the layouts of low cost, commercially available lenticular lens arrays (Edmund Optics), from which we could form replicas by soft lithographic molding of a composite silicone-based epoxy resin that was thermally matched to the PV module by filling with silica nanoparticles[32]. The radius of curvature of the commercial and replicated cylindrical micro-lenses was ~0.83 mm, corresponding to a focal length of ~2.2 mm. With collimiated light, the widths of the focused lines of light (full width at 90% maximum) were ~35 μm. We aligned the lens arrays to interconnected arrays of μ-cells using a thin PDMS film as a spacer, and a coupler on an XYZ and angle controlled stage. FIGS. 9a and 9b show an optical image and a schematic illustration of such a μ-CPV device. FIG. 9c presents images corresponding to the cases when the lens arrays are aligned and misaligned to the μ-cells. In the aligned state, the module appears to incorporate silicon at a nearly full areal coverage. When misaligned, the system assumes the color of the module substrate, and the silicon is invisible. The/V characteristics of a module with and without aligned lens arrays, under AM 1.5 illumination, appear in FIG. 9d. The maximum output power with the lenses is ~2.5 times larger than that without the lenses. This ratio is somewhat smaller than expectation based on simple estimates due partly to the relatively large size of the light source in the solar simulator (91192-1000W, Oriel) and its close proximity to the module. These features result in a degree of collimation that is both non-ideal and substantially less than that of sunlight. However, the small area and ultra-thin micro-designs presented here can in principle lead to consumption of less silicon material than conventional and related micro-spherical silicon concentrator modules[9]. Due to the cylindrical geometry of the lenses and the bar shapes of the μ-cells, decreases in output power associated with angular tilting about the y-axis are minimal, as illustrated in FIG. 9e. Rotations about the x-axis cause dramatic changes, consistent with the nature of the optics and the images shown in FIG. 9c. The periodicity observed in this case results from focusing of light on μ-cells from neighboring sets of lenses. The angular positions and relative values of the first, second, and third peaks match well with simulated data from numerical ray-tracing calculations (FIG. 9f).

The types of modules reported here create new possibilities for monocrystalline silicon photovoltaics, particularly in applications that benefit from thin, lightweight construction, mechanical flexibility, semi-transparency or the unusual optical properties of the μ-CPV designs. In most cases, we chose materials that are compatible with long lifetime and high reliability. The procedures themselves are compatible with substrates, encapsulation, adhesive and optical materials used in existing PV systems. Similarly, as noted previously, advanced monocrystalline silicon cell designs and enhancement techniques can also be incorporated for improved performance. Although the focus of the strategies presented here is on module capabilities and designs, rather than cost or performance, a notable feature of these approaches is that the ultra-thin cell geometries and, for μ-CPV and semi-transparent designs, their sparse coverages represent materials of efficient ways to use silicon. The former aspect also can relax requirements on the purity of the silicon. An obvious consequence of these aspects is the potential to reduce the silicon component of the module cost. Such reductions are balanced, however, by increased processing costs associated with creating and interconnecting the μ-cells. Low cost printing, doping and etching techniques suitable for high performance μ-cell and module fabrication, together with other means to reduce cost or increase performance are, therefore, important areas for further work.

FABRICATING MICRO-CELLS: The fabrication process begins with a p-type (111) CZ Si wafer (3 inch diameter, 10-20 Ω·cm, 375 μm thickness, Montco Silicon Technology) that was coated with a layer of $SiO_2$ (~600 nm) formed by plasma enhanced chemical vapor deposition (PECVD, PlasmaTherm SLR) at 250° C. Spin casting, exposing (365 nm light, through a Karl Suss MJB mask aligner) and developing a layer of photoresist (PR: AZ5214, Clariant; developer: AZ327MIF, Clariant) formed a pattern that defined the lateral dimensions and layouts of the μ-cells, in rectangular geometries (i.e. μ-bars). The $SiO_2$ not protected by the resist was removed with buffered oxide etchant (BOE, 6:1, Transene). Inductively coupled plasma reactive ion etching (ICPRIE, STS)[23,24] formed trench structures with typical depths of 15-20 μm in the regions of exposed silicon. The PR and remaining $SiO_2$ were then removed with acetone and hydrofluoric acid (HF: Fisher, 49% concentration), respectively. Selective area doping of top contacts was conducted using solid state sources of boron (BN-1250, Saint Gobain) and phosphorous (PH-1000N, Saint Gobain) at 1000° C. under $N_2$ atmosphere for 30 min (boron) and 10 min (phosphorous). A layer of $SiO_2$ (900 nm) deposited by PECVD at 250° C. and patterned by photolithography (PR: AZ4620, Clariant; developer: deionized H2O:AZ400K=3:1 by volume, Clariant) and etching in BOE served as a doping mask. The doped wafer was then cleaned and coated with $SiO_2$ (100 nm) and $Si_3N_4$ (500 nm) by PECVD at 250° C., and subsequently with Cr (80 Å) and Au (800 Å) via directional deposition in an electron beam evaporator (Temescal, FC 1800) at an angle of ±30° with respect to the wafer surface. Reactive ion etching (RIE, PlasmaTherm 790 Series) using $CHF_3/O_2$ (40/2 sccm, 50 mTorr, 150 W, 7 min) and SF6 (40 sccm, 50 mTorr, 100 W, 1 min) exposed regions of Si at the bottoms of the trenches formed by ICPRIE. Immersion in KOH (PSE-200, Transene) at 100° C. for ~30 min initiated anisotropic undercut etching at these locations to define the bottom surfaces of the μ-cells. After removing Au and Cr with commercial etchants (Transene), these bottom surfaces were doped with boron again using the solid state doping source at 1000° C. for 5 min. Cleaning of the resulting sample in Piranha solution ($H_2SO_4$: $H_2O_2$=3:1 by volume, 3 min) and HF completed the process.

FABRICATING ELASTOMERIC STAMPS: Simple, flat stamps for by-hand printing were prepared by curing a PDMS prepolymer and cross-linking agent (SYLGARD® 184, Dow Corning Corp.) mixed at 10:1 by volume at 75° C. for 2 h. Forming composite stamps suitable for use in our automated printer system involved several steps (see FIG. 12). First, the template that defined the geometry of relief on the stamp was prepared on a Si wafer (4 inch diameter) by optical lithography using a negative-tone PR(SU8-5, 100 μm thickness, Microchem) and a developer (SU-8 developer, Microchem). This substrate was then exposed to a vapor of (tridecafluoro-1,2,2-tetrahydrooctyl)-1-tricholorosilane (T2492-KG, United Chemical Technologies) for 3 h at room temperature. A 10:1 PDMS prepolymer mixture was poured onto the substrate, to a thickness of 100-200 μm, and then partially cured at 75° C. for 30 min. A thin glass disc (~0.1 mm thickness, 3 inch diameter, Corning Incorporated) was placed on top, to form a backing layer capable of reducing in-plane deformations during printing. As a final step, another layer of 10:1 PDMS prepolymer mixture was poured on top. The entire composite stamp was heated at 75° C. for 2 h, to complete the curing.

TRANSFER PRINTING MICRO-CELLS: Transfer printing used a custom-built, automated machine consisting of motion controlled stages with 1 micron resolution and an optical microscope vision system with a zoom range of 4× to 26×. Vacuum chucks mount on manually controlled rotational stages with 6 arc seconds sensitivity to support the processed wafers and the target substrates and to align them with each other and the relief features of the stamp. These chucks rest on a computer controlled stage capable of 8 inches of motion in the X and Y directions. A PDMS composite stamp bolts into a vertical printhead assembly that can move in the vertical (Z) direction up to 2 inches. The stamp mount has a square, 3 inch aperture allowing an optical microscope vision system to image through the transparent composite stamp onto the stages below. The steps for printing are as follows. Optical alignment and calibration: To ensure high yields, it is important that all components of the system are properly aligned. The tilt of the PDMS composite stamp relative to the source wafer and target substrate is manually adjusted, with 20 arc seconds of sensitivity, using the vision system for guidance. The μ-cells on the source wafer are aligned to the corresponding relief features on the composite stamp using rotational stages on the XY stage. A two-point calibration is performed on both the source wafer, target substrate, and cleaning substrate (six points in total) to account for tilt in the Y-direction as well as misalignment of the XY motion axes relative to the orientation of the stamp. Software controlled printing: Unlike alignment, the printing itself is fully automated. XYZ calibration data are first entered into custom software along with the desired spacing and number of rows in the printed cell arrays. This software calculates XYZ data for each pickup, print, and cleaning position. The stages use these data to guide the printing process in a step-and-repeat procedure. The cycle time for a single pickup and printing procedure is approximately three minutes. One minute is required for positioning, pickup, printing, and cleaning. For two minutes the cells are allowed to rest on the PDMS substrate before printing to increase adhesion.

PLANARIZING MICRO-CELLS Planarization method 1: A pre-cleaned substrate (glass or PET) is exposed to UV induced ozone for 10 min and then spin coated with a UV curable polymer (NOA61, Norland Products Inc.). Retrieved μ-cells on a flat PDMS stamp are placed against this substrate and then the entire system was exposed to a UV source for ~30 min to cure the NOA. The PDMS stamp is then slowly peeled from the substrate, leaving planarized μ-cells in a NOA matrix. Planarization method 2: After printing arrays of μ-cells on a substrate with a thin PDMS coating, $SiO_2$ (150 nm) is deposited by electron-beam evaporation (Temescal, FC 1800). Spin-coating a layer of NOA61 (~30 μm) and then contacting a bare, flat PDMS element causes the NOA to flow to conform to and planarize the relief presented by the μ-cells. Curing the NOA by exposure to UV light followed by removal of the stamp and, sometimes, a brief exposure of the substrate to an oxygen RIE (10 sccm, 50 mTorr, 150 W, 2-3 min) completes the process.

FABRICATION OF MICRO CONCENTRATORS A commercially available cylindrical lens array (Edmund Optics NT43-028) serves as a 'master' for the formation of replica lenses by soft lithography. The process begins with cleaning of the master in soapy water under ultrasonic vibration for 20 min, followed by the same process with deionized water, and finally blowing the structure dry with compressed nitrogen. This cleaned lens master is then exposed to a vapor of (tridecafluoro-1,2,2-tetrahydrooctyl)-1-tricholorosilane (T2492-KG, United Chemical Technologies) for 1 hour. A glass spacer of 1 mm thickness placed between the lens master and a glass backing plate prepares the system for casting and curing of a 10:1 mixture of PDMS prepolymer and curing agent (SYLGARD® 184, Dow Corning Corp.) at room temperature for 48 h. Peeling away yielded a PDMS mold on a glass backing plate. A separate, optically flat PDMS slab on a glass backing plate is prepared in a similar way, with a flat silicon wafer instead of the lens master. The photocurable polymeric material from which lens array replicas are made was prepared using commercially available 9-15 nm silica nanoparticles (IPA-ST, Nissan Chemicals, Ltd.), a silicone based epoxy resin (PCB 35-54B, Polyset Inc), and a coupling agent (3-Glycidyloxypropyl)trimethoxysilane (Sigma-Aldrich) according to published procedures[32]. After exposure to a vapor of (tridecafluoro-1,2,2-tetrahydrooctyl)-1-tricholorosilane for 1 h, the negative mold and the flat PDMS surface are assembled with a ~2.2 mm spacer. The photocurable polymer prepared as above is poured into the cavity and cured under UV (9 mW/cm$^2$) exposure for 10 min. Removing the flat PDMS and negative mold completes the fabrication of the replica lens array.

ELECTRICAL AND OPTICAL MEASUREMENTS Electrical measurement: Light and dark IV measurements of μ-cells are carried out at room temperature using a DC source meter (Model 2400, Keithley) operated by LabVIEW5®, and a 1000 W full spectrum solar simulator (Model 91192, 4×4 inch source diameter, ±4° collimation, Oriel) equipped with AM 0 and AM 1.5 direct filters. The input power of light from the solar simulator is measured with a power meter (Model 70260, Newport) and a broadband detector (Model 70268, Newport). Optical measurement: Transmission spectra of semi-transparent μ-cell modules are measured at normal incidence of light using a UV-Vis-NIR spectrophotometer (CARY 5G, Varian, Inc.).

OPTICS SIMULATION The calculation is performed with a commercial ray tracing package (Rayica 3.0, Optica Software). We assumed that the rays of light were incident at one angle and had wavelength of 550 nm, that the lens array was infinite, and that Fresnel reflections were negligible. The curved surface of the lens array is profiled experimentally and fitted to a parabola; the width of each lens is ~0.4 mm and its center thickness is ~2.2 mm. The lens material is taken to be BK7 glass (for the purposes of this calculation). The lens array is positioned 0.1 mm from the top surface of the μ-cells, whose width is 0.05 mm. The integrated top surface intensity is an imperfect predictor of the power incident and absorbed by the μ-cells. However, the periodicity of the μ-cell response with incident angle is captured.

Surface re-polishing of source wafer for multiple generation device fabrication After all of the μ-cells were retrieved, chemical re-polishing of the source wafer is conducted in KOH (PSE-200, Transene) at 120° C. for ~45 min to remove the relief features associated with the anchors and any residual doped areas. The processed source wafer has a root mean square (RMS) roughness of ~11 nm (over the area of 30 μm by 15 μm) as measured by atomic force microscopy (AFM). The re-polished source wafer was then cleaned by RCA cleaning methods [Kern, W. Handbook of Semiconductor Wafer Cleaning Technology: Science, Technology, and Applications (Noyes Publications, Park Ridge, N.J., U.S.A, 1993; Kern, W. Hydrogen peroxide solutions for silicon wafer cleaning. *RCA Eng* 28, 99-105 (1983).] before additional rounds of μ-cell fabrication.

Secondary Ion Mass Spectrometry (SIMS): Dynamic secondary ion mass spectrometry (SIMS) experiments were performed on a Cameca ims 5f instrument. Boron depth profiles were obtained using a 12 kV $O_2^+$ beam with a current of 100 nA, which was rastered over a 250 μm square, and positive secondary ions were collected. Phosphorus depth profiles used a 10 kV Cs$^+$ beam with a current of 10 nA, which was rastered over a 150 μm square, and negative secondary ions were collected. In all cases, secondary ions are collected on an electron multiplier. Ion implanted standards are used to determine relative sensitivity factors for each analyzed element in order to derive quantified results.

Figure 16:
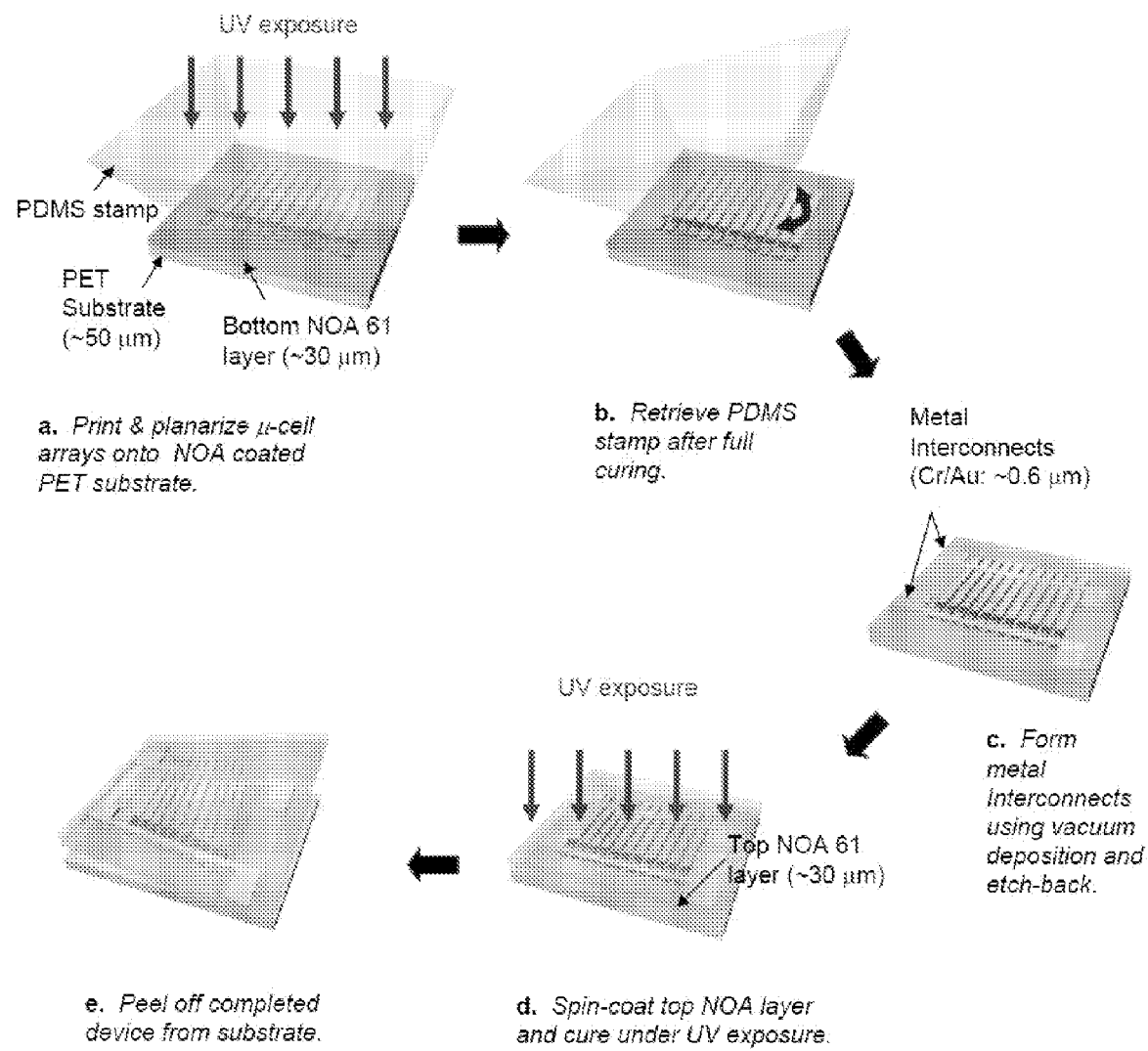
FIG. 16: Schematic illustration of fabrication steps for mechanically flexible μ-cell module, with key dimensions.
Figure 17:
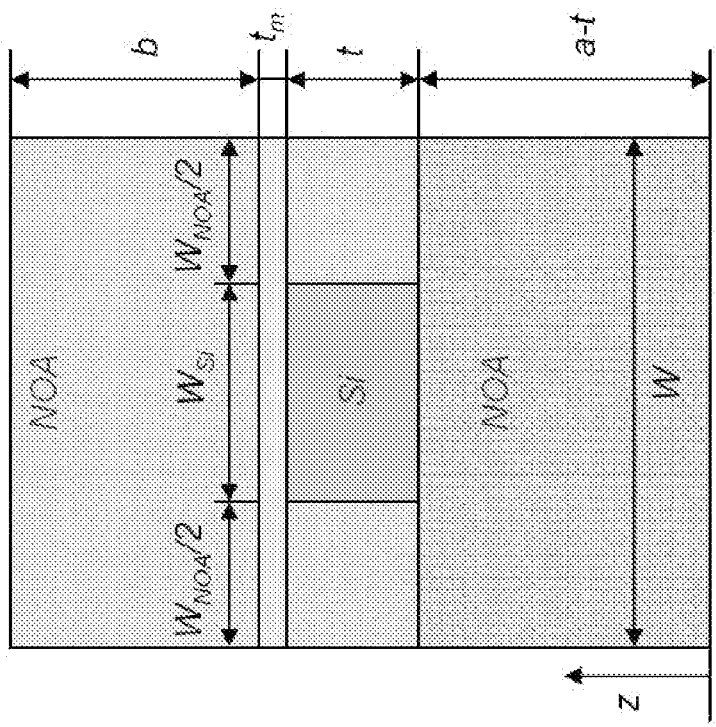
FIG. 17: Cross-sectional schematic illustration of a model composite structure composed of silicon μ-cell, and polymer encapsulation layer (a) without and (b) with metal layer, with key parameters.
Figure 17:
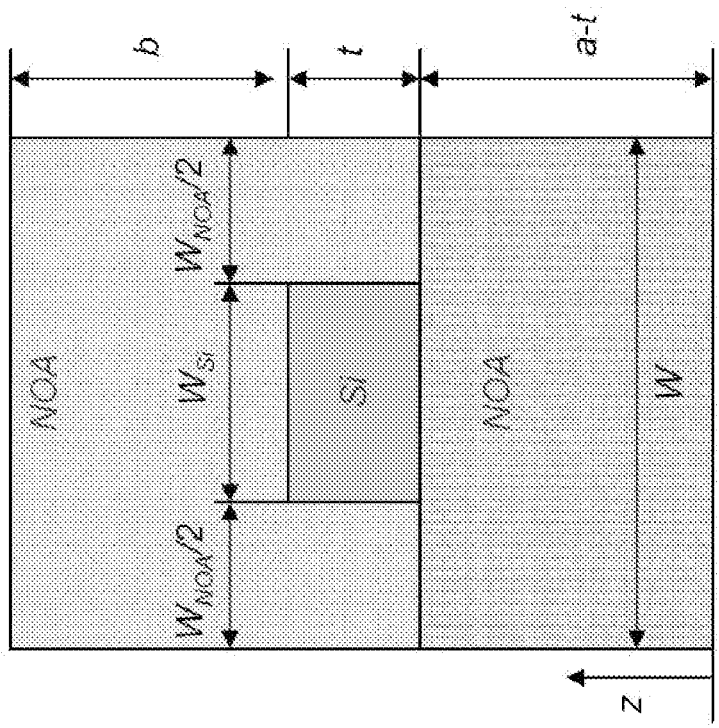

Fabricating Mechanically Flexible p-Cell Arrays: With a pre-cleaned and thin (~50 μm thickness) film of polyethylene terephthalate (PET, Grafix DURA-LAR) as a handling substrate, μ-cell arrays were printed and planarized onto an uncured NOA layer (~30 μm) using a flat PDMS stamp, as described in FIG. 9. After the formation of metal interconnects (Cr/Au: ~0.6 μm) using vacuum deposition and etch-back process, a top layer of NOA (~30 μm) was added by spincoating to implement a neutral mechanical plane. The fabrication step was completed by peeling off the PET substrate from the composite structure after full curing of the top NOA layer. FIG. 16 depicts schematic illustrations of fabrication steps described above.

Electrical measurements of mechanically flexible μ-cell module For electrical characterization of the mechanically flexible μ-cell arrays at bent states, the completed module was attached to the outer surface of glass test tubes having various radii (12.6 mm, 8.9 mm, 6.3 mm, and 4.9 mm). Light and dark current (I)-voltage (V) measurements at various bending geometries (i.e. outward bending, along the cell length and the cell width) and bending radii are then performed at room temperature. For fatigue tests, one bending cycle was defined such that the module was bent, relaxed to a flat state, and bent again over the test tube. IV measurements are conducted at bent states after selected number of bending cycles.

Figure 13:
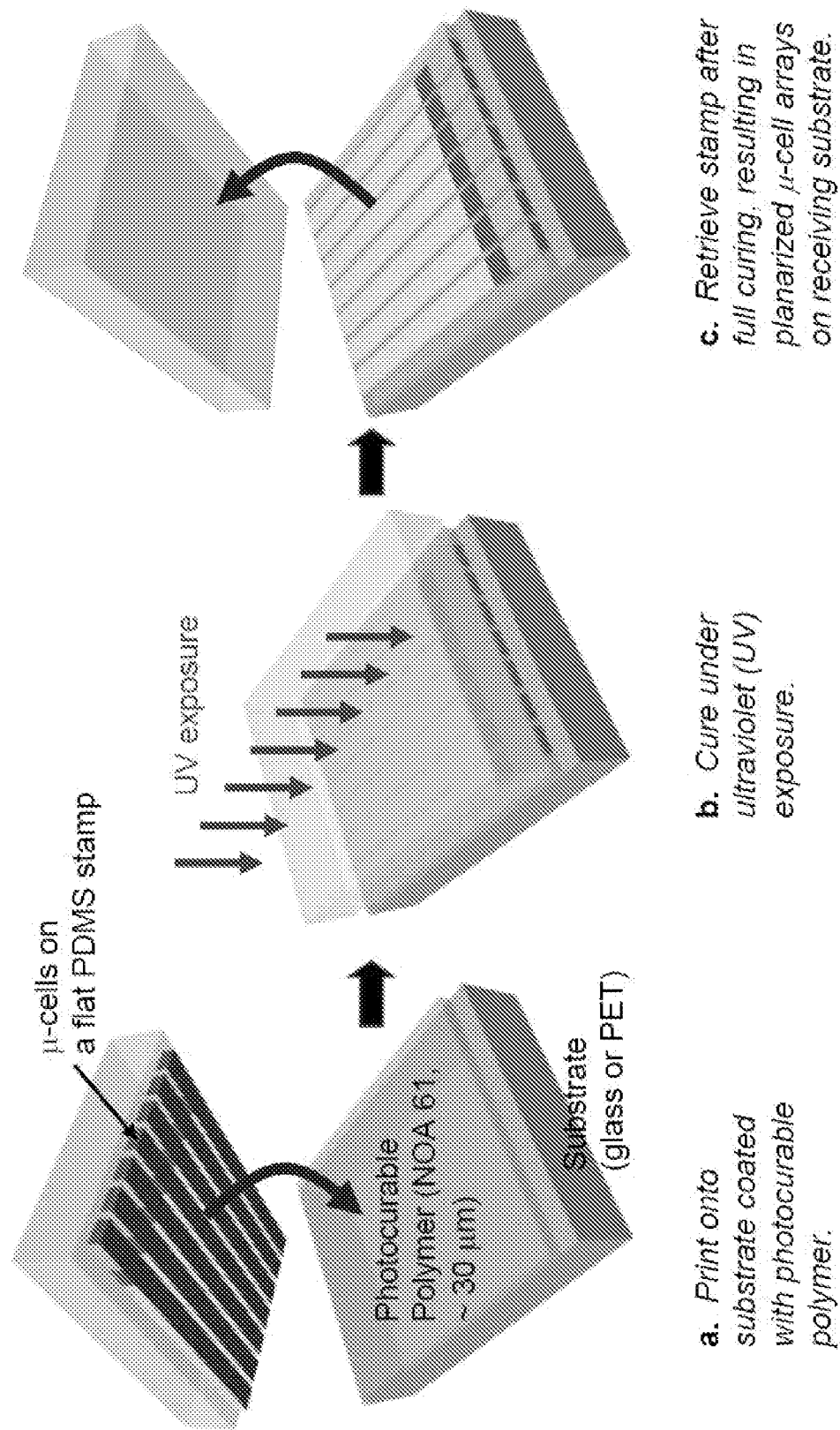
FIG. 13: Schematic illustration of processing steps for printing and planarizing silicon μ-cells at a single step using a flat PDMS stamp, where a photocurable polymer (NOA61, ~30 μm) is used as both an adhesive and a planarizing medium. In this approach, the cell layout of printed μ-cells is maintained as same as that of the source wafer.
Figure 14:
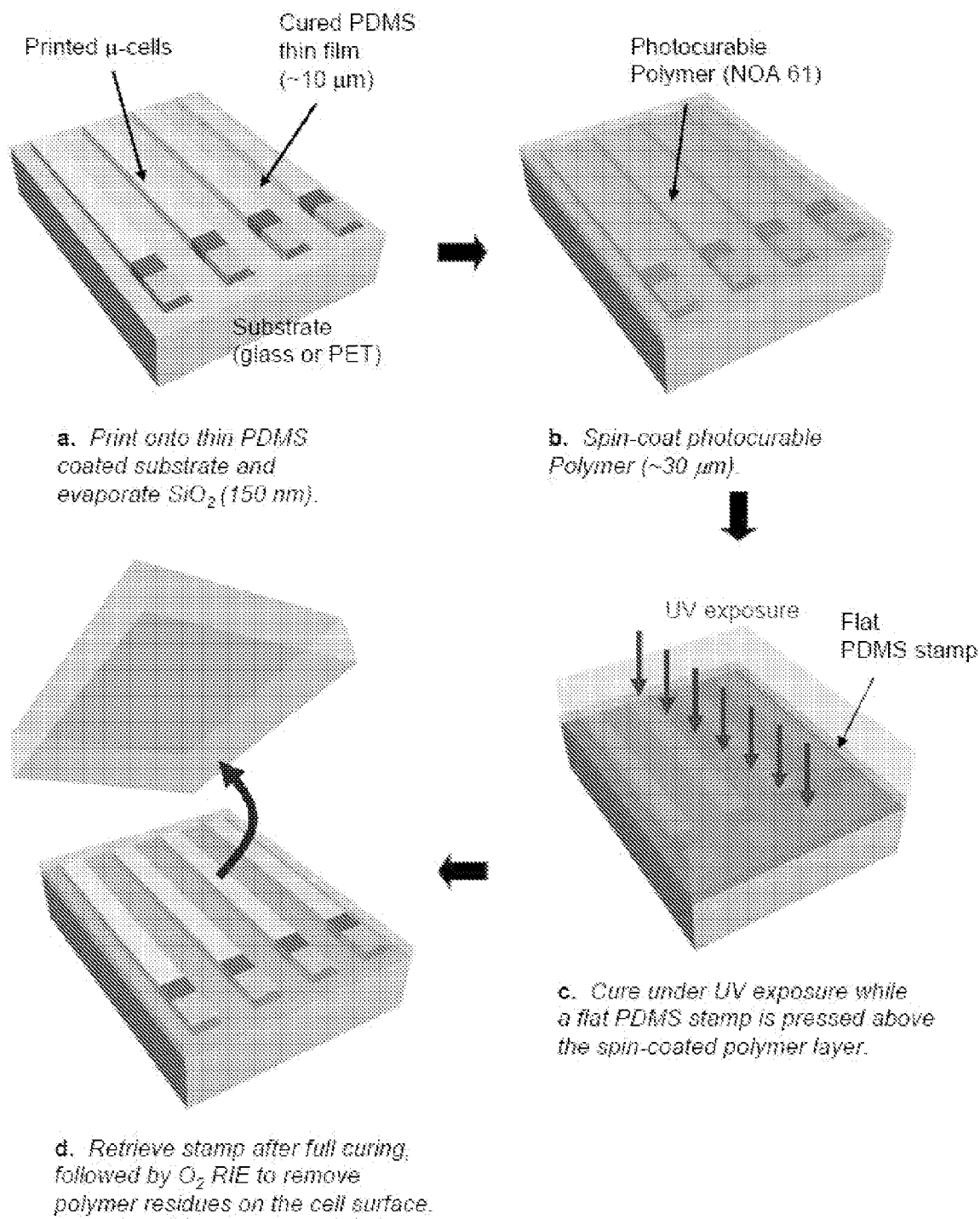
FIG. 14: Schematic illustration of processing steps for planarizing printed silicon μ-cells, where μ-cells were printed at selected cell spacings on a PDMS coated (~10 μm) substrate (glass or PET) through automated printing process.
Figure 18:
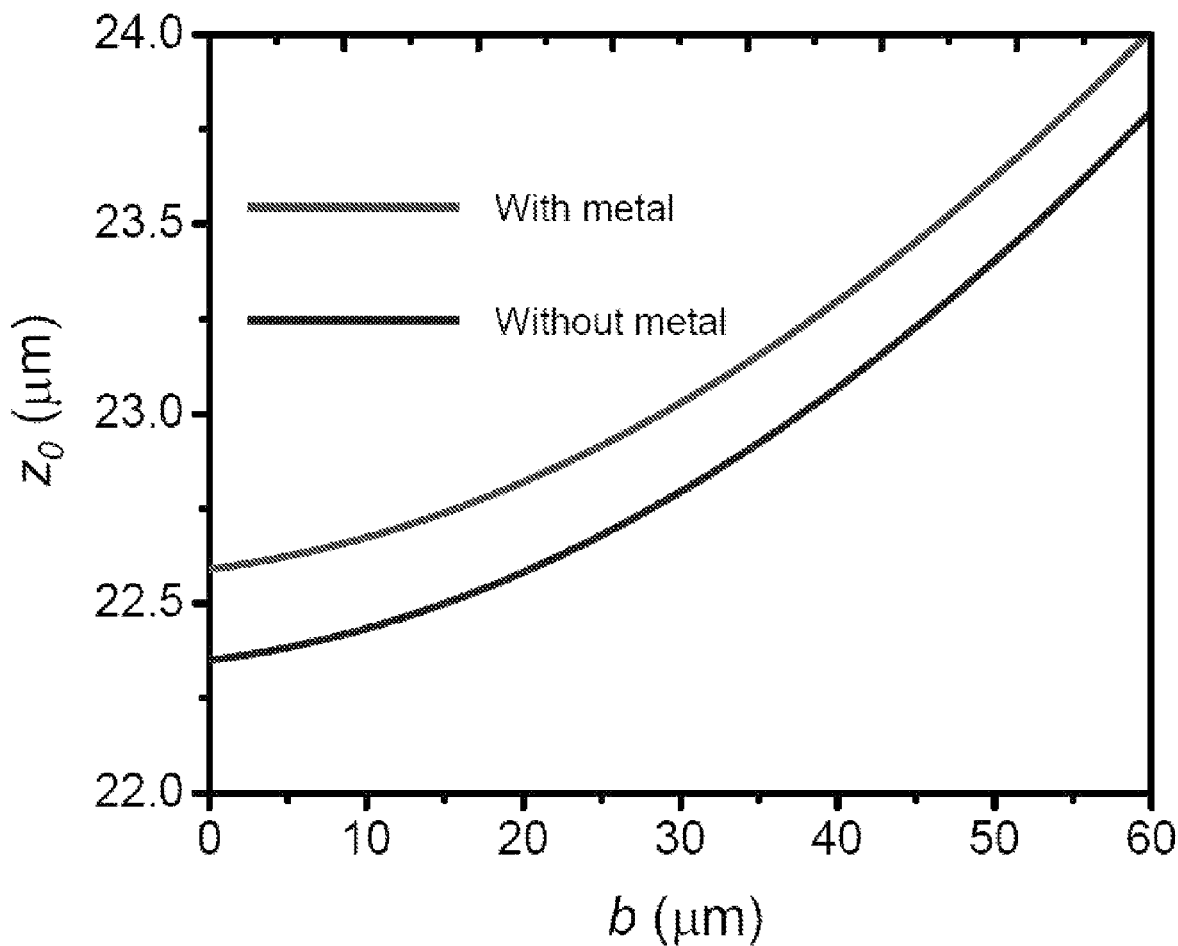
FIG. 18: Analytically calculated position ($z_0$) of neutral mechanical plane as a function of the top polymer layer thickness (b), where $E_{si}$=150 GPa, $E_{NOA}$=1 GPa, $E_{au}$=78 GPa, a=30 μm, t=15 μm, $t_m$=0.6 μm, $W_{Si}$=50 μm, $W_{NOA}$=26 μm.

Analytical modeling of mechanically flexible μ-cell module: a position of neutral mechanical plane and strain in bending along the cell length direction. The mechanically flexible μ-cell module is modeled as a composite beam as shown in FIG. 13, where W, $W_{si}$, and $W_{NOA}$ are the widths of the beam, silicon μ-cell and the distance between adjacent μ-cells, respectively, and t, $t_m$, b and a-t are the thicknesses of the μ-cell, metal interconnect layer, and NOA layers above and below the μ-cell. The Young's modulus of silicon, metal (gold), and NOA are denoted by $E_{si}$, $E_{Au}$ and $E_{NOA}$, respectively. The strain in the beam is given by $\in_{yy}=(z-z_0)/R$, where R is the bending radius of the beam and $z_0$ is the position of the neutral mechanical plane. In the case of without metal layer (i.e. FIG. 17(a)), $z_0$ is given by:

$$z_0 = \frac{a-t}{2} \frac{\left(1+\frac{b}{a-t}\right)^2 + 2\frac{b}{a-t}\frac{t}{a-t} + \frac{W_{NOA}}{W}\frac{t}{a-t}\left(2+\frac{t}{a-t}\right) + \frac{E_{Si}t}{E_{NOA}(a-t)}\frac{W_{Si}}{W}\left(2+\frac{t}{a-t}\right)}{1+\frac{b}{a-t}+\frac{W_{NOA}}{W}\frac{t}{a-t}+\frac{E_{Si}t}{E_{NOA}(a-t)}\frac{W_{Si}}{W}}$$

and is shown by the blue line in FIG. 18. In the case of with metal layer (i.e. FIG. 17(b)), $z_0$ is given by:

$$z_0 = \frac{a-t}{2} \frac{\left(1+\frac{b}{a-t}\right)^2 + 2\frac{b}{a-t}\frac{t+t_m}{a-t} + \frac{W_{NOA}}{W}\frac{t}{a-t}\left(2+\frac{t}{a-t}\right) + \frac{E_{Si}t}{E_{NOA}(a-t)}\frac{W_{Si}}{W}\left(2+\frac{t}{a-t}\right) + \frac{E_{Au}t_m}{E_{NOA}(a-t)}\left(2+\frac{2t+t_m}{a-t}\right)}{1+\frac{b}{a-t}+\frac{W_{NOA}}{W}\frac{t}{a-t}+\frac{E_{Si}t}{E_{NOA}(a-t)}\frac{W_{Si}}{W}+\frac{E_{Au}T_m}{E_{NOA}(a-t)}}$$

and is shown by the red line in FIG. 14. FIG. 15 depicts the strain ($\in_{yy}$) at the top and bottom surface of silicon μ-cell with R=4.9 mm using analytical expressions described above.

Figure 21:
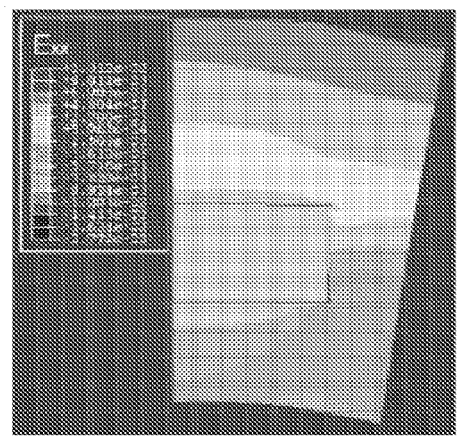
FIG. 21: Color contour plot of calculated bending strains ($\in_{xx}$) through the cross-section of a mechanically flexible μ-cell module, bent (a) outward and (b) inward along the cell width direction at R=4.9 mm, without metal layer.
Figure 21:
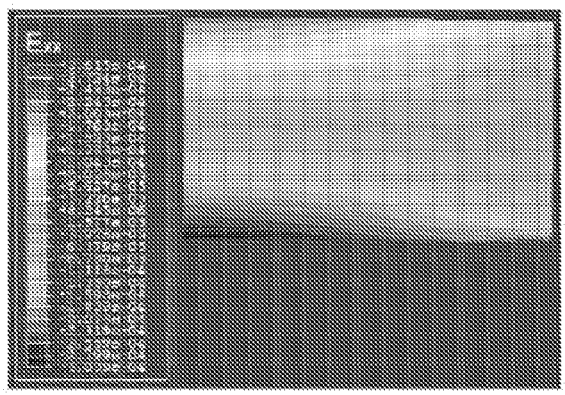
Figure 21:
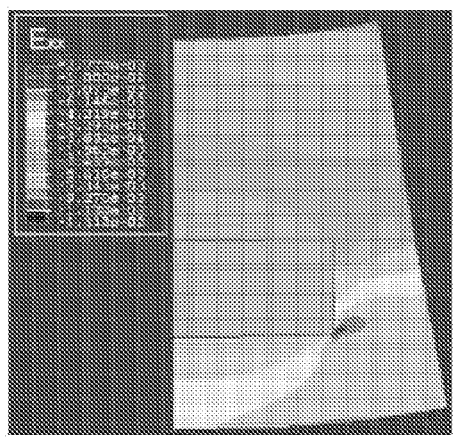
Figure 21:
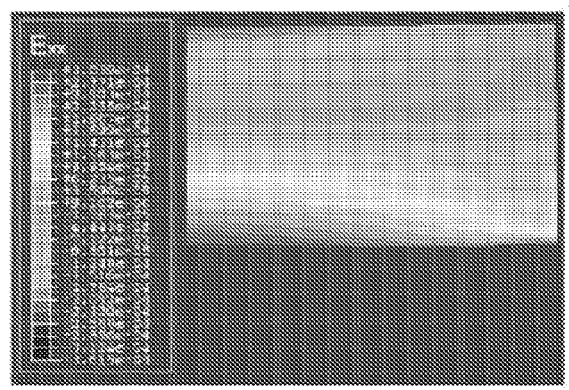
Figure 22:
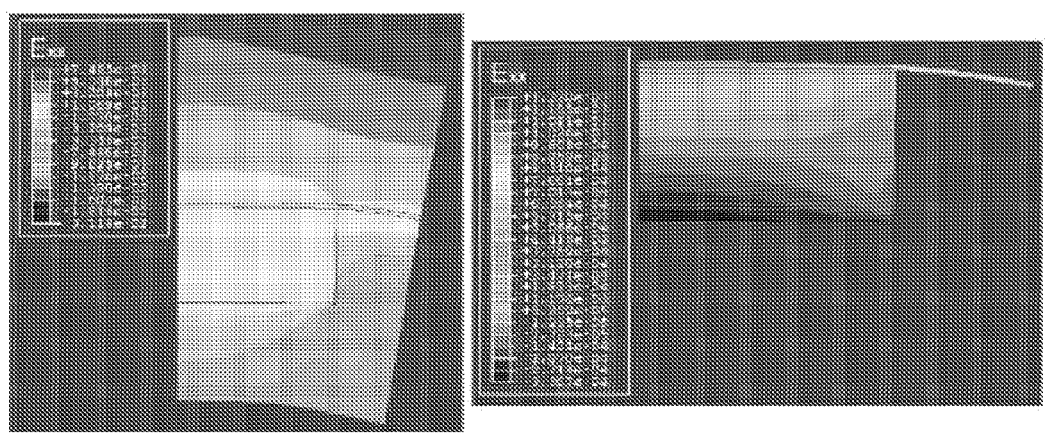
FIG. 22: Color contour plot of calculated bending strains ($\in_{xx}$) through the cross-section of a mechanically flexible μ-cell module, bent (a) outward and (b) inward along the cell width direction at R=4.9 mm, with metal layer.
Figure 22:
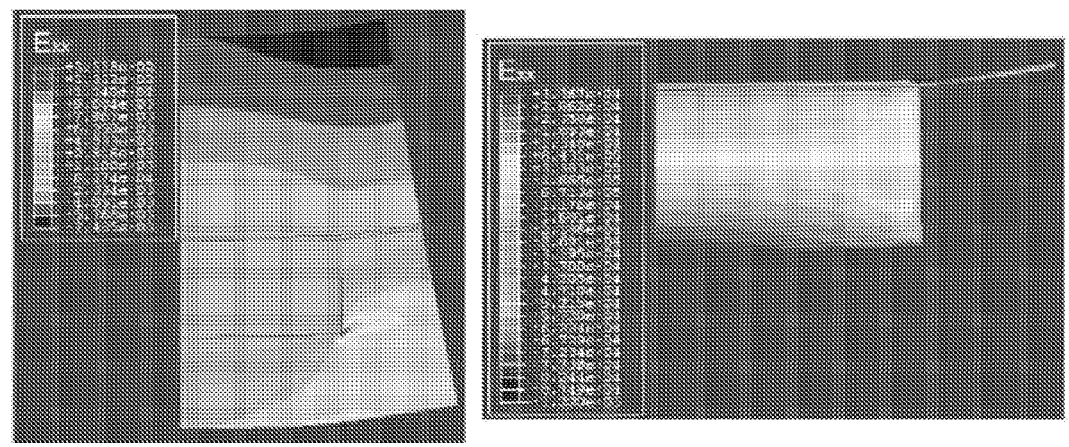
Figure 23:
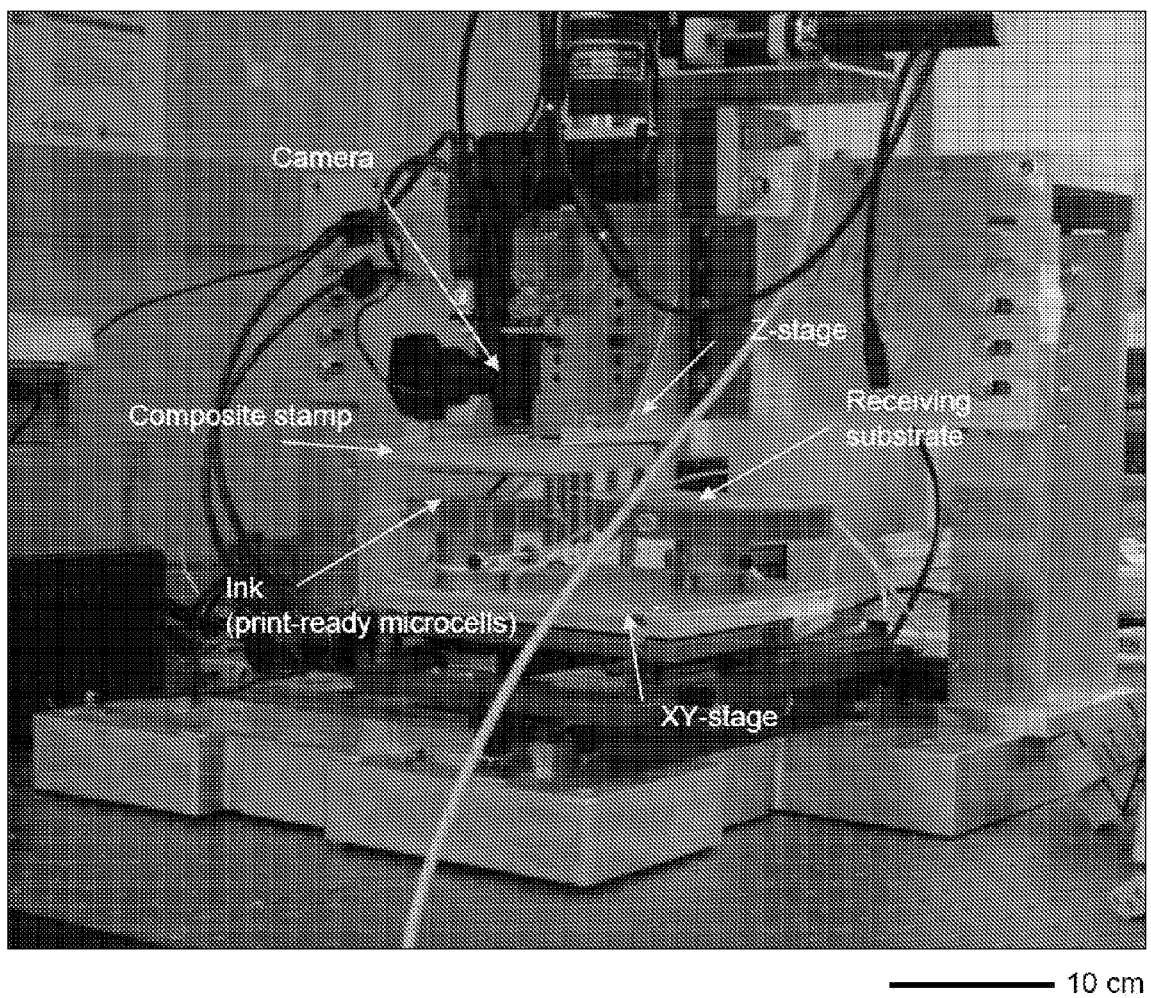
FIG. 23: Optical image of automated printing machine.

Finite element modeling of mechanically flexible μ-cell module: strain in bending along the cell width direction. The finite element method (FEM) is used to calculate strain of silicon μ-cell module in bending along the cell width direction, as shown in FIGS. 21-22, with R=4.9 mm. The maximum strain in silicon for the inward and outward bending (with or without metal) is around 0.03%. The maximum strain in the metal layer is around 0.13% and is located at the silicon corner for both inward and outward bending as shown in FIG. 23.

Estimation of concentration ratio of lenticular lens: A simple estimation of concentration ratio of lenticular lens was made based on μ-cell and lens dimensions, and measured intensity profile of lens as follows.

Assumptions: 1. The focal plane of the lens is located at the top surface of μ-cells. 2. There is no optical loss due to the absorption of lens materials. 3. Optical losses from lens are caused by: (a) reflection at the top and bottom surface of the lens: ~10% (5%×2). (b) The portion of the focused light outside the cell area, as determined from the measured intensity profile of the lens at focal plane: ~18%

The areal ratio of lens ($A_L$) and μ-cell ($A_0$) is: $A_L/A_0$=397 mm/50 mm=~7.9. Loss factor (LF) due to (a) and (b) is: 0.9×0.82=~0.74.

Let the input intensity of incident light onto the lens surface $I_0$.

Then, the input power of light to the lens surface ($A_L$) is: $I_0 \times A_L$=~7.9$I_0A_0$.

The input power at the cell surface located at the focal plane of lens: LF×7.9$I_0A_0$=~5.9$I_0A_0$. The concentration ratio is then estimated by (Input power of light to cell surface with lens)/(Input power of light to cell surface without lens)

=~5.9$I_0A_0/I_0A_0$=5.9.

References
1. Campbell, P. & Green, M. A. Light Trapping Properties of Pyramidally Textured Surfaces. *J. Appl. Phys.* 62, 243-249 (1987).
2. Heine, C. & Mori, R. H. Submicrometer Gratings for Solar-Energy Applications. *Appl. Opt.* 34, 2476-2482 (1995).
3. Feng, N.-N. et al. Design of Highly Efficient Light-Trapping Structures for Thin-Film Crystalline Silicon Solar Cells. *IEEE Trans. Elect. Dev.* 54, 1926-1933 (2007).
4. Wenham, S. R., Honsberg, C. B. & Green, M. A. Buried contact silicon solar cells. *Solar energy materials and solar cells* 34, 101-110 (1994).
5. Sinton, R. A., Kwark, Y., Gan, J. Y. & Swanson, R. M. 27.5-Percent Silicon Concentrator Solar-Cells. *IEEE Elect. Dev. Lett.* 7, 567-569 (1986).
6. Kerschaver, E. V. & Beaucarne, G. Back-contact Solar Cells: A Review. *Prog. Photovolt.* 14, 107-123 (2006).
7. Zhao, J. H., Wang, A. H. & Green, M. A. 24.5% efficiency silicon PERT cells on MCZ substrates and 24.7% efficiency PERL cells on FZ substrates. *Prog Photovolt.* 7, 471-474 (1999).
8. Biancardo, M. et al. Characterization of microspherical semi-transparent solar cells and modules. *Sol. Energy* 81, 711-716 (2007).
9. Liu, Z. X. et al. A concentrator module of spherical Si solar cell. *Sol. Energy Mater. Sol. Cells* 91, 1805-1810 (2007).
10. Minemoto, T. & Takakura, H. Fabrication of spherical silicon crystals by dropping method and their application to solar cells. *Jpn. J. Appl. Phys.* 46, 4016-4020 (2007).
11. Taguchi, M. et al. HIT (TM) cells—High-efficiency crystalline Si cells with novel structure. *Prog. Photovolt.* 8, 503-513 (2000).
12. Weber, K. J. et al. A novel low-cost, high-efficiency micromachined silicon solar cell. *IEEE Elect. Dev. Lett.* 25, 37-39 (2004).
13. Verlinden, P. J. et al. Sliver (R) solar cells: A new thin-crystalline silicon photovoltaic technology. *Sol. Energy Mater. Sol. Cells* 90, 3422-3430 (2006).
14. Brendel, R., Bergmann, R. B., Lolgen, P., Wolf, M. & Werner, J. H. Ultrathin crystalline silicon solar cells on glass substrates. *Appl. Phys. Lett.* 70, 390-392 (1997).
15. Brendel, R. Review of layer transfer processes for crystalline thin-film silicon solar cells. *Jpn. J. Appl. Phys.* 40, 4431-4439 (2001).
16. Tayanaka, H., Yamauchi, K. & Matsushita, T. Thin-film crystalline silicon solar cells obtained by separation of a porous silicon sacrificial layer. *Proc. 2nd World Conf. Photovolt. Sol. Energy Cony,* 1272-1275 (1998).
17. Yamamoto, K. et al. Thin-film poly-Si solar cells on glass substrate fabricated at low temperature. *Applied Physics A: Materials Science & Processing* 69, 179-185 (1999).
18. Shah, A. et al. Recent progress on microcrystalline solar cells. *Photovoltaic Specialists Conference, Conference Record of the Twenty-Sixth IEEE,* 569-574 (1997).
19. Bergmann, R. B. Crystalline Si thin-film solar cells: a review. *Appl. Phys. A* 69, 187-194 (1999).
20. Green, M. A. Crystalline and thin-film silicon solar cells: state of the art and future potential. *Sol. Energy* 74, 181-192 (2003).
21. Kazmerski, L. L. Solar photovoltaics R&D at the tipping point: A 2005 technology overview. *J. Elect. Spec. Rel. Phenom.* 150, 105-135 (2006).
22. Mack, S., Meitl, M. A., Baca, A. J., Zhu, Z. T. & Rogers, J. A. Mechanically flexible thin-film transistors that use ultrathin ribbons of silicon derived from bulk wafers. *Appl. Phys. Lett.* 88 (2006).
23. Ko, H. C., Baca, A. J. & Rogers, J. A. Bulk quantities of single-crystal silicon micro-/nanoribbons generated from bulk wafers. *Nano Lett.* 6, 2318-2324 (2006).
24. Baca, A. J. et al. Printable single-crystal silicon micro/nanoscale ribbons, platelets and bars generated from bulk wafers. *Adv. Func. Mater.* 17, 3051-3062 (2007).
25. Meitl, M. A. et al. Stress focusing for controlled fracture in microelectromechanical systems. *Appl. Phys. Lett.* 90 (2007).
26. Meitl, M. A. et al. Transfer printing by kinetic control of adhesion to an elastomeric stamp. *Nat. Mater.* 5, 33-38 (2006).
27. Lee, K. J. et al. Large-area, selective transfer of microstructured silicon: A printing-based approach to high-performance thin-film transistors supported on flexible substrates. *Adv. Mater.* 17, 2332-2336 (2005).

28. Wilson, R. G., Stevie, F. A. & Magee, C. W. Secondary Ion Mass Spectrometry: A Practical Handbook for Depth Profiling and Bulk Impurity Analysis. (1989).
29. Properties of Crystalline Silicon (ed. Hull, R.) (IEE, London, 1999).
30. Budianu, E., Purica, M., Rusu, E., Manea, E. & Gavrila, R. Polysilicon thin layers for photovoltaic applications. *Semiconductor Conference, 2002. CAS 2002 Proceedings. International* 1 (2002).
31. Clugston, D. A. & Basore, P. A. PC1 D version 5: 32-bit solar cell modeling on personal computers. *Photovoltaic Specialists Conference, 1997., Conference Record of the Twenty-Sixth IEEE*, 207-210.
32. Kunnavakkam, M. V. et al. Low-cost, low-loss microlens arrays fabricated by soft-lithography replication process. *Appl. Phys. Lett.* 82, 1152-1154 (2003).

EXAMPLE 3

High Efficiency, Thin Film Cells with Solar Grade, Monocrystalline Si

Provided herein are high efficiency photovoltaic cells having ultrathin, solar grade, monocrystalline silicon. The cells are low cost, lightweight and may be incorporated into flexible modules. Low cost is achieved by using maximizing materials (e.g., Si) utilization and minimizing purity requirements. In addition, module assembly cost optimization is achieved by massively parallel, high speed transfer printing processes with interconnects defined by low cost printing methods. Lightweight, flexible modules facilitate easy transport, handling, and installation.

Various technologies related to precision transfer printing to device substrates, including flexible substrates, have been demonstrated in wide ranging classes of devices and circuits, as reported in a substantial body of literature[2-27]. The resulting electronics offer excellent mechanical flexibility with large performance advantages (>100×) compared to alternative approaches based on a-Si, organic and semiconductor nanomaterials and others.

In the context of photovoltaic systems, the advances made make it possible to create ultrathin monocrystalline Si solar cells, and large area, flexible modules based on them. The systems and processes provided herein address the critical metrics that limit other monocrystalline Si solar technologies: the watts per gram of active material and the cost of this material. The use of thin cells minimizes the amount of Si that is needed. The ability to implement solar grade Si in such cells further reduces the cost and eases supply constraints, without sacrificing the efficiency.

Figure 24:
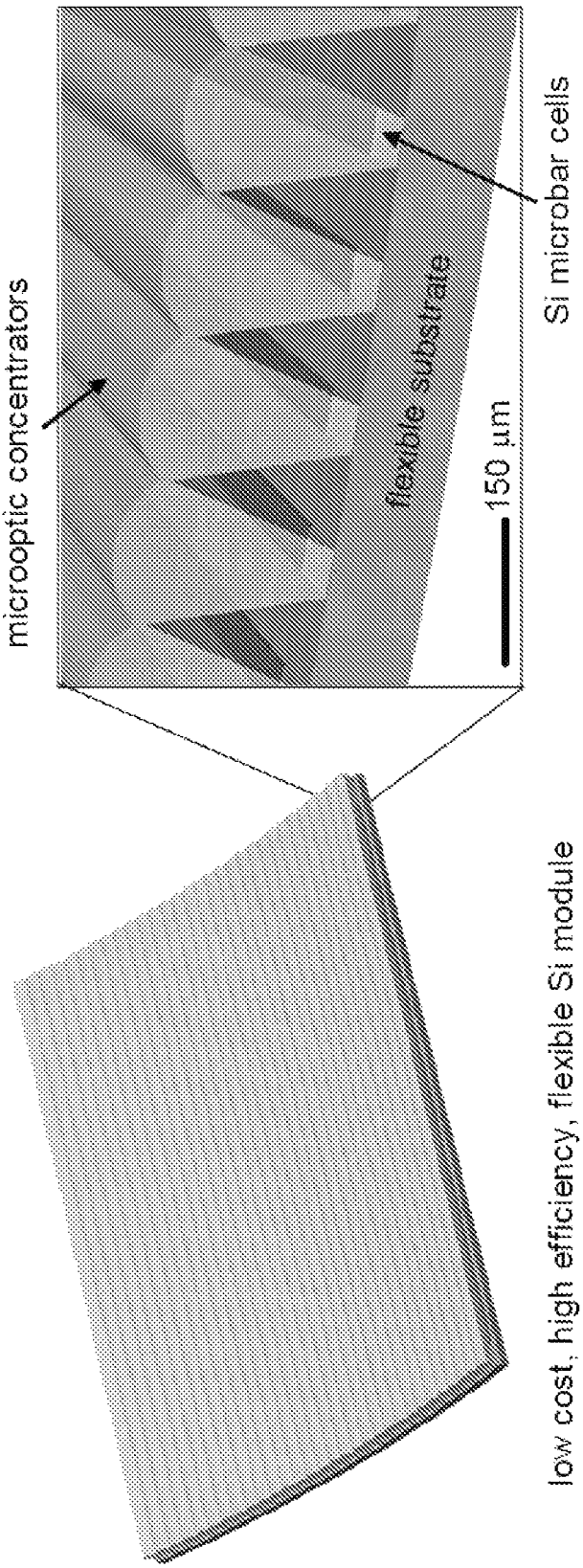
FIG. 24: Thin, lightweight, flexible PV module that achieves high efficiency and low cost through the use of printed, monocrystalline Si microbar cells. Molded microoptic concentrators, as illustrated schematically here, and printed interconnects can further reduce the cost.
Figure 25:
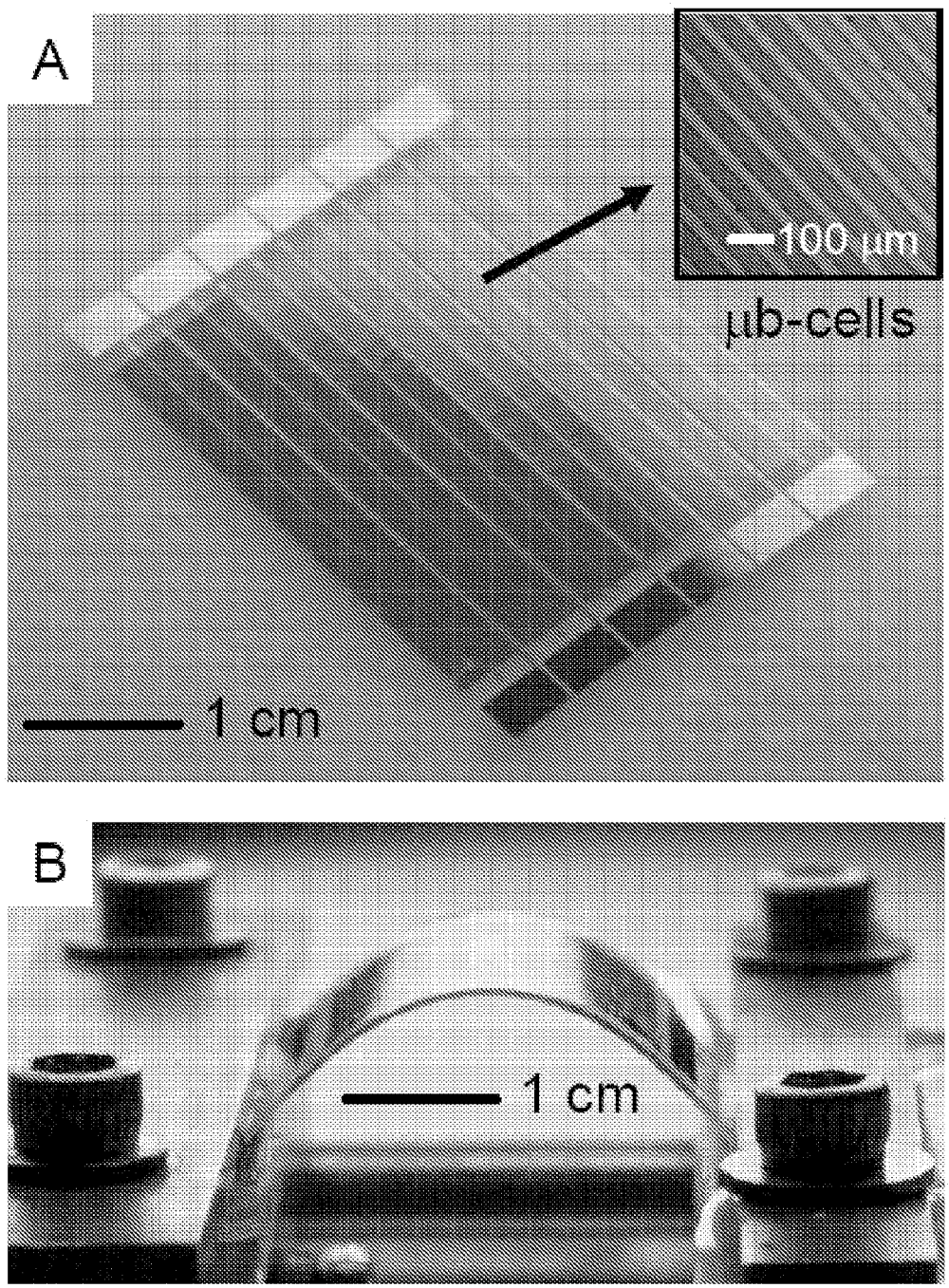
FIG. 25. Modules composed of printed arrays of thin (~15 μm), microbar cells (μb-cells) of monocrystalline Si derived from a bulk wafer and integrated on a glass (A) and flexible plastic (B) substrate.

The ability to optimally make modules, such as the one provided in FIG. 24, rely on a number of technological components, including: (1) procedures for creating monocrystalline Si microbar solar cells with thicknesses between 1 and 50 microns, from commodity bulk wafers, (2) microtransfer printing techniques to lift selected collections of these cells from the wafers and to deliver them to diverse classes of substrates, including thin sheets of plastic, (3) direct ink writing methods to form electrical interconnects for these cells, (4) molding procedures to create microoptic concentrators, and (5) reliable packaging, lens and flexible substrate materials for the integrated systems. FIG. 25 shows an example of a small module having arrays of interconnected bars (thicknesses, widths and lengths of 15 µm, 100 µm and 3 mm, respectively) of monocrystalline Si in a type of device that we refer to as a microbar cell (µb-cell), integrated onto glass (FIG. 25A) and flexible plastic (FIG. 25B) substrates by microtransfer printing (µTP).

Figure 26:
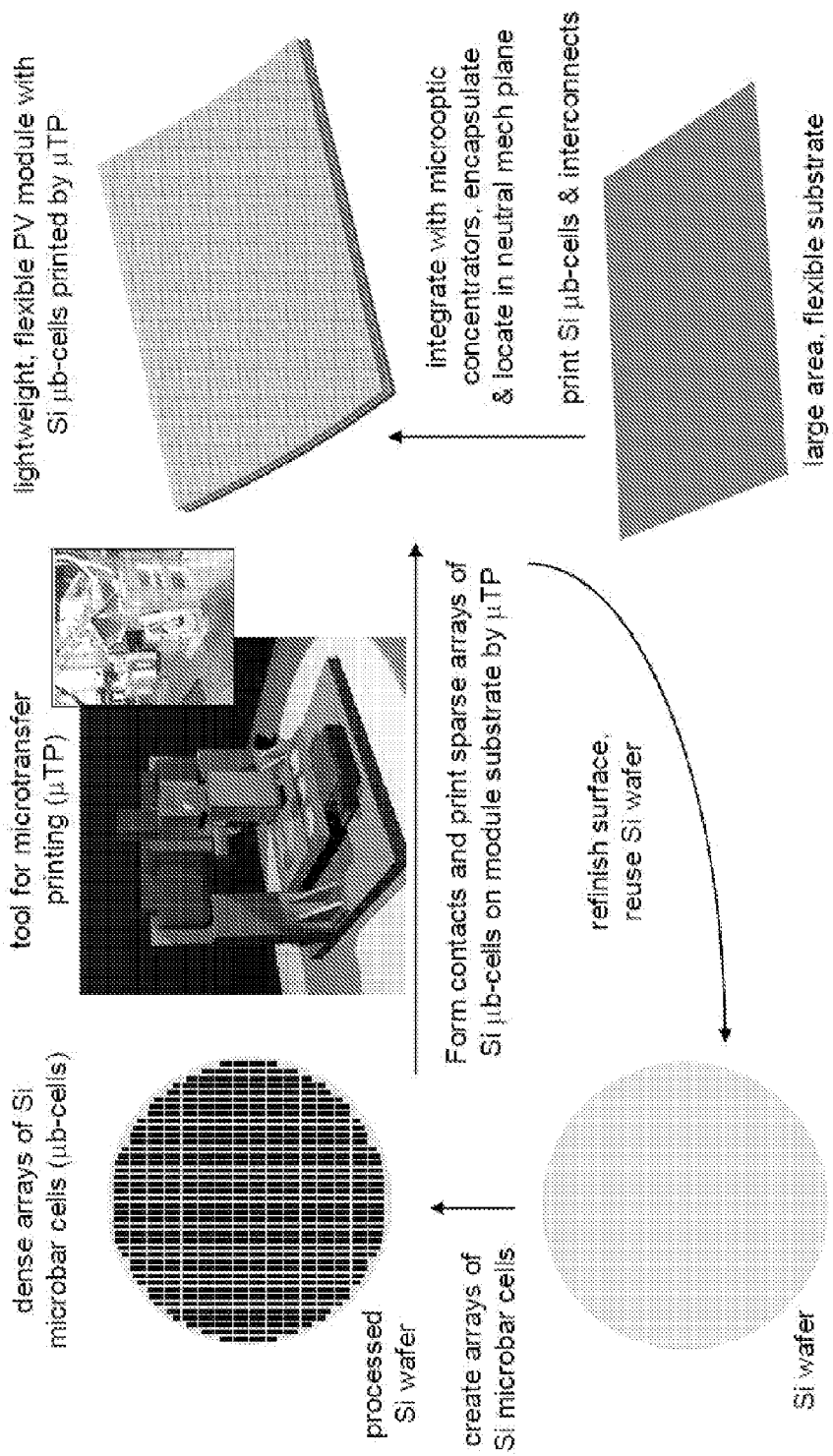
FIG. 26. Manufacturing flow for lightweight, flexible PV modules that use monocrystalline Si microbar cells (μb-cells) formed by microtransfer printing (μTP).

FIG. 26 shows the overall process flow for modules (e.g., FIG. 24) that provide high efficiency; thin, lightweight and mechanically flexible form-factor; reliable and fault-tolerant design; with a low-cost/high-volume manufacturing cost. The process begins with the formation of arrays of microbars (thicknesses between 1 and 25 µm; lengths between 1 mm and 1 cm; widths between 50 and 500 µm) of Si from the surfaces of bulk wafers, by use of proven anisotropic etching techniques[11,12]. Doping the Si forms solar cells that are then lifted from the wafers and delivered to flexible substrates by fully automated tools for microtransfer printing (µTP)[12,22-24]. Electrical interconnection followed by encapsulation, location in the neutral mechanical plane and integration with microoptic concentrators completes the modules. Each Si wafer is used several times (i.e. 5-10) in this process. The µTP method and its ability to transfer selected sets of cells over large areas in a step-and-repeat fashion represents a powerful capability that is absent from conventional liftoff cell technologies. For example, systems using the step and repeat processes disclosed herein can process a 1 m² module with 70 "prints" from a 150 mm wafer in less than 10 minutes, producing more than 40,000 1 m² modules per year. Furthermore, using "solar grade Si" relieves supply limitations on Si, further decreasing costs. Other beneficial features of modules made by processes described herein include one or more of: microscale cells having thin concentrators, efficient heat sinking, low current levels for minimized Joule heating and large output voltages; Lightweight, flexible construction, which simplifies transportation and installation; Capable for use with a range of substrates, with or without concentrators; Stable cell materials compatible with state of the art packaging materials.

Ultrathin monocrystalline Si cells provide a route to high efficiency operation with minimized costs through (1) efficient utilization of Si and (2) the ability to implement low/moderate grade Si. As modeling results suggest, achieving high performance with Si that contains defects relies on reducing the thickness to levels that minimize the influence of these defects and still allows sufficient optical absorption. This strategy is not used commercially because it is impractical with current techniques to handle Si with less than 100 µm thickness. The process of FIG. 22 eliminates this restriction and permits practical manufacturing of ultrathin Si solar cells employing much less Si and further allowing for lower purity. The ability to use lower purity Si can also alleviate supply constraints.

One of the major reasons why high purity Si is required in a standard cell is that carriers must diffuse tens of microns to reach the contacts. For example, current Si devices have thickness of ~100 µm or more. Thus, one of the two carriers generated by light must diffuse a minimum of 50 µm. For a minority carrier to diffuse tens of microns before being trapped by a defect or recombining, it is generally thought that a minority carrier lifetime >1 µsec is necessary.

A device that is much thinner than 100 µm would have several advantages when using lower purity Si. First, the total distance a minority carrier would have to diffuse would be lower. Second, and possibly more important, the built-in electric field in the device would be higher, which would accelerate the minority carriers more strongly. This would reduce the time the carrier would spend in the device and would increase the rate of detrapping from defect states. This would be particularly beneficial in forward bias where the device is generating power because in forward bias the collection field is reduced. One might expect an increased open-circuit voltage and voltage at max power in a thinner Si device.

Figure 27:
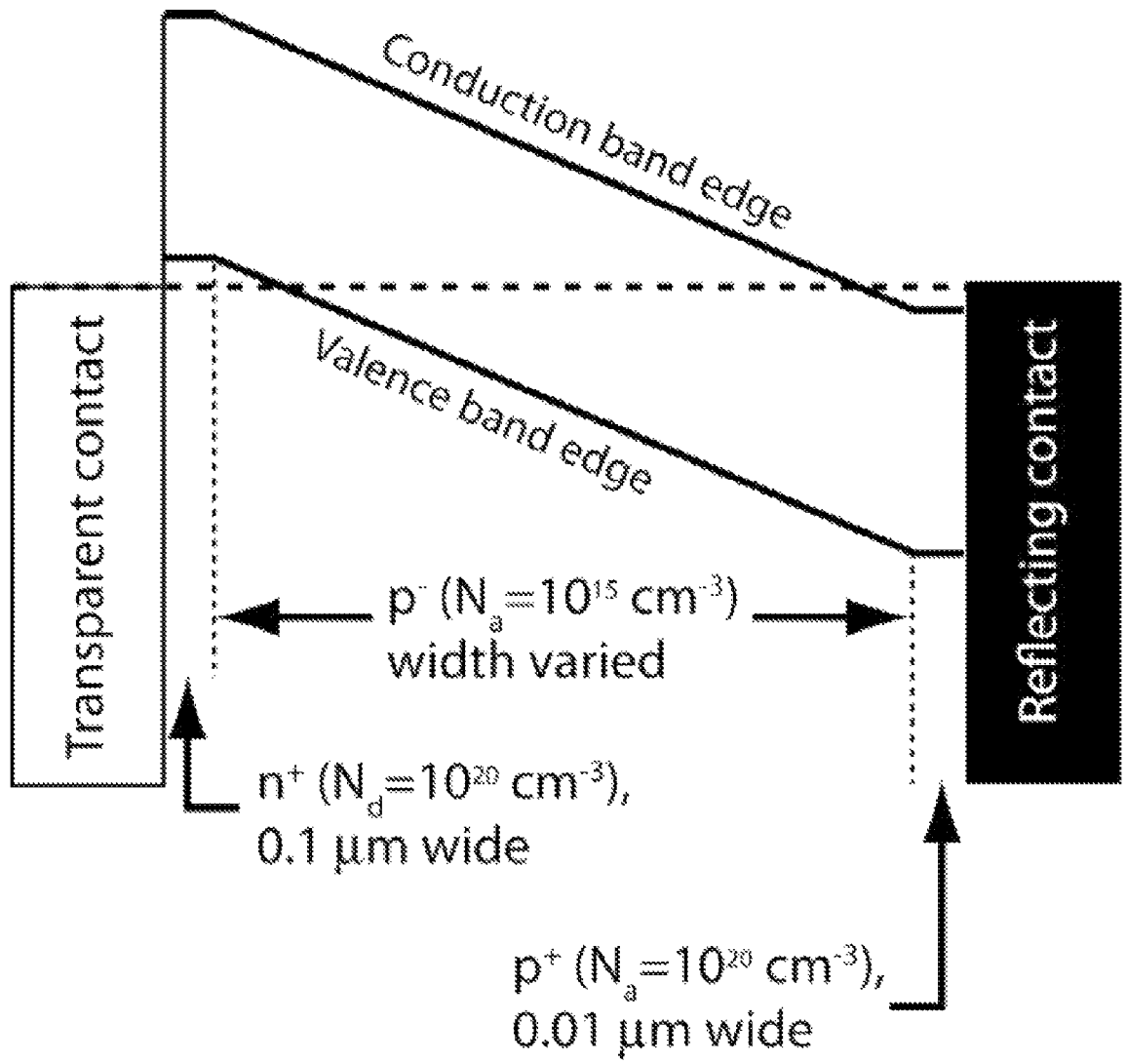
FIG. 27. Diagram of a simulated Si cell.

To demonstrate this effect quantitatively we have performed in silico experiments using the SOAPS computer code[33] a simple $n^+$-$p^-$-$p^+$ device with ohmic front and back contacts, as shown in FIG. 27. All parameters are selected for typical Si at 300K. In the bulk of the absorber (the p-layer) the electron and hole mobilities were assumed to be 500 and 300 cm$^2$ V$^{-1}$ s$^{-1}$ and thermal carrier velocities were assumed to be $2.3\times10^7$ and $1.65\times10^7$ cm/s, respectively. The conduction and valence band densities of states were $3.2\times10^{19}$ and $1.8\times10^{19}$ cm$^{-3}$, the bandgap was taken to be 1.12 eV, the electron affinity was 4.05 eV, and the dielectric constant was 11.7. The optical absorption for Si was taken from the default values supplied with the SOAPS code, and the illumination was the standard AM1.5 solar spectrum (1000 W/m$^2$). The doping was $10^{20}$ cm$^{-3}$ for the n$^+$ and p$^+$ heavily doped regions near the contacts and the bulk Si doping was $10^{15}$ cm$^{-3}$ p-type. All dopants were taken as shallow hydrogenic impurity states. The recombination velocities at the two contacts were assumed to be $10^7$ cm s$^{-1}$, corresponding to a typical thermal velocity. In other words, the contacts were assumed to recombine all carriers at an effectively infinite rate.

Figure 28:
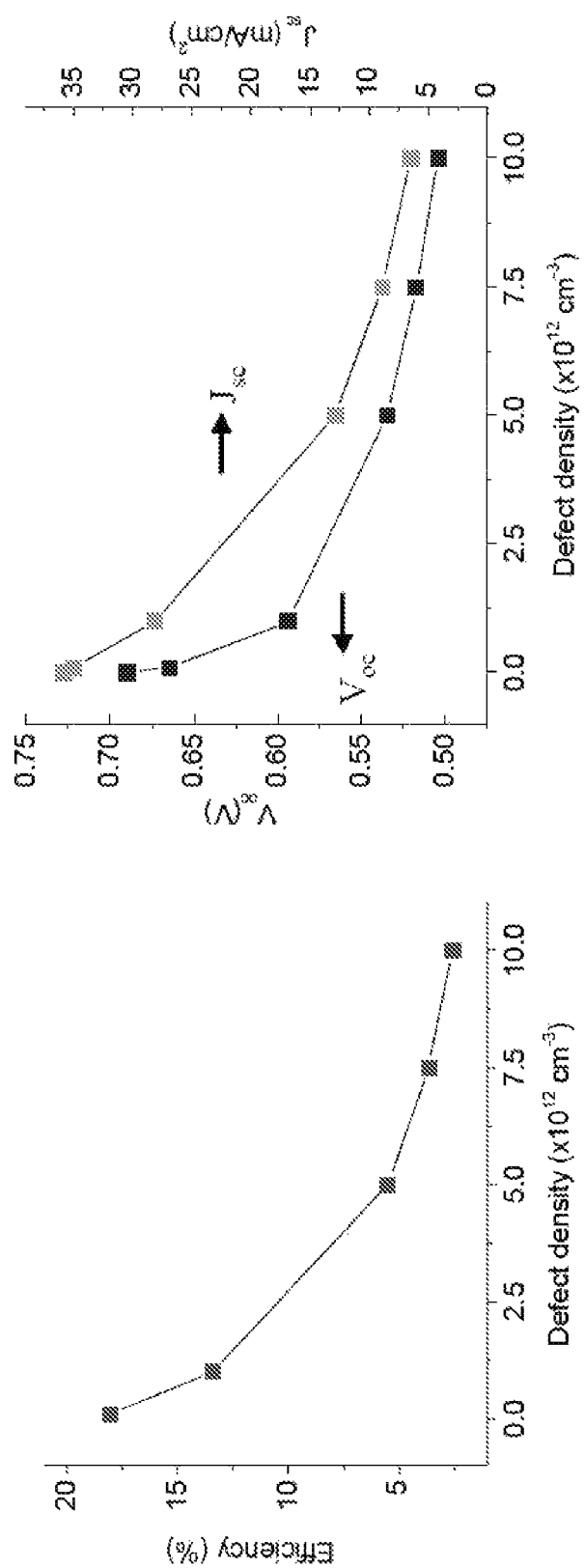
FIG. 28. Simulated efficiency (left), and open-circuit voltage ($V_{oc}$) and short circuit current density (Jsc) (right), as a function of defect concentration. The fill factor is approximately constant.

In the absence of defects, the efficiency is 18.86%. Highly detrimental defects are then added to the low-doped region at different concentrations. The defects are assumed to be neutral, thus having relatively high cross sections ($10^{-15}$ cm$^2$) for capture of both types of carrier. Choosing a donor defect with a positive charge normally would interact with higher cross section for minority carrier electrons. In this case the appropriate cross sections would be $\sim 10^{-12}$ cm$^2$ for electrons and $\sim 10^{-18}$ cm$^2$ for holes, leading to much more strong trapping of electrons than holes. Because the doping is low enough in this portion of the device, the difference between minority and majority carriers was small; an effective trap for both types of carrier should be more uniformly detrimental to the device performance. As a result, we use neutral defects with a moderate cross section for both carriers. This situation might correspond to a midgap acceptor defect that would be too deep to be ionized normally. Increasing the concentration of these defects rapidly degraded the performance of the simulated device as shown in FIG. 28 (the fill factor remained roughly constant). As expected, the addition of recombination centers in the depletion region of the device results in loss of both voltage and current with a consequent drop in efficiency. We note that while the defect population in this simulation is relatively low, it may be anticipated that typical defects in moderate purity Si would be less harmful overall than those simulated here. The impurities and the defect concentrations are simply for illustration of the effects.

Figure 29:
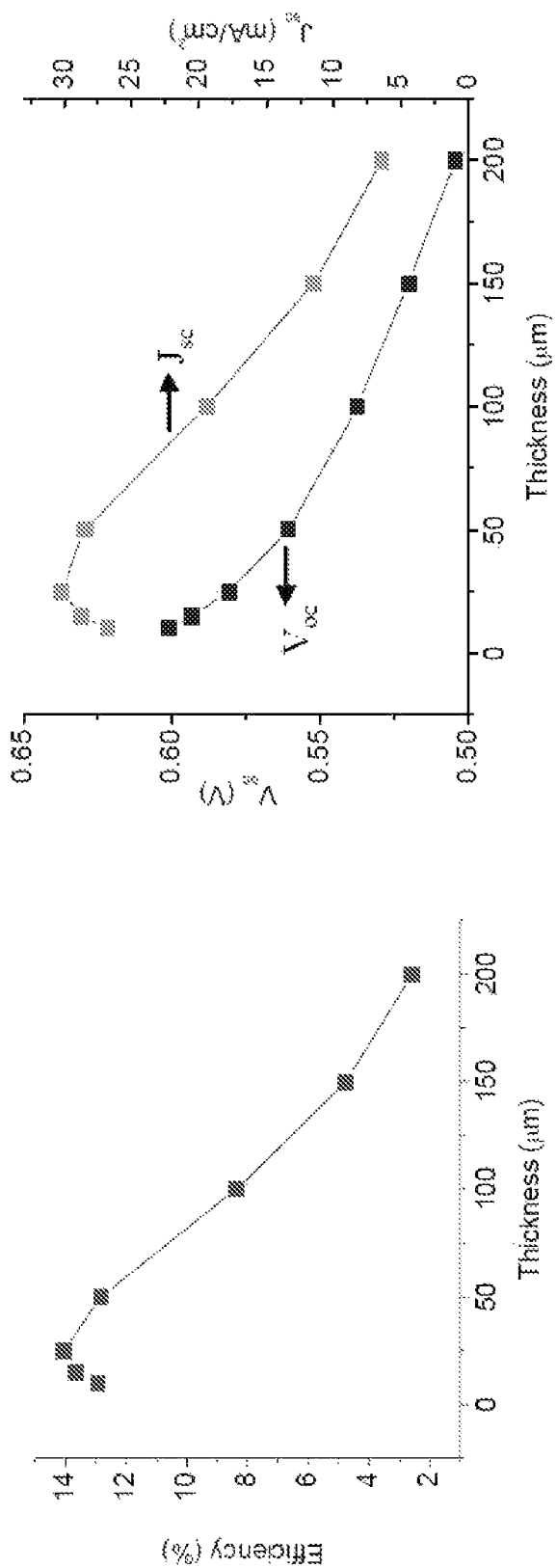
FIG. 29. The recovery in performance of the simulated solar cell, (a) efficiency (b) open-circuit voltage ($V_{oc}$) and short circuit current density ($J_{sc}$), as a function of device thickness.

Fixing the defect density at the highest level simulated ($10^{13}$ cm$^{-3}$) resulted in a device with 2.6% efficiency. The thickness of the absorber layer was then reduced from 200 μm to 10 μm and the simulation repeated for each thickness. The device parameters recovered well for the thinner device, reaching a maximum of 14.1% efficiency at 25 μm thickness and falling only slightly with further decreases in thickness to 10 μm (FIG. 29). The slight decrease could be correlated with insufficient optical absorption, even though the voltage continued to increase. Light trapping can further improve the result.

This experiment shows that a thin Si solar cell can significantly improve in the presence of detrimental defects relative to a thick device. It demonstrates that if one could practically manufacture 10 μm thick Si solar cells, one could both save dramatically on Si and use material containing more defects, including material of lower overall purity. An important point is that defects could be associated with low-quality Si crystals and/or with impurities. Thus, it might be equally valuable to use a thin electronicgrade Si manufactured by a faster or less expensive method that resulted in more crystal defects.

A further note related to the simulated result is that the majority of the recombination in the thick high-purity device and in the thin low purity devices is at the contacts. Therefore, one might expect that putting a minority carrier mirror at the contacts to prevent recombination there would further improve the results. This is the method used in the Sanyo HIT™ cells that employ amorphous Si contacts[34].

EXAMPLE 3

Fabrication of Si Microbar Cells (μb-cells)

Figure 30:
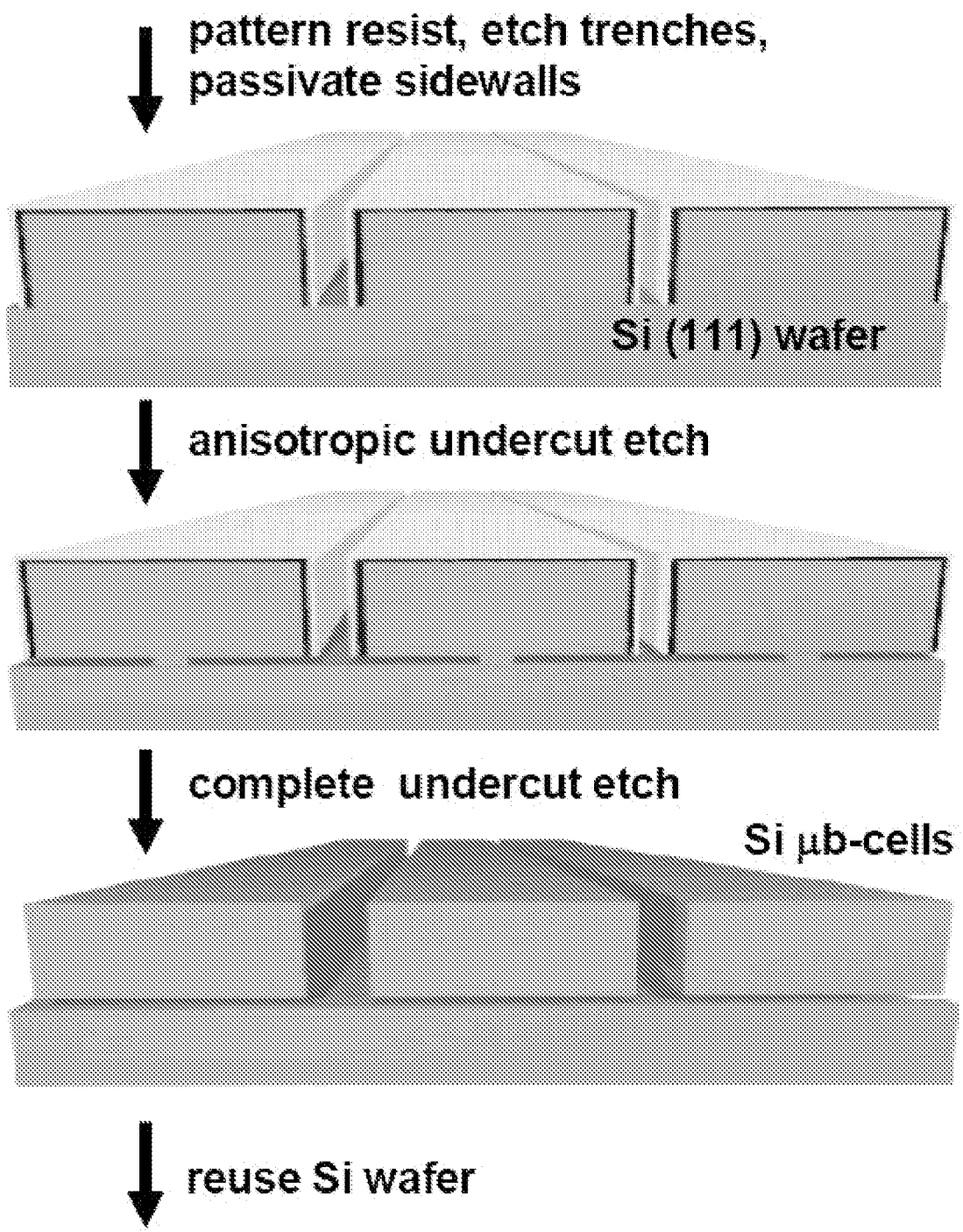
FIG. 30. Process for creating thin, monocrystalline silicon microbar cells from a bulk wafer.

An anisotropic wet etching process provides a simple means to create ultrathin, monocrystalline Si cells from bulk wafers of material. FIG. 30 shows the process for forming the thin Si[11,12], which begins with patterning of lines of resist on the surface of a (111) Si wafer. (Published data indicate no differences in efficiency for conventional cells made with (111) compared to (100) Si.[35,36]) A vertical trench etch followed by an anisotropic undercut etch (e.g. tetramethyl ammonium hydroxide, which etches along the <110> direction ~50× faster than other directions) yields bars or ribbons of Si that remain attached to the underlying wafer only at their ends. The vertical etch defines the thicknesses of the bars/ribbons; the patterning step defines the lengths, widths and spacings.

In this process, the etching procedures for the vertical trenches and undercuts yield structures that utilize up to 85% of the available Si. Doping techniques can be used naturally in this process to allow contacts either on the top and the bottom surfaces of these elements, or on just one side. In the former case, spinon dopants dope the top surface just before the first step in FIG. 30. The resist on the top and side surfaces of the etched bars then serves as a mask for spin-on doping of the underlying surfaces. This strategy does not increase the number of patterning steps beyond those needed to define the bars themselves. In an alternative approach that does involve additional steps, the top and bottom surfaces can be doped in a pattern that enables both contacts on the top sides of the bars. Each of the doped bars represents a functional solar cell, which we refer to as a microbar cell, μb-cell.

These μb-cells can be designed with thicknesses between 0.5 and 50 μm, with lengths between tens of μm's to tens of mm's and widths up to ~1 mm. The choice of doping strategy will be dictated by performance and ease of interconnection. To increase the effective optical thickness and reduce the surface reflection of our Si μb-cells, proven isotropic etching methods for effective light trapping and surface texturization are optionally implemented[37,38]. We note that the patterning steps in the processes of FIG. 30 can occur via soft lithographic methods[39-41], as a potentially low cost alternative to photolithography.

EXAMPLE 4

Integration of Solar Cells with Flexible Substrates

Figure 31:
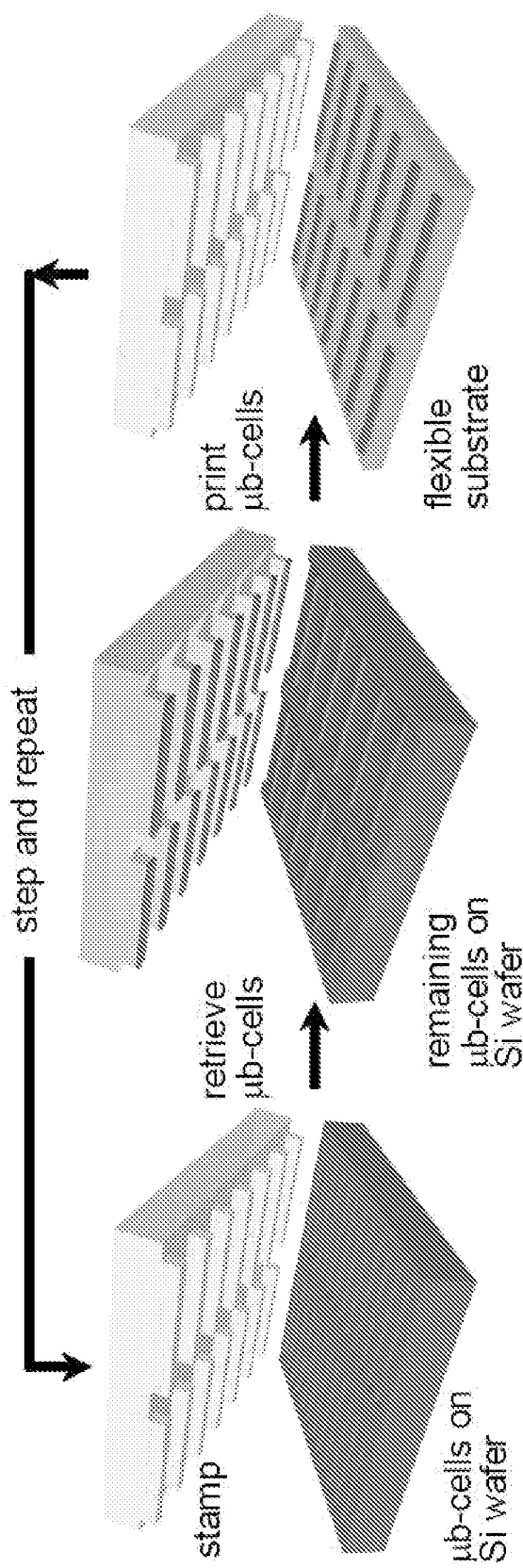
FIG. 31. Process for microtransfer printing arrays of Si μb-cells from a Si wafer to a flexible substrate. This process can transfer the cells in a selective fashion (e.g. every other cell) to enable the step-and-repeat fabrication of sparse layouts, suitable for use in concentrator modules.

A printing-like process that we refer to as microtransfer printing (μTP) provides a cost effective way to deliver large arrays of μb-cells in a geometrically expanded configuration to a flexible module substrate. FIG. 31 illustrates the approach. The method[12,22-24] uses soft, elastomeric stamps made of a material such as poly(dimethylsiloxane) (Dow Corning, Sylgard 184; PDMS) formed with the casting and curing procedures of soft lithography[39-41]. Resting such a stamp against the surface of a processed Si substrate leads to intimate, conformal contact with the top layer of µb-cells. This process occurs via van der Waals interactions between the stamp and the Si, thereby enabling contact in a soft, nondestructive fashion without external application of force[42-44]. Peeling back the stamp removes the top layer of pb-cells by controlled micro-fracture at their anchor points [27]. This step constitutes "inking" of the stamp with arrays of µb-cells. Printing the µb-cells from the stamp to the flexible substrate occurs through the use of a thin film, photocurable adhesive. Performing this process in a step-and-repeat procedure, with a stamp that has distributed, raised features of relief can populate large areas of the solar module substrate with µb-cells at sparse coverage. Existing procedures and tools enable transfer yields approaching 100%.

Figure 32:
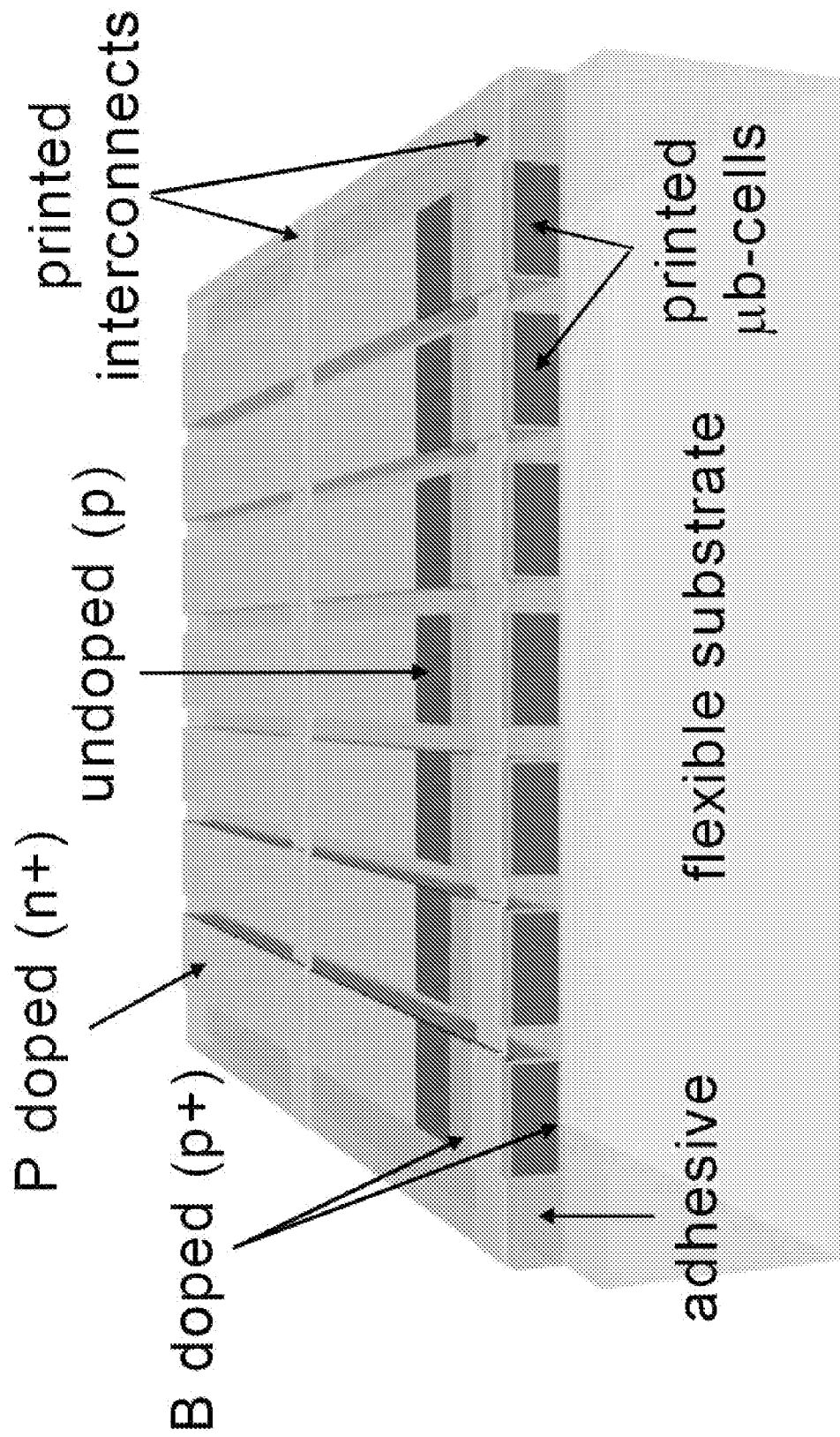
FIG. 32. Schematic illustration of Si μb-cells with a top contact design.

FIG. 32 provides a schematic illustration of the structure, for designs that involve contacts on a single side of the cells. For layouts that use contacts on the tops and bottoms of the cells, the printing occur directly onto a substrate with printed conducting lines. In both cases, highly reflecting surfaces on the substrate enable double-pass transmission of incidence light through the cells. Combining printed arrays of µb-cells with matching µoptic concentrators yields high performance modules with efficient utilization of Si, thereby enabling low cost.

The µb-cells will permit the design of an interconnection grid that optimizes the ratio of series to parallel connected cells based on the statistical failure modality (short or open). In this manner, one can reduce the overall failure rate and better maintain the designed operating point of the panel. To enhance bendability, the top packaging layers are designed to place the cells in near the neutral mechanical plane, based on approaches already demonstrated in flexible electronic devices of Rogers and Nuzzo[2-27]. The modules tend to be flexed only during transport and installation, and not during use, thereby relaxing some of the bending (e.g. fatigue, etc).

Figure 33:
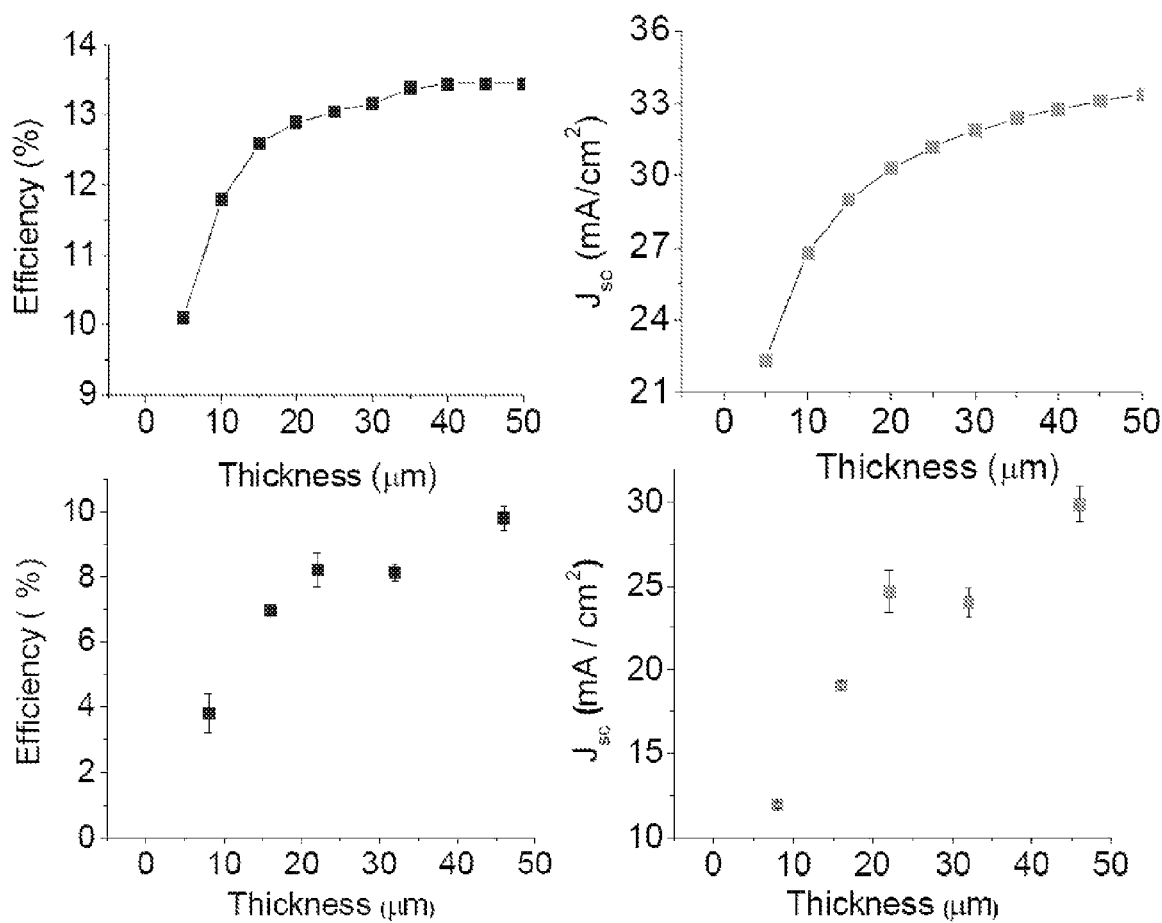
FIG. 33. PC1 D simulation results (top frames) and experimental measurements on μb-cells (bottom frames) for thickness dependent efficiency (left) and short-circuit current density (Jsc) (right).

Good efficiencies are obtained in pb-cells formed using the procedures described herein with semiconductor grade wafers. Initial thickness dependent studies of the cell parameters yield results that are consistent with modeling. For numerical investigations, we use the PC1 D® software package[43], for cells with layouts and parameters similar to those in FIG. 27. FIG. 33 (top frames) shows the computed dependence of efficiency and current density on thickness. The efficiency sharply increases with thickness in the range of 1-15 µm, but then changes only slightly from 20-30µm and reaches a plateau value at ~40 µm. The increasing efficiency with thickness in 1-15 µm range is mainly due to the increased absorption as the optical path length increases. As cell thickness further increases, however, the total absorption ceases to increase significantly, while the bulk recombination of minority carriers increases and the builtin electric field decreases. The result is a saturation of efficiency for thicknesses above 30-40 µm.

These trends have been verified experimentally using µb-cells fabricated according to procedures described previously. In particular, vertical type ($n^+$–p–$p^+$) µb-cells with various thicknesses (8, 16, 22, 32, and 46 µm), are fabricated from bulk wafers and then tested. As summarized in FIG. 33 (bottom frames), the measurements show efficiencies that increase sharply in the thickness range of 1~15 µm but only slightly increases after 20 µm, qualitatively consistent with simulation results. These results are obtained before applying a top ohmic contact, antireflection coating, and surface tex-turization, all of which might explain observed efficiencies that are somewhat lower than the simulated values. Overall, however, these simulation and experimental studies provide support for the use of monocrystalline Si cells with thicknesses in the 15-20 µm range, and likely substantially less through the incorporation of established schemes for light trapping.

Figure 34:
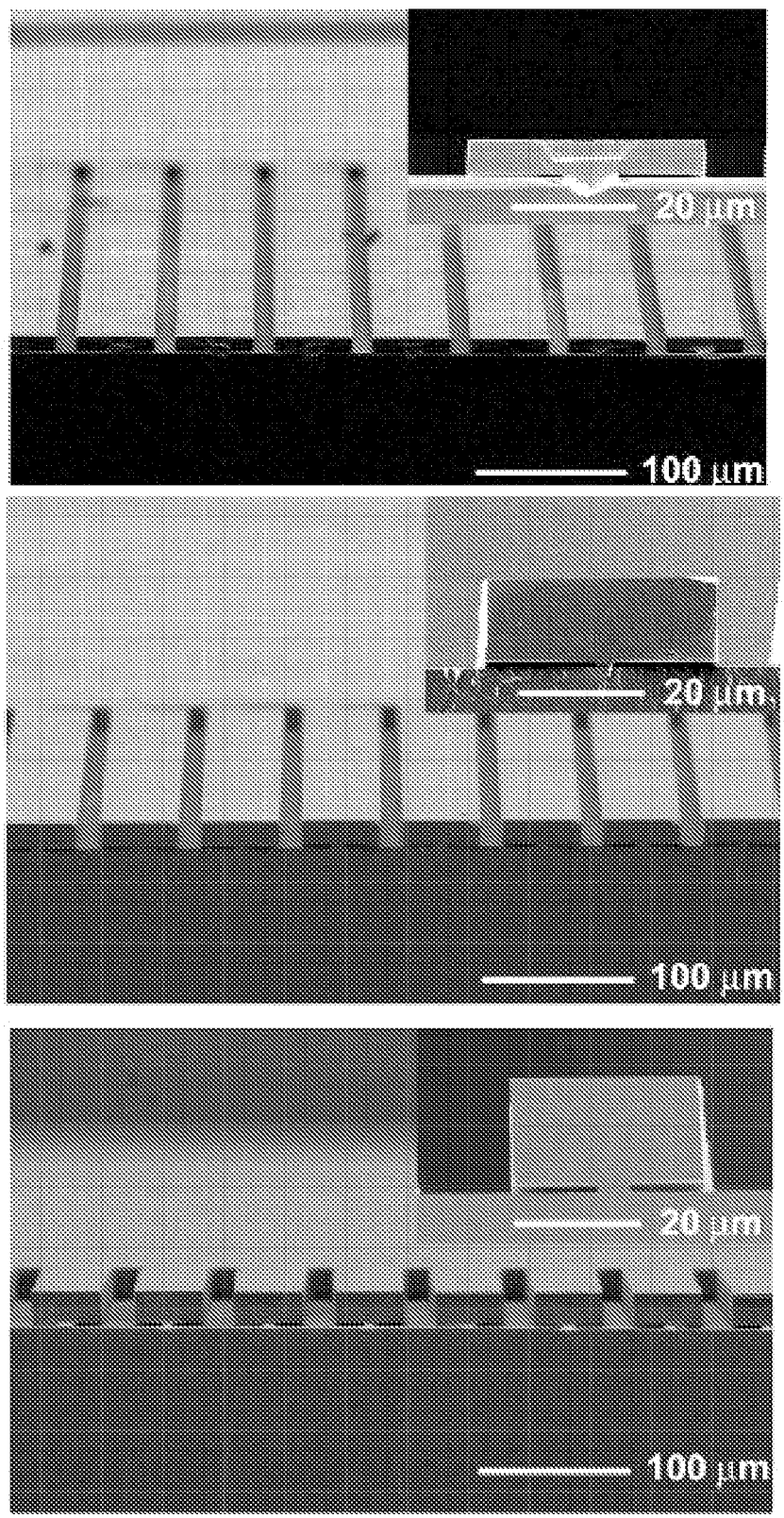
FIG. 34. Scanning electron micrographs of Si μb-cells with different thicknesses, collected shortly before complete undercut etching from the Si (111) source wafers.
Figure 35:
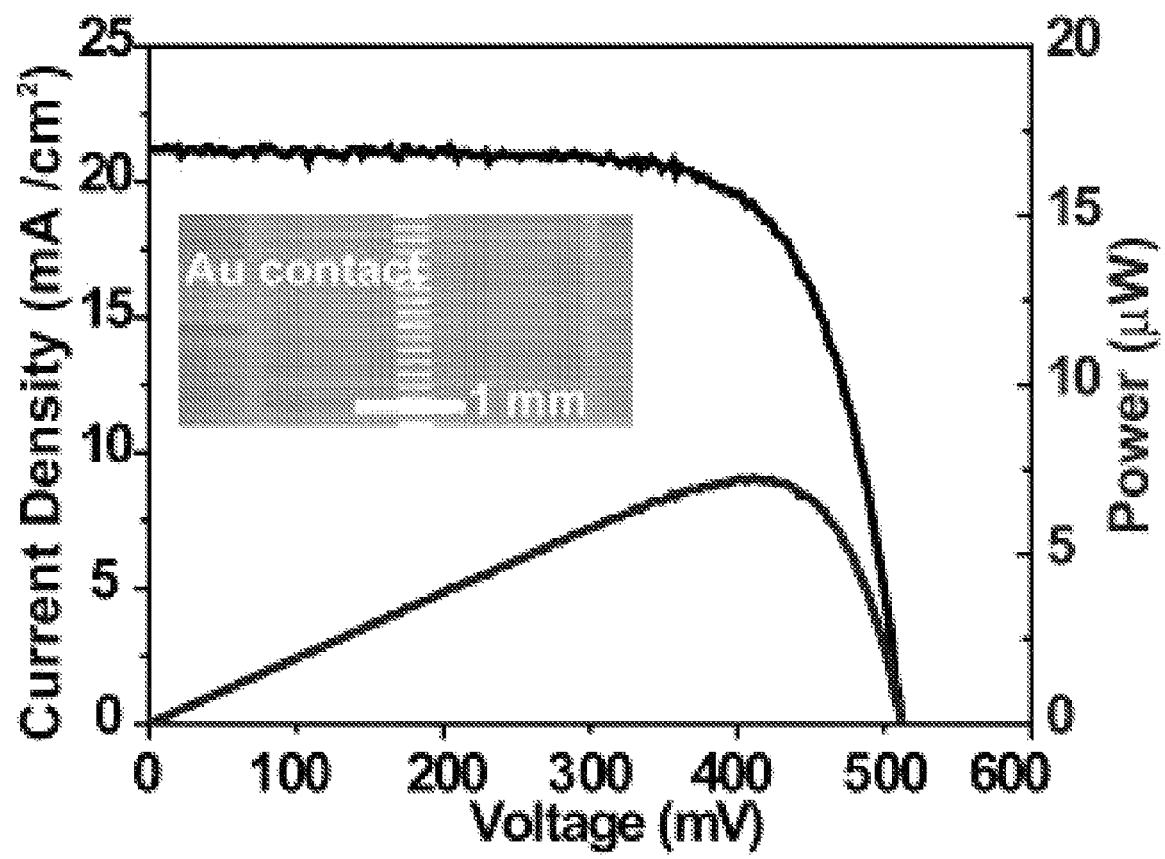
FIG. 35. Current density as a function of voltage for a set of Si μbcells. The efficiency is ~10%, in relatively unoptimized layouts without antireflection coatings and other elements.

The fabrication procedures for the cells have been demonstrated using extensions of techniques previously developed for electronics applications [2-27]. These methods allow systematic variations in the thicknesses of the cells, from values as small as 100 nm to several tens of microns, as described. FIG. 34 shows micrographs of representative examples, collected prior to complete etching, with thicknesses of ~0.5 µm, ~15 µm and ~20 µm. Suitable doping procedures can yield cells with contacts on the top and the bottom or on just one side. Optimized procedures enable efficiencies greater than 10% with thin Si, using either of these geometries. FIG. 35 shows electrical characteristics and an optical micrograph of pb-cells that have thicknesses of 20 µm, and exhibit efficiencies of ~9%, as determined with a Newport 1 kW full spectrum solar simulator. The light to the simulator is filtered with an air mass 0 as well as air mass 1.5 direct filters. The cells are tested under standard AM 1.5 conditions (1000 W/m$^2$) and the output is calibrated against a reference cell.

Printing, such as printing to flexible substrates, relies on an extensive body of recent work in flexible electronics [2-27]. Fully automated tools, with capabilities for force and position feedback control and substrate sizes up to 300×400 mm with registration accuracy of 1 µm are available. These systems have been used to form modules that incorporate arrays of µb-cells, on a variety of different types of substrates. Optimized composite stamps have been established for overlay accuracy and distortions below ~2 µm over areas of nearly 1 square foot. A "printhead" is positioned in a printer. A composite stamp resides at the end of the printhead, which also integrates a vision system for registration and load cells to provide force feedback control. Suitable anchor designs on µb-cells enable high yield printing with these systems. FIG. 25 shows printed Si µb-cells, on glass and on flexible plastic substrates, with transfer efficiencies >99%.

Table of References for Examples 2-4

[1] US Department of Energy, Energy Efficiency and Renewable Energy, Solar Energy Technologies Program, Multi-Year Program Plan, 2007-2011, January, 2006.

[2] J.-H. Ahn, H.-S. Kim, E. Menard, K. J. Lee, Z. Zhu, D.-H. Kim, R. G. Nuzzo J. A. Rogers, I. Amlani, V. Kushner, S. G. Thomas and T. Duenas, Bendable Integrated Circuits on Plastic Substrates by Use of Printed Ribbons of Single-Crystalline Silicon, *Applied Physics Letters* 90, 213501 (2007).

[3] Y. Sun and J. A. Rogers, Structural Forms of Single Crystal Semiconductor Nanoribbons for High-Performance Stretchable Electronics, *Journal of Materials Chemistry* 17, 832-840 (2007).

[4] K. J. Lee, M. A. Meitl, J.-H. Ahn, J. A. Rogers, R. G. Nuzzo, V. Kumar and I. Adesida, Bendable GaN High Electron Mobility Transistors on Plastic Substrates, *Journal of Applied Physics* 100, 124507 (2006).

[5] J.-H. Ahn, H.-S. Kim, K. J. Lee, S. Jeon, S. J. Kang, Y. Sun, R. G. Nuzzo and J. A. Rogers, Heterogeneous Three Dimensional Electronics Using Printed Semiconductor Nanomaterials, *Science* 314, 1754-1757 (2006).

[6] Y. Sun, W. M. Choi, H. Jiang, Y. Y. Huang and J. A. Rogers, Controlled buckling of Semiconductor Nanoribbons for Stretchable Electronics, *Nature Nanotechnology* 1, 201-207 (2006).

[7] Y. Sun, V. Kumar, I. Adesida and J. A. Rogers, Buckled and Wavy Ribbons of GaAs for High-Performance Electronics on Elastomeric Substrates, *Advanced Materials* 18, 2857-2862 (2006).

[8] N. C. Ko, A. Baca and J. A. Rogers, Bulk Quantities of Single-Crystal Silicon Micro-/Nanoribbons Generated from Bulk Wafers, *Nano Letters* 6(10), 2318-2324 (2006).

[9] Y. Sun, H.-S. Kim, E. Menard, S. Kim, I. Adesida and J. A. Rogers, Printed Arrays of Aligned GaAs Wires for Flexible Transistors, Diodes and Circuits on Plastic Substrates, *Small* 2(11), 1330-1334 (2006).

[10] J.-H. Ahn, H.-S. Kim, K. J. Lee, Z. Zhu, E. Menard, R. G. Nuzzo and J. A. Rogers, High Speed, Mechanically Flexible Single-Crystal Silicon Thin-Film Transistors on Plastic Substrates, *IEEE Electron Device Letters*, 27(6) 460-462 (2006).

[11] S. Mack, M. A. Meitl, A. J. Baca, Z.-T. Zhu, J. A. Rogers, Mechanically-Flexible Thin-Film Transistors that Use Ultrathin Ribbons of Silicon Derived From Bulk Wafers, *Applied Physics Letters* 88, 213101 (2006).

[12] A. J. Baca, M. A. Meitl, H. C. Ko, S. Mack, H.-S. Kim, J. Dong, P. M. Ferreira, J. A. Rogers, Printable Single-Crystal Silicon Micro/Nanoscale Ribbons, Platelets and Bars Generated from Bulk Wafers, *Advanced Functional Materials*, early view.

[13] Y. Sun, E. Menard J. A. Rogers, H.-S. Kim, S. Kim, G. Chen, I. Adesida, R. Dettmer, R. Cortez, and A. Tewksbury Gigahertz Operation in Mechanically Flexible Transistors on Plastic Substrates, *Applied Physics Letters* 88, 183509 (2006).

[14] D. Y. Khang, H. Jiang, Y. Huang and J. A. Rogers, A Stretchable Form of Single Crystal Silicon for High Performance Electronics on Rubber Substrates, *Science* 311, 208-212 (2006).

[15] K. Lee, J. Lee, H. Hwang, Z. Reitmeier, R. F. Davis, J. A. Rogers and R. G. Nuzzo, A Printable Form of Single Crystal Gallium Nitride for Flexible Optoelectronic Systems, *Small* 1(12), 1164-1168 (2005).

[16] Y. Sun, R. A. Graff, M. S. Strano and J. A. Rogers, Top Down Fabrication of Semiconductor Nanowires With Alternating Structures Along Their Transverse and Longitudinal Axes, *Small* 1(11), 1052-1057 (2005).

[17] Y. Sun, S. Kim, I. Adesida and J. A. Rogers, Bendable GaAs Metal-Semiconductor Field Effect Transistors Formed With Printed GaAs Wire Arrays on Plastic Substrates, *Applied Physics Letters* 87, 083501 (2005).

[18] E. Menard, R. G. Nuzzo and J. A. Rogers, Bendable Single Crystal Silicon Thin Film Transistors Formed by Printing on Plastic Substrates, *Applied Physics Letters* 86(9), 093507 (2005).

[19] Z. T. Zhu, E. Menard, K. Hurley, D. Y. Khang, R. G. Nuzzo and J. A. Rogers, Spin on Dopants for High-Performance Single-crystal Silicon Transistors on Flexible Plastic Substrates, *Applied Physics Letters* 86(13), 133507 (2005).

[20] Y. Sun, D.-Y. Khang, K. Hurley, R. G. Nuzzo and J. A. Rogers, Photolithographic Route to the Fabrication of Micro/Nanowires of III-V Semiconductors, *Advanced Functional Materials* 15(1), 30-40 (2005).

[21] Y. Sun and J. A. Rogers, Fabricating Semiconductor Nano/microwires and Transfer Printing Ordered Arrays of Them onto Plastic Substrates, *Nano Letters* 4(10), 1953-1959 (2004).

[22] E. Menard, K. J. Lee, D. Y. Khang, R. G. Nuzzo and J. A. Rogers, A Printable Form of Silicon for High Performance Thin Film Transistors on Plastic, *Applied Physics Letters* 84(26), 5398-5400 (2004).

[23] M. A. Meitl, Z.-T. Zhu, V. Kumar, K. J. Lee, X. Feng, Y. Y. Huang, I. Adesida, R. G. Nuzzo and J. A. Rogers, Transfer Printing by Kinetic Control of Adhesion to an Elastomeric Stamp, *Nature Materials* 5(1), 33-38 (2006).

[24] K. Lee, M. J. Motala, M. A. Meitl, W. R. Childs, E. Menard, J. A. Rogers, R. G. Nuzzo and A. Shim, Large Area, Selective Transfer of Microstructured Silicon (μs-Si): A Printing-based Approach to High Performance Thin Film Transistors Supported on Flexible Substrates, *Advanced Materials* 17, 2332-2336 (2005).

[25] S.-H. Hur, D.-Y. Khang, C. Kocabas, and J. A. Rogers, Nanotransfer Printing by Use of Noncovalent Surface Forces: Applications to Thin-film Transistors That Use Single-walled Carbon Nanotube Networks and Semiconducting Polymers, *Applied Physics Letters* 85(23), 5730-5732 (2004).

[26] E. Menard, L. Bilhaut, J. Zaumseil, and J. A. Rogers, Improved Chemistries, Thin Film Deposition Techniques and Stamp Designs for Nanotransfer Printing, *Langmuir* 20(16), 6871-6878 (2004).

[27] M. A. Meitl, X. Feng, J. Dong, E. Menard, P. M. Ferreira, Y. Huang and J. A. Rogers, Stress Focusing for Controlled Fracture in Microelectromechanical Systems, *Applied Physics Letters* 90, 083110 (2007).

[28] B. Roedern, Status of Amorphous and Crystalline Thin-Film Silicon Solar Cell Activities, *NCPV and Solar Program Review*, NREL/CD-520-33586, pp 552-555, 2003.

[29] B. Nelson, H. Branz, R. Crandall, E. Iwaniczko, A. Mahan, P. Stradins, Q. Wang, and Y. Xu, Project Summary of the NREL Amorphous Silicon Team, *NCPV and Solar Program Review*, NREL/CD-520-33586, pp 825-828, 2003.

[30] B. Nelson, H. Atwater, B. Roedern, J. Yang, P. Simis, X. Deng, V. Dalal, D. Carlson and T. Wang, Amorphous and Thin-Film Silicon, *NCPV and Solar Program Review*, NREL/CD-520-33586, pp 583-585, 2003.

[31] R. H. Bossert, C. J. J. Tool, J. A. M. van Roosmalen, C. H. M. Wentink and M. J. M. De Vaan, Thin Film Solar Cells: Technology Evaluation and Perspectives, *ECN*, May 2000

[32] A. W. Blakers, P. N. K. Deenapanray, V. Everett, E. Franklin, W. Jellett and K. J. Weber, Recent Developments in Sliver Cell Technology, 20th EC PV Solar Energy Conference, Barcelona, June 2005.

[33] M. Burgelman, J. Verschraegen, S. Degrave and P. Nollet, Modeling Thin-Film PV Devices, *Progress In Photovoltaics* 12, 143-153 (2004).

[34] M. Taguchi, et al. HIT (TM) cells—High-Efficiency Crystalline Si Cells With Novel Structure, *Progress In Photovoltaics* 8, 503-513 (2000).

[35] A. Ebong, V. Upadhyaya, B. Rounsaville, D. S. Kim, V. Meemongkolkiat, A. Rohatgi, M. M. Al-Jassim, K. M. Jones, and B. To. Rapid Thermal Processing of High Efficiency N-Type Silicon Solar Cells With Al back Junction, 14th World Conference on Photovoltaic Energy Conversion, Hawaii, USA; May 7-12, 2006

[36] C. Khadilkar, S. Sridharan, D. Gnizak, T. Pham, S. Kim, and A. Shaikh, 20th European Photovoltaic Solar Energy Conference and Exhibition, Barcelona, Spain; Jun. 6-10, 2005

[37] D. S. Ruby, S. H. Zaidi, S, Narayanan, B. M. Damiani and A. Rohatgi, Rie—Texturing of Multicrystalline Silicon Solar Cells, *Solar Energy Materials & Solar Cells* 74, 133.137 (2002)

[38] K. J. Weber and A. W. Blakers, A Novel Silicon Texturization Method Based on Etching Through a Silicon Nitride Mask, *Progress in Photovoltaics: Research and Applications* 13, 691-695 (2005)

[39] Y. Xia, J. A. Rogers, K. E. Paul and G. M. Whitesides, Unconventional Methods for Fabricating and Patterning Nanostructures, *Chemical Reviews* 99(7), 1823-1848 (1999)

[40] E. Menard, J. Park, S. Jeon, D. Shir, Y. Nam, M. Meitl and J. A. Rogers, Micro and Nanopatterning Techniques for Organic Electronic and Optoelectronic Systems, *Chemical Reviews* 107, 1117-1160 (2007).

[41] H. H. Lee, E. Menard, N. G. Tassi, J. A. Rogers and G. B. Blanchet, Fabrication of Large Area Stamps, Moulds, and Conformable Photomasks for Soft Lithography, *Journal of Nanoengineering and Nanosystems* 218, 1-5 (2005).

[42] Y. G. Y. Huang, W. X. Zhou, K. J. Hsia, E. Menard, J. U. Park, J. A. Rogers and A. G. Alleyne, Stamp Collapse in Soft Lithography, *Langmuir* 21(17), 8058-8068 (2005).

[43] W. Zhou, Y. Huang, E. Menard, N. R. Aluru, J. A. Rogers and A. G. Alleyne, Mechanism for Stamp Collapse in Soft Lithography, *Applied Physics Letters* 87, 251925 (2005).

[44] K. J. Hsia, Y. Huang, E. Menard, J.-U. Park, W. Zhou, J. A. Rogers and J. M. Fulton, Collapse of Stamps for Soft Lithography due to Interfacial Adhesion, *Applied Physics Letters* 86(15), 154106 (2005).

[45] D. A. Clugston and P. A. Basore, Modelling Free-Carrier Absorption in Solar Cells, *Progress In Photovoltaics* 5, 229-236 (1997).

EXAMPLE 5

Compact Monocrystalline Silicon Solar Modules with High Voltage Outputs and Mechanically Flexible Designs Silicon continues to represent one of the most compelling materials for solar energy conversion; it remains the dominant choice for commercial photovoltaic applications. Research in this area focuses mainly on enhancing the conversion efficiency of non-crystalline Si, reducing the materials usage per unit power output and relaxing the requirements on purity. Thin films of amorphous or microcrystalline Si and thin sheets of single crystalline Si enable efficient materials utilization. Recently, we reported an alternative strategy that involves production of ultrathin and small Si solar cells (i.e. μ-cells) from bulk, commodity wafers by use of lateral anisotropic etching techniques, followed by assembly of these μ-cells into interconnected arrays by use of soft, transfer printing methods. Here we describe modules that exploit large collections of such μ-cells printed to allow series electrical interconnection for compact modules (0.5 cm×0.5 cm) that are capable of producing high voltage outputs. When formed on thin sheets of plastic in optimized neutral mechanical plane designs, these modules can bend to radius of curvature as small as ~2 mm without any measureable changes in the mechanical or electrical properties. These devices provide a relatively simple route to low-cost, high-voltage flexible photovoltaic device, suitable for portable and wearable electronic applications.

A type of compact (~$cm^2$) high voltage photovoltaic module that utilizes large collections of ultrathin (~15 μm), small (~50 μm wide, ~1 mm long) silicon solar cells was fabricated and characterized. Integration on thin sheets of plastic yielded small, flexible modules with per-cell efficiencies of ~8%, voltage outputs >200 V and maximum power outputs >1.5 mW. In the past several years the photovoltaic (PV) market has experienced large growth, with Si (in various crystalline forms) constituting ~90% of the market.[1] Enhancing the conversion efficiency of non-crystalline Si,[2] reducing the usage of Si per unit power output[3] and relaxing purity[4] requirements on Si feedstock represent some priorities for research. Routes for reducing silicon usage and facilitating large area processing, both with the potential to lower costs, include use of ultrathin layers of either amorphous or microcrystalline Si.[5] The main disadvantage of these approaches is the diminished performance of the associated solar cells compared to similar devices formed with monocrystalline Si. One alternative strategy to large area, materials efficient cells relies on anisotropic etching procedures to create thin 'slivers' of silicon from bulk wafers, followed by mechanical manipulation to form modules.[6] Recently, we reported a complementary approach that first creates ultrathin bars, membranes or ribbons of silicon from the near surface of a wafer, using procedures originally developed for thin silicon electronic devices,[7,8] and then assembles these elements, each configured as a separate, functional solar cell (i.e. a microcell, or μ-cell), in ordered arrays on a target substrate by use of a soft printing process.[3] These techniques allow for the fabrication of compact modules out of hundreds or thousands of such μ-cells, with good efficiencies and the capacity to exploit Si in unconventional module designs that offer, as examples, mechanical flexible, and even stretchable formats, semitransparent layouts, and ultralow profile microconcentrator designs.

An important additional feature of the μ-cell module construction introduced here is the relative ease with which the outputs can be configured for high voltage. Such layouts can be important for driving devices that require high voltage (e.g. microelectromechanical systems and certain classes of electronic paper technologies), and they can also be exploited to reduce series resistance losses (i.e. directly proportional to the square of the output current times the resistance). Recent reports describe small scale modules with high voltage outputs based on thin films of polymer[9] and crystalline Si[10] as active materials. The former case employs a structured design that offers the possibility for cost effective, mechanically flexible modules, but with efficiency and long term reliability limited by the polymers. The latter example involves the use of a rigid, silicon-on-insulator wafer whose cost is unlikely to be compatible with most applications. Neither system offers the combination of small scale design, robust high performance operation and mechanical properties required of some of the most demanding (i.e. mechanically) or interesting applications.

The fabrication for the μ-cells reported here use processes whose details are described elsewhere.[3] Briefly, the process begins with a p-type (111) Czochralski Si wafer (3 inch diameter, 1-10 Ωcm, 450 μm thickness, Virginia Semiconductor) coated with a layer of $SiO_2$ (600 nm) formed by plasma-enhanced chemical vapour deposition (PlasmaTherm SLR). Inductively coupled plasma reactive-ion etching (STS ICP-RIE)[8] formed trench structures through the silicon, with typical depths of 15-20 μm and widths of 50 μm. Selective doping of emitter and bottom contact areas used solid-state sources of boron (BN-1250, Saint Gobain) and phosphorus (PH-1000N, Saint Gobain) with temperatures of 1000° C. under $N_2$ atmosphere for 30 min (boron) and 10 min (phosphorus). A photolithographically patterned 900 nm thick $SiO_2$ layer served as a mask to pattern the doped regions. Protecting the top surfaces and sidewalls with bilayer mask of $SiO_2/Si_3N_4$ followed by immersion in a KOH bath resulted in undercut etching of the μ-cells, leaving them tethered to the underlying wafer only at their end points and ready for printing and integrating into modules as described subsequently. Light and dark current (I)—voltage (V) measurements of μ-cells were carried out at room temperature using a d.c.

source meter (model 2400, Keithley) and a 1000 W full-spectrum solar simulator. The reported figures of merit are based on the spatial dimensions of the μ-cells, without accounting for coupling of light through the edges. In all cases, we used a diffusive backside reflector during measurements. Electrical characterization of performance during bending involved mounting of a complete module on to the outer surfaces of glass tubes with radii of 2 and 4 mm. Light and dark I-V measurements at various bending geometries and bending radii are performed at ambient conditions. Fatigue tests are also performed, where one cycle corresponds to bending a module and then relaxing it to the flat state.

Figure 36:
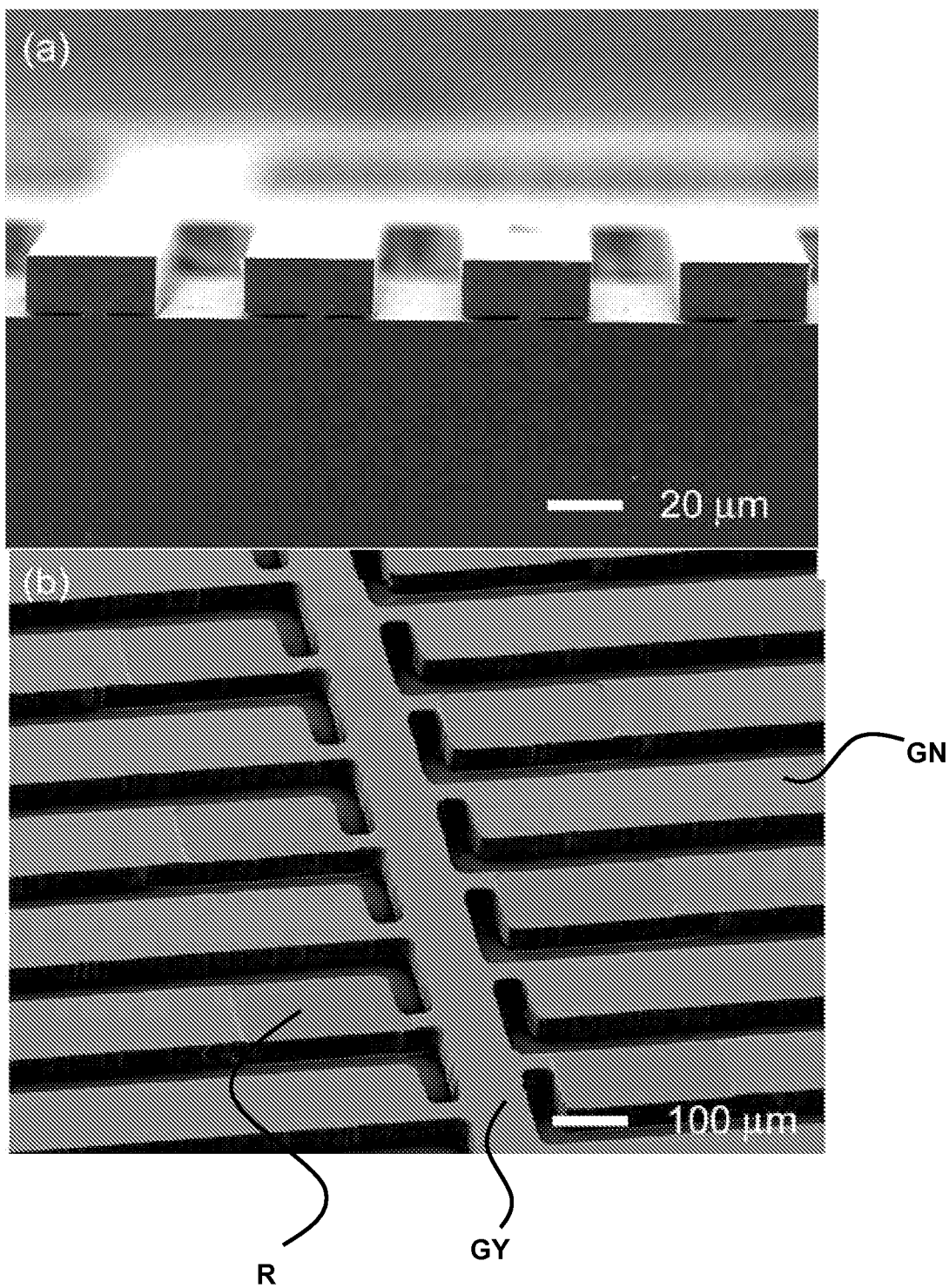
FIG. 36 A SEM cross-sectional view of partially undercut microcells. (B) Colorized SEM image of an array of microcells on a source wafer, ready for printing illustrating the selective doping areas and microcell layout. Green regions (labeled GN) correspond to phosphorous doped area ($n^+$), red regions (labeled R) are boron doped area ($p^+$) and gray areas (labeled GY) are un-doped Si.

FIG. 36 shows a scanning electron microscope (SEM) image of partially undercut μ-cells, tethered to the host wafer via anchor points at their ends; the widths, lengths and thicknesses were ~50 μm, ~1.5 mm and ~15 μm, respectively. The μ-cell layouts in these cases involved p+ and n+ doped regions that alternate from cell to cell, as shown in the SEM image in FIG. 36B. The green, red and grey areas labeled GN, R and GY, respectively, represent phosphorus doped regions (1.35 mm long), boron doped regions (0.15 mm long), and non-doped regions (0.05 mm), respectively. This design provides access for top side contacts, thereby facilitating the wiring of individual cells for metal interconnection in series, in a monolithic fashion.

Figure 37:
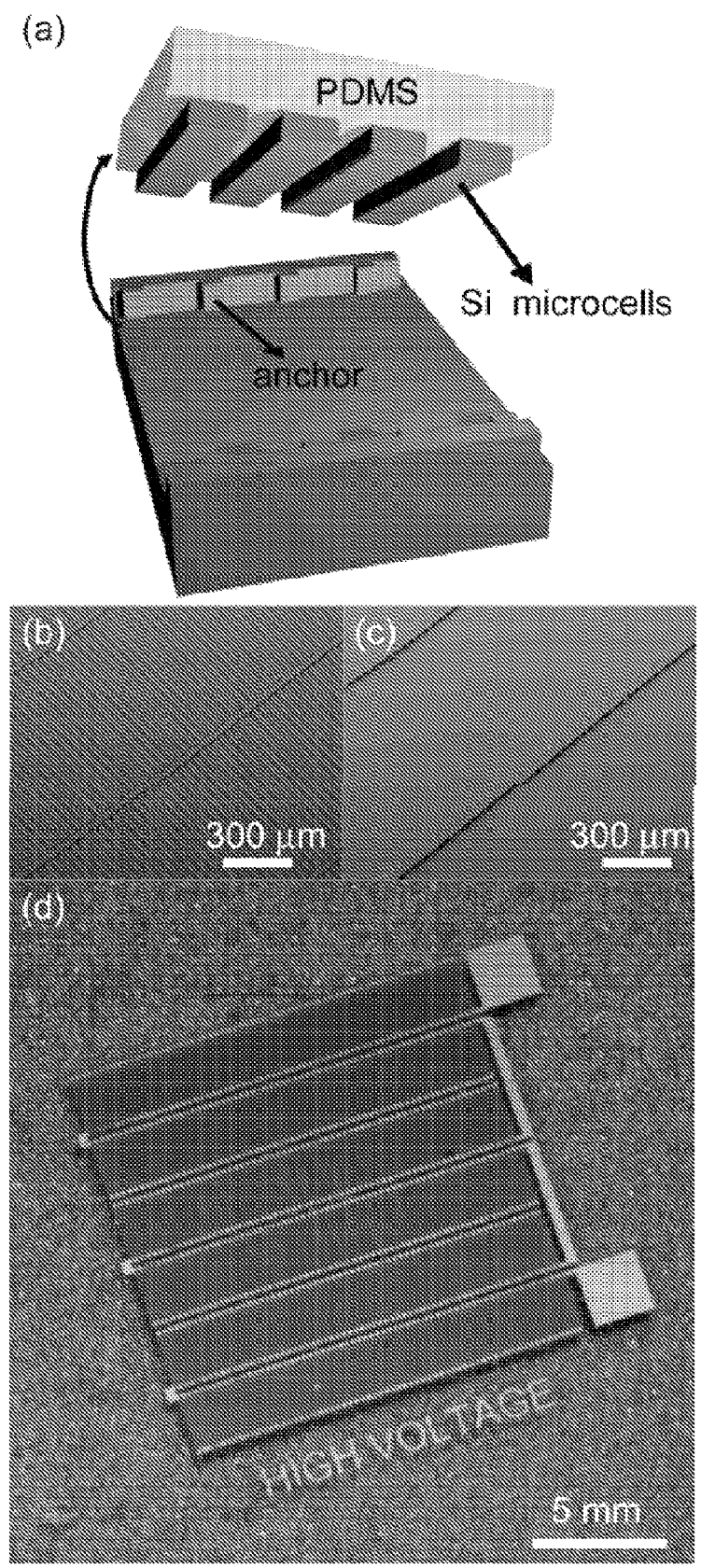
FIG. 37 (a) Schematic illustration of the transfer printing process used to fabricate high voltage PV minimodules. SEM image of fully undercut μ-cells tethered onto a Si wafer ready for printing (b) and (c) SEM image of the Si wafer after retrieval of the μ-cells. (d) Optical image of a completed minimodule consisting of printed microcell arrays metal interconnected in series by Cr/Au metal grid lines.

FIG. 37A provides a schematic illustration of transfer printing μ-cells (via an elastomeric stamp; PDMS) for integration into modules. The μ-cells are tethered onto the host wafer via anchor points[11] as illustrated in FIG. 37B. Placing the PDMS stamp on the surface of the μ-cells, followed by quickly lifting the stamp,[12] removes the μ-cells from the host wafer (FIG. 37C). The PDMS stamp is used to print the cells onto a layer (~30 μm) of photocurable polyurethane (NOA 61; Norland Optical Adhesive) spin coated onto a glass slide (carrier substrate). Metallization via sputter coating of Cr/Au (5/600 nm) followed by photolithography and etching of the exposed metal defined interconnect wiring. For flexible systems, a second layer of NOA (30μm thick) cast on top of the printed arrays placed the fragile elements (i.e., metal and Si) close to the neutral mechanical plane of modules completed by removal from the carrier substrate. FIG. 37B illustrates a module consisting of 768μ-cells connected in series. The metallization factor, as defined as the amount of metal covering the emitter region, for this layout is ~11%.

Figure 38:
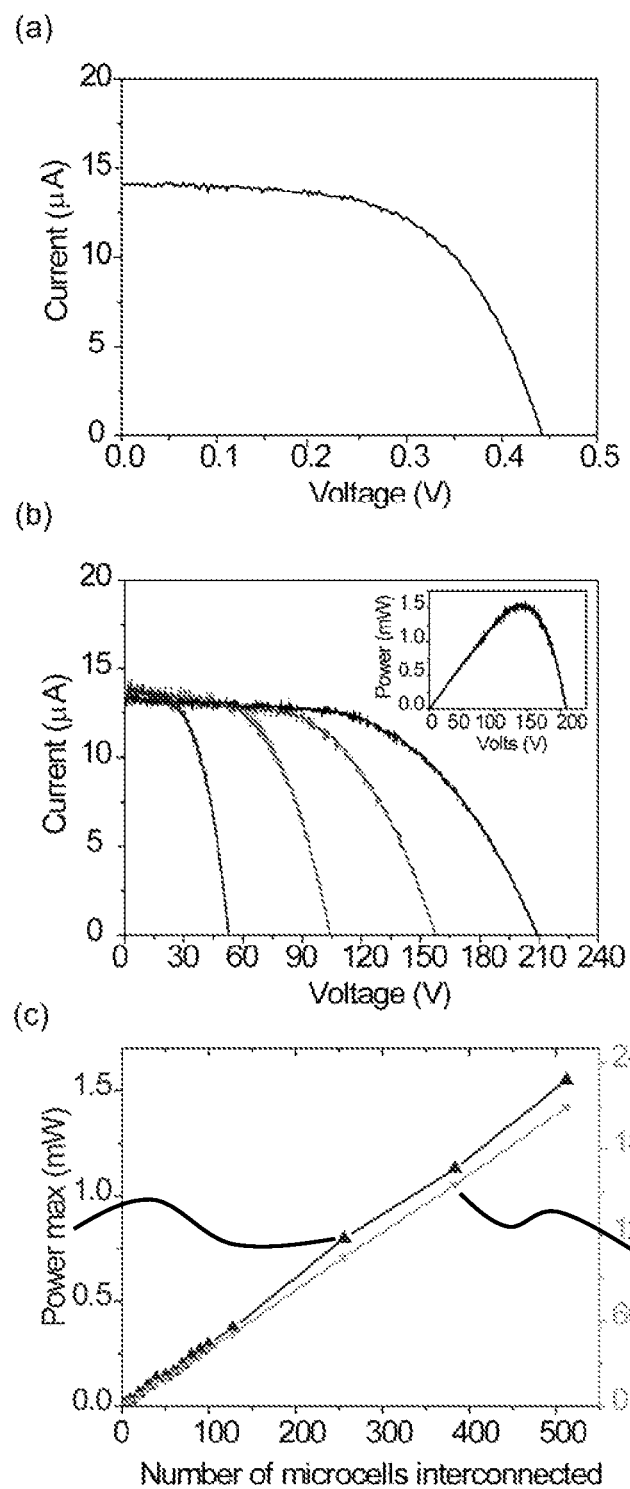
FIG. 38 (a) Current-Voltage characteristics of an individual high voltage Si microcell. (b) Current-Voltage characteristics of rows of Si microcells metal interconnected in series. Inset depicts the maximum power output of 512 microcells. (c) Scaling properties for voltage and power outputs of different microcells interconnected in series.

FIG. 38A shows the IV characteristics of a typical, individual μ-cell. The solar conversion efficiency varied between 6-8% with open circuit voltages ($V_{oc}$) between 0.44-0.48 V, current densities of 20-23 mA/cm2, maximum power ($P_{max}$) output of 5-6 μW and fill factors of 0.68-0.69. FIG. 38B shows the IV characteristics for different numbers of rows of μ-cells (128μ-cells per row) connected in series. An individual row fabricated in this way shows voltage outputs of ~51 V and 0.3 mW. As shown in FIG. 38B, increasing the number of rows leads to systematic and expected changes in the characteristics, with voltage outputs of 104 V, 155 V and 209 V for 2, 3, 4 rows, respectively. Silicon solar cells with conventional dimensions would require much larger areas to generate the voltages produced here. The inset in FIG. 38B shows the maximum power (>1.5 mW) from a 0.5 cm×0.5 cm module composed of 512μ-cells. FIG. 38C presents the scaling properties of the number of μ-cells interconnected in series and the corresponding voltage and maximum power outputs. The results scale in an almost linear fashion, as expected. Such arrays of μ-cells can also, of course, be wired in parallel for high current applications, therefore allowing for a wide range of voltage and current requirements depending on the target application.

Figure 39:
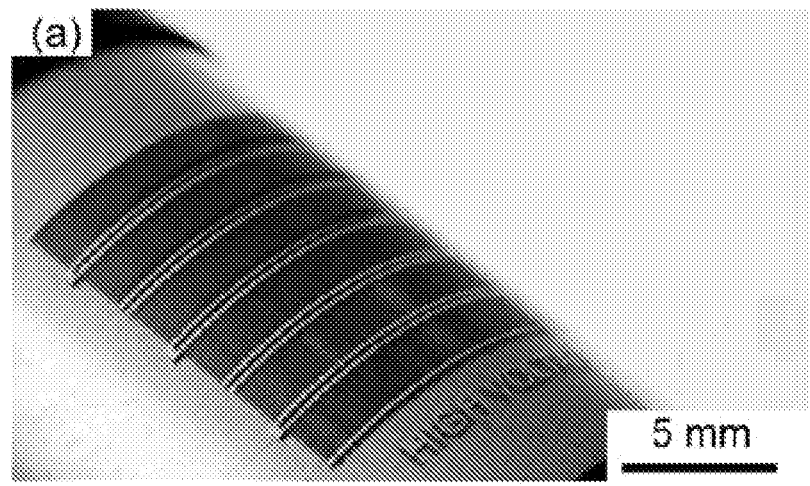
FIG. 39 (a) Optical micrograph of a flexible high voltage module conformally wrapped a glass tube. (b) Current-Voltage characteristics of high voltage minimodule in un-bent flat state, bent along the cell width and the metal interconnect pad width and under a twisting deformation (45°).
Figure 39:
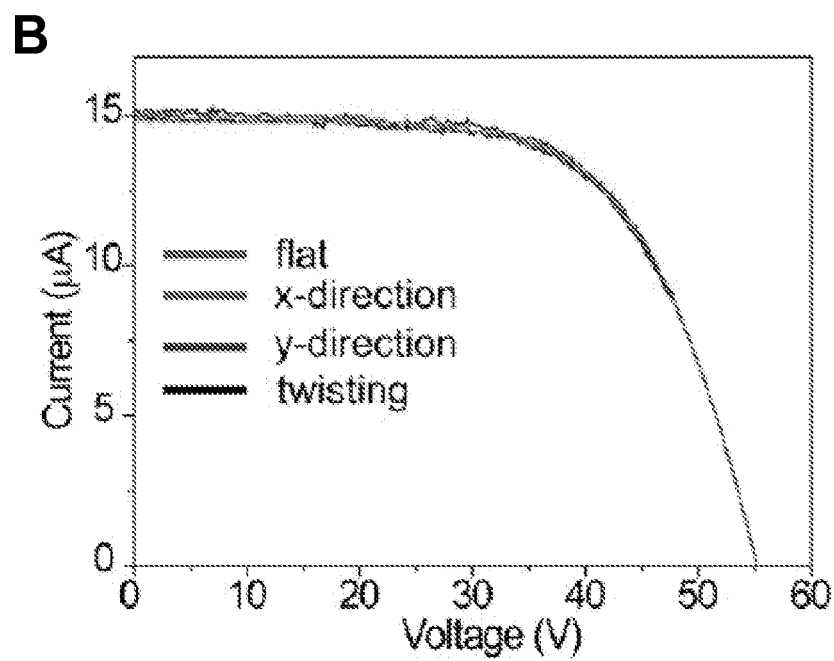

A unique aspect of the printing approach to integration is the ability to assemble μ-cells on sheets of plastic, in a scalable, deterministic and high throughput manner, for the fabrication of flexible and rollable PV modules, in optimized neutral mechanical layouts. FIG. 39A shows an optical image of a high voltage flexible PV module conformally wrapped around a glass tube with a radius of curvature of ~4 mm. Analytical modeling based on experimental structures and geometry layouts shows that this design leads to maximum strains of less than 0.3% in the μ-cells and metal interconnects for bend radii of 2 mm. Finite element modeling provides the distribution of strain for outward bending to a radius of curvature of 4 mm. FIG. 39B shows the IV characteristics of such modules in a flat state (un-bent), bent along (x-direction) and perpendicular (y-direction) to the interconnect direction and under a twisting deformation) (45°. The results in FIG. 39B and mechanical fatigue test of up to 1000 cycles show little or no changes in the IV characteristics, consistent with the analytical modeling results.

In conclusion, a new compact Si microcell module with high voltage outputs and mechanically flexible design is demonstrated. The small scale microstructured Si microcell leads to small scale PV modules with voltage and power outputs >200V and >1.5 mW, respectively. Printed arrays onto flexible polymer sheets allow for flexible devices with deformation of upwards to 2 mm without changes in the solar cell figures of merit. Further optimization of the cell design and parameters and application to other unusual module layouts is currently under study.

REFERENCES

1 D. M. Bagnall and M. Boreland, *Energy Policy,* 2008, 36, 4390.
2 Y. Sobajima, S, Nakano, M. Nishino, Y. Tanaka, T. Toyama, and H. Okamoto, *J. Non-Cryst. Solids,* 2008, 354, 2407.
3 J. Yoon, A. J. Baca, S. I. Park, P. Elvikis, J. B. Geddes, L. F. Li, R. H. Kim, J. L.Xiao, S. D. Wang, T. H. Kim, M. J. Motala, B. Y. Ahn, E. B. Duoss, J. A. Lewis, R. G. Nuzzo, P. M. Ferreira, Y. G. Huang, A. Rockett, and J. A. Rogers, *Nat. Mater.,* 2008, 7, 907.
4 S. Pizzini, *Appl. Phys. A-Mater. Sci. Process.,* 2009, 96, 171.
5 L. V. Mercaldo, M. L. Addonizio, M. Della Noce, P. D. Veneri, A. Scognamiglio, and C. Privato, *Appl. Energy,* 2009, 86, 1836.
6 Andrew William et al., *Sol. Energy Mater. Sol. Cells,* 2006, 90, 3422.
7 A. J. Baca, J. H. Ahn, Y. Sun, M. A. Meitl, E. Menard, H. S. Kim, W. M. Choi, D. H. Kim, Y. Huang, and J. A. Rogers, *Angew. Chem.-Int. Edit.,* 2008, 47, 5524; H. C. Ko, A. J. Baca, and J. A. Rogers, *Nano Lett.,* 2006, 6, 2318.
8 A. J. Baca, M. A. Meitl, H. C. Ko, S. Mack, H. S. Kim, J. Y. Dong, P. M. Ferreira, and J. A. Rogers, *Adv. Funct. Mater.,* 2007, 17, 3051.
9 M. Niggemann, W. Graf, and A. Gombert, *Adv. Mater.,* 2008, 20, 4055.
10 . P. Ortega, S. Bermejo, and L. Castaner, *Prog. Photovoltaics,* 2008, 16, 369.
11 M. A. Meitl, X. Feng, J. Y. Dong, E. Menard, P. M. Ferreira, Y. G. Huang, and J. A. Rogers, *Appl. Phys. Lett.,* 2007, 90.

12 M. A. Meitl, Z. T. Zhu, V. Kumar, K. J. Lee, X. Feng, Y. Y. Huang, I. Adesida, R. G. Nuzzo, and J. A. Rogers, *Nat. Mater.*, 2006, 5, 33.

STATEMENTS REGARDING INCORPORATION BY REFERENCE AND VARIATIONS

U.S. patent application Ser. Nos. 11/981,380, 11/851,182, 61/084,045, 11/115,954, 11/145,574, 11/145,542, 11/675, 659, 11/465,317, 11/423,287, 11/423,192, and 11/421,654 are hereby incorporated by reference to the extent not inconsistent with the present description.

All references throughout this application, for example patent documents including issued or granted patents or equivalents; patent application publications; and non-patent literature documents or other source material; are hereby incorporated by reference herein in their entireties, as though individually incorporated by reference, to the extent each reference is at least partially not inconsistent with the disclosure in this application (for example, a reference that is partially inconsistent is incorporated by reference except for the partially inconsistent portion of the reference).

The terms and expressions which have been employed herein are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments, exemplary embodiments and optional features, modification and variation of the concepts herein disclosed may be resorted to by those skilled in the art, and that such modifications and variations are considered to be within the scope of this invention as defined by the appended claims. The specific embodiments provided herein are examples of useful embodiments of the present invention and it will be apparent to one skilled in the art that the present invention may be carried out using a large number of variations of the devices, device components, methods steps set forth in the present description. As will be obvious to one of skill in the art, methods and devices useful for the present methods can include a large number of optional composition and processing elements and steps.

Every formulation or combination of components described or exemplified herein can be used to practice the invention, unless otherwise stated.

Whenever a range is given in the specification, for example, a temperature range, a size range, a time range, or a composition or concentration range, all intermediate ranges and subranges, as well as all individual values included in the ranges given are intended to be included in the disclosure. It will be understood that any subranges or individual values in a range or subrange that are included in the description herein can be excluded from the claims herein.

All patents and publications mentioned in the specification are indicative of the levels of skill of those skilled in the art to which the invention pertains. References cited herein are incorporated by reference herein in their entirety to indicate the state of the art as of their publication or filing date and it is intended that this information can be employed herein, if needed, to exclude specific embodiments that are in the prior art. For example, when composition of matter are claimed, it should be understood that compounds known and available in the art prior to Applicant's invention, including compounds for which an enabling disclosure is provided in the references cited herein, are not intended to be included in the composition of matter claims herein.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. In each instance herein any of the terms "comprising", "consisting essentially of" and "consisting of" may be replaced with either of the other two terms. The invention illustratively described herein suitably may be practiced in the absence of any element or elements, limitation or limitations which is not specifically disclosed herein.

One of ordinary skill in the art will appreciate that starting materials, biological materials, reagents, synthetic methods, purification methods, analytical methods, assay methods, and biological methods other than those specifically exemplified can be employed in the practice of the invention without resort to undue experimentation. All art-known functional equivalents, of any such materials and methods are intended to be included in this invention. The terms and expressions which have been employed are used as terms of description and not of limitation, and there is no intention that in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

TABLE 1

| | |
|---|---|
| Background materials (p) | P-type boron doped Si (resistivity: 30 Ω · cm) |
| Emitter doping (n+) | Phosphorous, $4 \times 10^{20}$ cm$^{-3}$, 0.25 μm |
| Base doping (p+) | Boron, $1.8 \times 10^{20}$ cm$^{-3}$, 1.8 μm |
| Bulk recombination life time | 7.208 ms for both electrons and holes |
| Front/back surface recombination velocity | $10^6$ cm/s for both electrons and holes |
| Emitter contact resistance | $10^{-6}$ ohm |
| Base contact resistance | 0.015 ohm |
| Exterior reflectivity | 5% (with antireflection coating and surface texturization), no back-side reflector. |
| Illumination | AM1.5, 1000 W/m$^2$ |

We claim:

1. A method of making a solar cell, said method comprising the steps of:
   providing a solar cell substrate having a receiving surface; and
   assembling a printable semiconductor element on said receiving surface of said substrate via contact printing; wherein said printable semiconductor element comprises a semiconductor structure having a thickness that is less than or equal to 100 μm, and said semiconductor structure comprises low grade Si having a metallic purity level that is less than 99.999999%.

2. The method of claim 1, wherein said thickness is selected from the range of 10 μm and 75 μm.

3. The method of claim 1, wherein said thickness is selected from the range of 15 µm and 40 µm.

4. The method of claim 1, wherein said thickness is less than 50 µm.

5. The method of claim 1, wherein said thickness is less than 25 µm.

6. The method of claim 1, wherein said printable semiconductor element comprises an array of microbars.

7. The method of claim 6, wherein said microbars have a thickness selected from the range of 0.1 µm and 30 µm, a length selected from the range of 0.5 mm to 5 cm, and a width selected from the range of 5 µm and 1 mm.

8. The method of claim 1, wherein said solar cell has an optical transparency that is greater than or equal to 40% in at least a portion of the visible light spectrum.

9. The method of claim 1, wherein the solar cell is bendable or flexible.

10. The method of claim 1, wherein said printable semiconductor element is assembled on said receiving surface via dry transfer contact printing.

11. The method of claim 1 wherein said printable semiconductor element is assembled on said receiving surface using a conformable transfer device.

12. The method of claim 1 wherein said assembling step comprises:
providing a conformable transfer device having a contact surface;
establishing conformal contact between an external surface of said printable semiconductor element and said contact surface of said conformable transfer device, wherein said conformal contact bonds said printable semiconductor element to said contact surface;
contacting said printable semiconductor element bonded to said contact surface and said receiving surface of said solar cell substrate; and
separating said printable semiconductor element and said contact surface of said conformable transfer device, thereby assembling said printable semiconductor element on said receiving surface of said solar cell substrate.

13. The method of claim 12 further comprising the steps of:
providing an array of printable semiconductor elements on a single Si wafer; and
repeating said assembling steps of claim 12 in a step and repeat fashion to transfer said printable semiconductor elements from said single Si wafer to said receiving surface.

14. The method of claim 13, wherein said array of printable semiconductor elements on a single Si wafer has a donating surface density and said printed semiconductor elements on said receiving surface has a printed surface density, and said donating surface density is at least ten times greater than said printed surface density.

15. The method of claim 13, wherein said receiving surface has a surface area that is greater than 500 cm$^2$.

16. The method of claim 15, wherein said solar cell is flexible or bendable.

17. The method of claim 1, wherein the low-grade Si comprises Si having a defect density that is greater than or equal to $10^{16}$ per cm$^3$.

18. The method of claim 1, wherein said semiconductor element on said receiving surface has a coverage density selected from the range of 5 elements/mm to 100 elements/mm.

19. The method of claim 1, wherein said semiconductor structure is patterned in a bulk Si wafer.

20. The method of claim 1, wherein said solar cell has an efficiency that is greater than or equal to 15%.

21. A method of making an ultra-thin microscale solar cell, said method comprising:
providing a solar cell substrate having a receiving surface;
providing a plurality of semiconductor elements on a donor substrate;
transferring at least a portion of said semiconductor elements from said donor substrate to said receiving surface;
wherein said transferred semiconductor elements have a thickness that is less than 100 µm and comprise low grade Si having a metallic purity level that is less than 99.999999%.

22. The method of claim 21, wherein said transferring step comprises:
providing a conformable transfer device having a contact surface;
establishing conformal contact between an external surface of said semiconductor element and said contact surface of said conformable transfer device, wherein said conformal contact bonds said printable semiconductor element to said contact surface;
contacting said semiconductor element bonded to said contact surface and said receiving surface of said device substrate; and
separating said semiconductor element and said contact surface of said conformable transfer device, thereby assembling said semiconductor element on said receiving surface of said solar cell substrate.

23. The method of claim 21, wherein said plurality of semiconductor elements on a donor substrate comprises a Si wafer having a patterned surface.

24. The method of claim 23, wherein said patterned surface comprises a plurality of Si microbar cells that are at least partially undercut.

25. The method of claim 23, wherein said Si wafer is reused after said semiconductor elements are transferred to said receiving surface.

26. The method of claim 21, wherein said semiconductor elements are bonded to said receiving substrate by an adhesive.

27. The method of claim 21, wherein said semiconductor elements have a thickness that is less than 20 µm.

28. The method of claim 21, wherein said receiving surface has a surface area that is greater than or equal to 1 m$^2$.

29. The method of claim 23, wherein greater than 60% by weight of said silicon wafer is transferred to said solar cell substrate.

30. The method of claim 29, wherein said solar cell is flexible or bendable.

31. The method of claim 1, wherein said printable semiconductor element comprises monocrystalline Si.

32. The method of claim 1 further comprising:
electrically interconnecting a plurality of said solar cells to obtain a module of solar cells having a high voltage output, wherein said high voltage output is greater than or equal to 1 V.

33. The method of claim 32, wherein said module is flexible or bendable.

34. The method of claim 32, wherein said module comprises at least 30 solar cells electrically connected in series to provide a voltage output that is greater than or equal to 10 V.

35. The method of claim 34, wherein said module has a base area footprint that is less than or equal to 25 cm$^2$.

36. The method of claim 1, wherein the low grade Si provides a reduction in solar cell performance that is greater than 10% compared to an equivalent solar cell made from high grade Si.

* * * * *